(12) United States Patent
Hosek et al.

(10) Patent No.: US 9,889,557 B2
(45) Date of Patent: Feb. 13, 2018

(54) ROBOT HAVING ARM WITH UNEQUAL LINK LENGTHS

(71) Applicant: PERSIMMON TECHNOLOGIES, CORP., Wakefield, MA (US)

(72) Inventors: Martin Hosek, Lowell, MA (US); Christopher Hofmeister, Hampstead, NH (US)

(73) Assignee: Persimmon Technologies, Corp., Wakefield, MA (US)

( * ) Notice: Subject to any disclaimer, the term of this patent is extended or adjusted under 35 U.S.C. 154(b) by 206 days.

(21) Appl. No.: 14/761,718

(22) PCT Filed: Jan. 14, 2014

(86) PCT No.: PCT/US2014/011416
§ 371 (c)(1),
(2) Date: Jul. 17, 2015

(87) PCT Pub. No.: WO2014/113364
PCT Pub. Date: Jul. 24, 2014

(65) Prior Publication Data
US 2015/0352714 A1  Dec. 10, 2015

Related U.S. Application Data

(63) Continuation of application No. 13/833,732, filed on Mar. 15, 2013, now Pat. No. 9,149,936.
(Continued)

(51) Int. Cl.
B25J 9/04      (2006.01)
B25J 18/04     (2006.01)
(Continued)

(52) U.S. Cl.
CPC .............. *B25J 9/043* (2013.01); *B25J 9/042* (2013.01); *B25J 9/105* (2013.01); *B25J 15/0014* (2013.01);
(Continued)

(58) Field of Classification Search
CPC ... B25J 9/041; B25J 9/042; B25J 9/043; B25J 9/104; B25J 9/126; B25J 15/0014;
(Continued)

(56) References Cited

U.S. PATENT DOCUMENTS 4,865,577 A    9/1989  Freudenstein
4,895,554 A    1/1990  Isamu
(Continued)

FOREIGN PATENT DOCUMENTS

CN    1765004 A      4/2004
CN    102326244 A    1/2012
(Continued)

*Primary Examiner* — Anna M Momper
*Assistant Examiner* — Brendan P Tighe
(74) *Attorney, Agent, or Firm* — Harrington & Smith

(57) ABSTRACT

A transport apparatus including a drive; a first arm connected to the drive, where the first arm includes a first link, a second link and an end effector connected in series with the drive, where the first link and the second link have different effective lengths; and a system for limiting rotation of the end effector relative to the second link to provide substantially only straight movement of the end effector relative to the drive when the first arm is extended or retracted.

19 Claims, 74 Drawing Sheets

Related U.S. Application Data

(60) Provisional application No. 61/825,162, filed on May 20, 2013, provisional application No. 61/754,125, filed on Jan. 18, 2013, provisional application No. 61/762,063, filed on Feb. 7, 2013.

(51) Int. Cl.
*B25J 15/00* (2006.01)
*H01L 21/677* (2006.01)
*B25J 9/10* (2006.01)

(52) U.S. Cl.
CPC .......... *B25J 15/0052* (2013.01); *B25J 18/04* (2013.01); *H01L 21/67742* (2013.01); *B25J 9/104* (2013.01); *Y10S 901/14* (2013.01); *Y10S 901/27* (2013.01)

(58) Field of Classification Search
CPC .... B25J 15/0052; B25J 18/04; B25J 19/0025; B25J 19/0033; B25J 19/0041; B25J 9/105; H01L 21/67742; H01L 21/68707; Y10S 901/15; Y10S 901/17; Y10S 901/21; Y10S 901/27; Y10T 74/20323
USPC ............. 74/490.04; 414/744.3, 744.4, 744.5; 901/15, 17, 21, 27
See application file for complete search history.

(56) References Cited

U.S. PATENT DOCUMENTS

| | | | |
|---|---|---|---|
| 4,917,556 A | 4/1990 | Stark et al. | |
| 5,083,896 A | 1/1992 | Uehara et al. | |
| 5,374,147 A | 12/1994 | Hiroki et al. | |
| 5,382,803 A * | 1/1995 | Asakawa | H01L 21/67201 250/442.11 |
| 5,584,647 A | 12/1996 | Uehara et al. | |
| 5,950,495 A * | 9/1999 | Ogawa | B25J 9/06 414/744.5 |
| 6,109,860 A | 8/2000 | Ogawa | |
| 6,126,381 A | 10/2000 | Bacchi et al. | 414/754 |
| 6,155,768 A | 12/2000 | Bacchi et al. | |
| 6,190,114 B1 * | 2/2001 | Ogawa | B25J 9/042 414/744.5 |
| 6,293,746 B1 * | 9/2001 | Ogawa | B25J 9/042 414/744.4 |
| 6,315,512 B1 | 11/2001 | Tabrizi et al. | |
| 6,547,510 B1 | 4/2003 | Beaulieu | 414/744.5 |
| 6,601,468 B2 | 8/2003 | Grover et al. | 74/490.03 |
| 6,663,333 B2 | 12/2003 | Kinnard et al. | |
| 6,748,293 B1 | 6/2004 | Larsen | 700/218 |
| 6,837,883 B2 | 1/2005 | Moll et al. | 606/1 |
| 7,114,907 B2 | 10/2006 | Ogawa et al. | |
| 7,306,423 B2 | 12/2007 | Ogawa | |
| 7,837,425 B2 | 11/2010 | Saeki | |
| 7,988,399 B2 | 8/2011 | Van Der Meulen | |
| 8,322,963 B2 | 12/2012 | Hudgens et al. | 414/226.01 |
| 8,562,271 B2 | 10/2013 | Hofmeister | |
| 9,190,306 B2 | 11/2015 | Blank | |
| 9,248,568 B2 | 2/2016 | Caveney | |
| 2002/0078778 A1 | 6/2002 | Grover et al. | |
| 2002/0082612 A1 | 6/2002 | Moll et al. | |
| 2003/0012624 A1 | 1/2003 | Kinnard et al. | |
| 2007/0020082 A1 | 1/2007 | Caveney | |
| 2009/0003976 A1 | 1/2009 | Hofmeister | |
| 2009/0053016 A1 | 2/2009 | Van der Meulen | |
| 2009/0263215 A1 | 10/2009 | Hudgens et al. | |
| 2012/0045308 A1 | 2/2012 | Kremerman | 414/744.3 |
| 2012/0141235 A1 | 6/2012 | Krupyshev et al. | 414/217.1 |
| 2012/0232690 A1 | 9/2012 | Gilchrist et al. | |
| 2013/0121798 A1 | 5/2013 | Hosek | |
| 2013/0156534 A1 | 6/2013 | Furukawa | |
| 2014/0286741 A1 | 9/2014 | Kremerman et al. | 414/744.5 |
| 2014/0365011 A1 | 12/2014 | Hosek et al. | |
| 2015/0071737 A1 | 3/2015 | Hofmeister et al. | |

FOREIGN PATENT DOCUMENTS

| | | | | |
|---|---|---|---|---|
| JP | 64-56983 U | | 10/1989 | |
| JP | 02083182 A | * | 3/1990 | B25J 9/042 |
| JP | H0825151 B2 | * | 3/1996 | B25J 9/042 |
| JP | H-09285982 A | | 11/1997 | |
| JP | H-10217167 A | | 8/1998 | |
| JP | 11033950 A | * | 2/1999 | B25J 9/009 |
| JP | 2001-217296 A | | 8/2001 | |
| JP | 2004288718 A | | 10/2004 | |
| JP | 2004288719 A | | 10/2004 | |
| JP | 2005161416 A | | 6/2005 | |
| JP | 2005229087 A | | 8/2005 | |
| JP | 2007511104 A | | 4/2007 | |
| JP | 2009049200 A | * | 3/2009 | H01L 21/67265 |
| JP | 2010527149 A | | 8/2010 | |
| WO | WO-99/56920 A1 | | 11/1999 | |
| WO | WO 00/18547 | | 4/2000 | |
| WO | WO-02/34477 A | | 5/2002 | |
| WO | WO-2008144664 A1 | | 11/2008 | |
| WO | WO 2012/129254 A2 | | 9/2012 | |

* cited by examiner

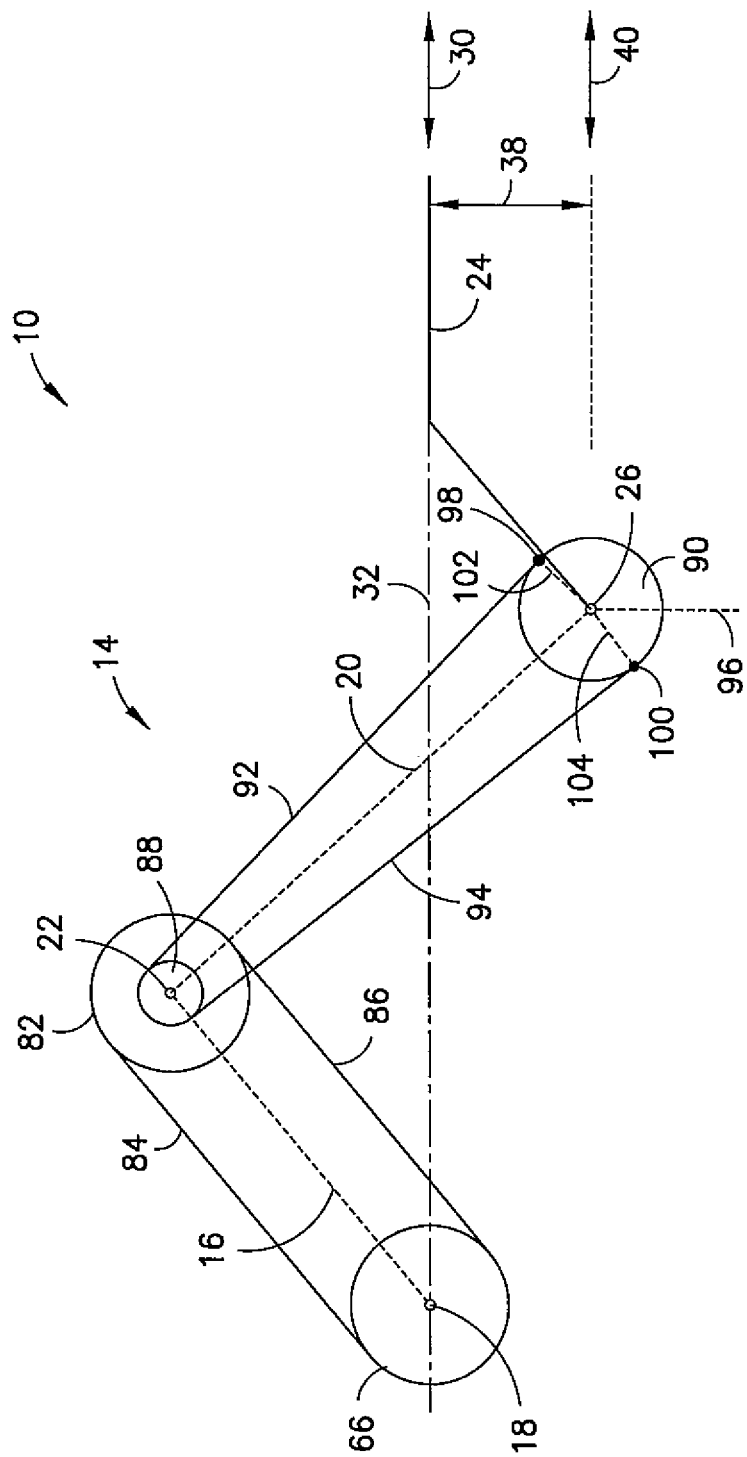

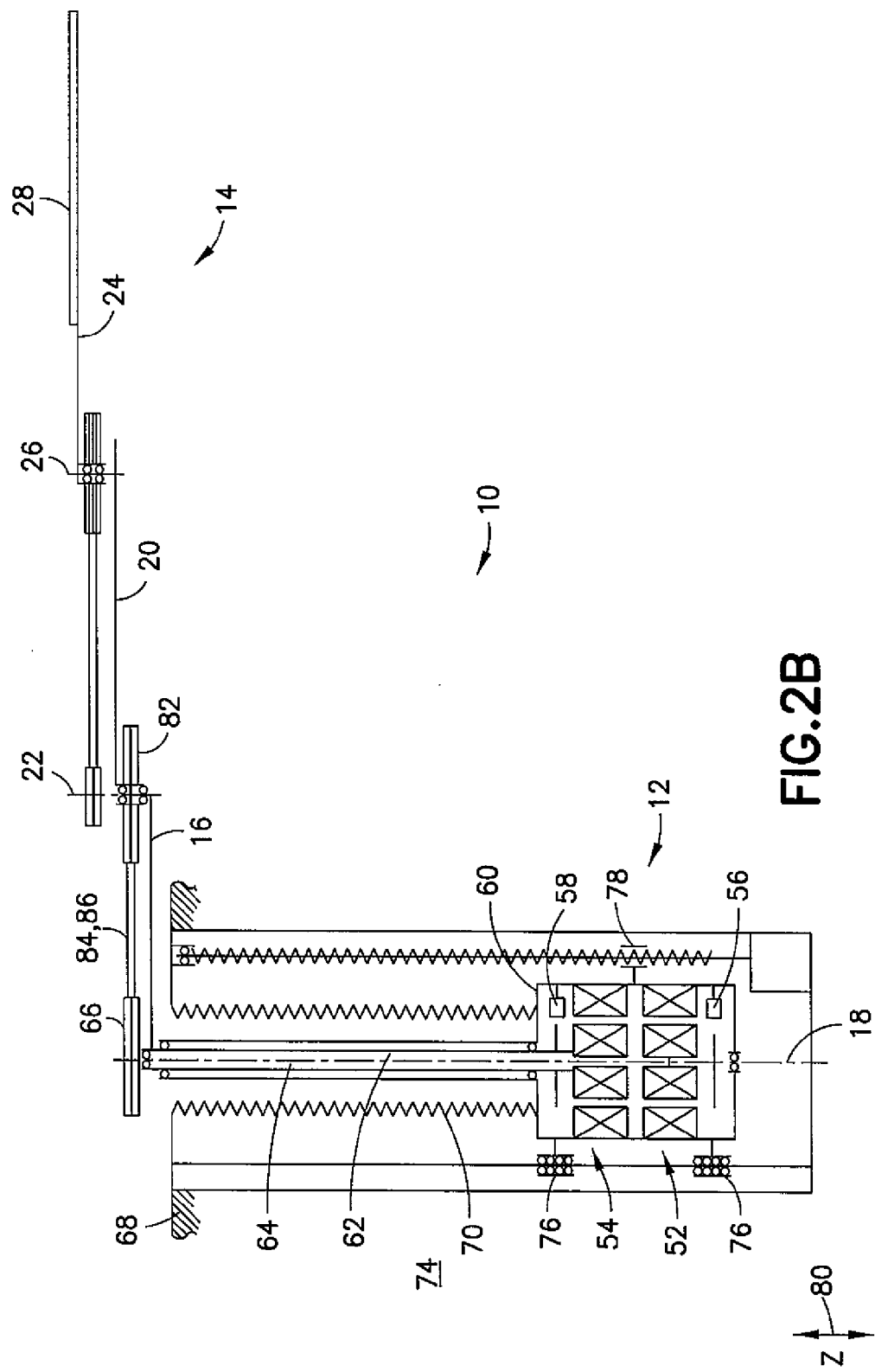

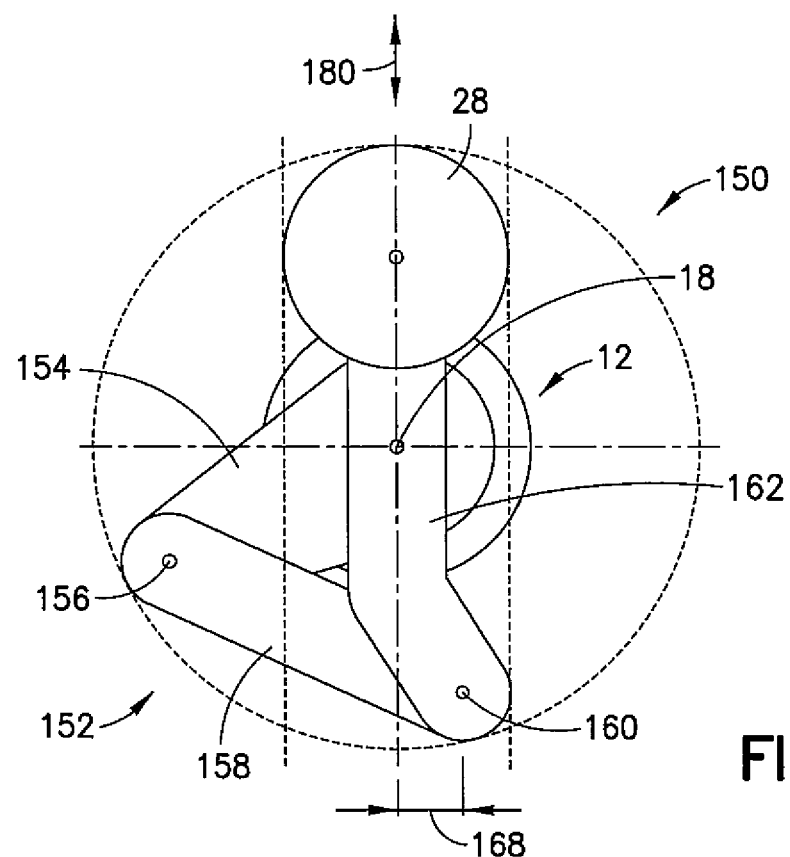
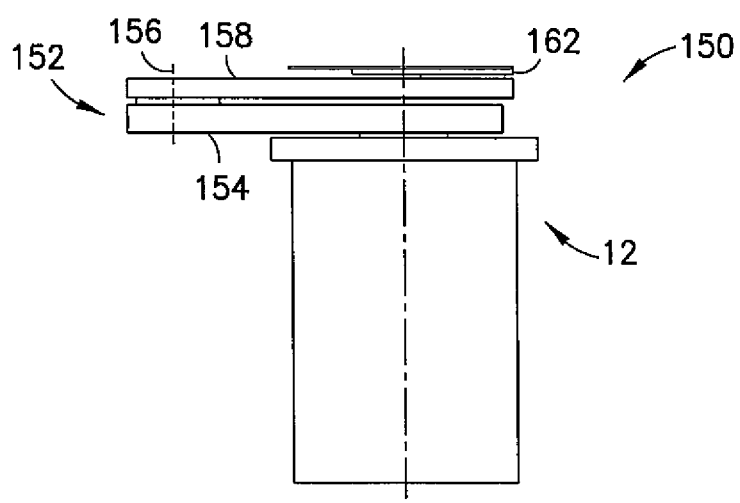
FIG.5A
FIG.5B

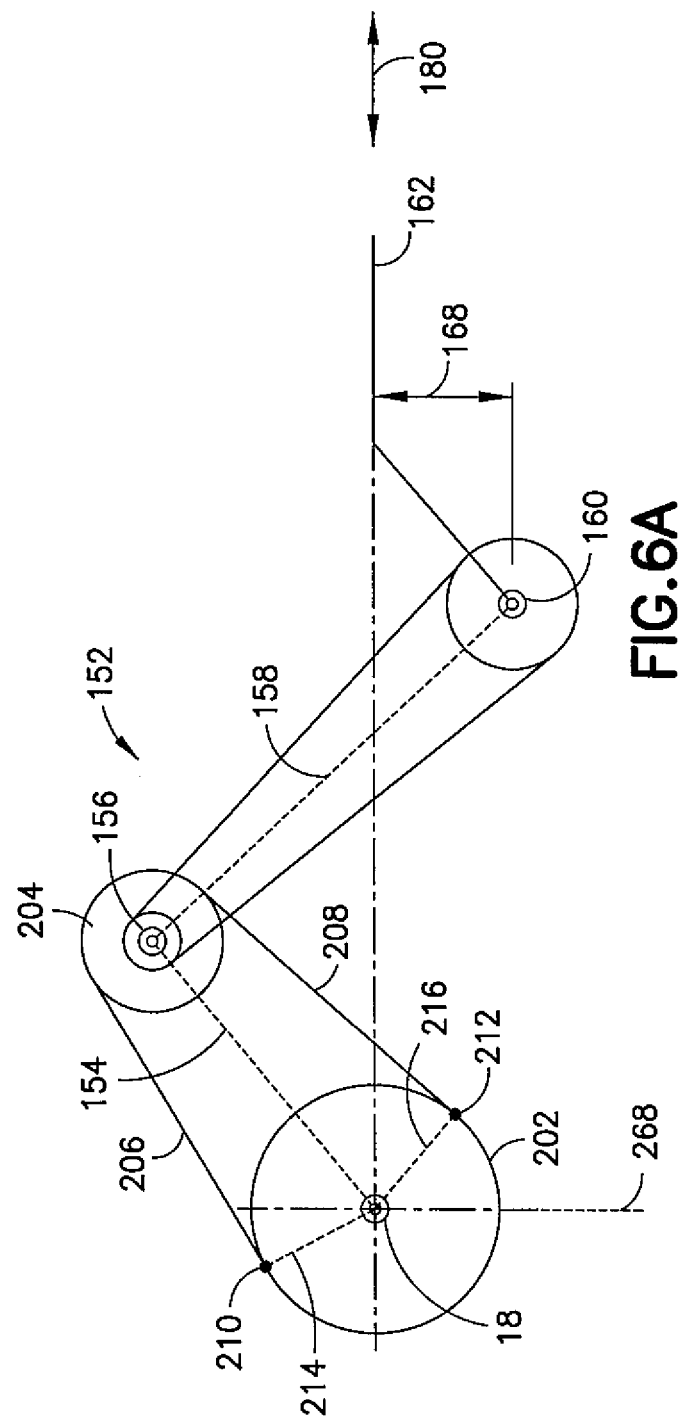

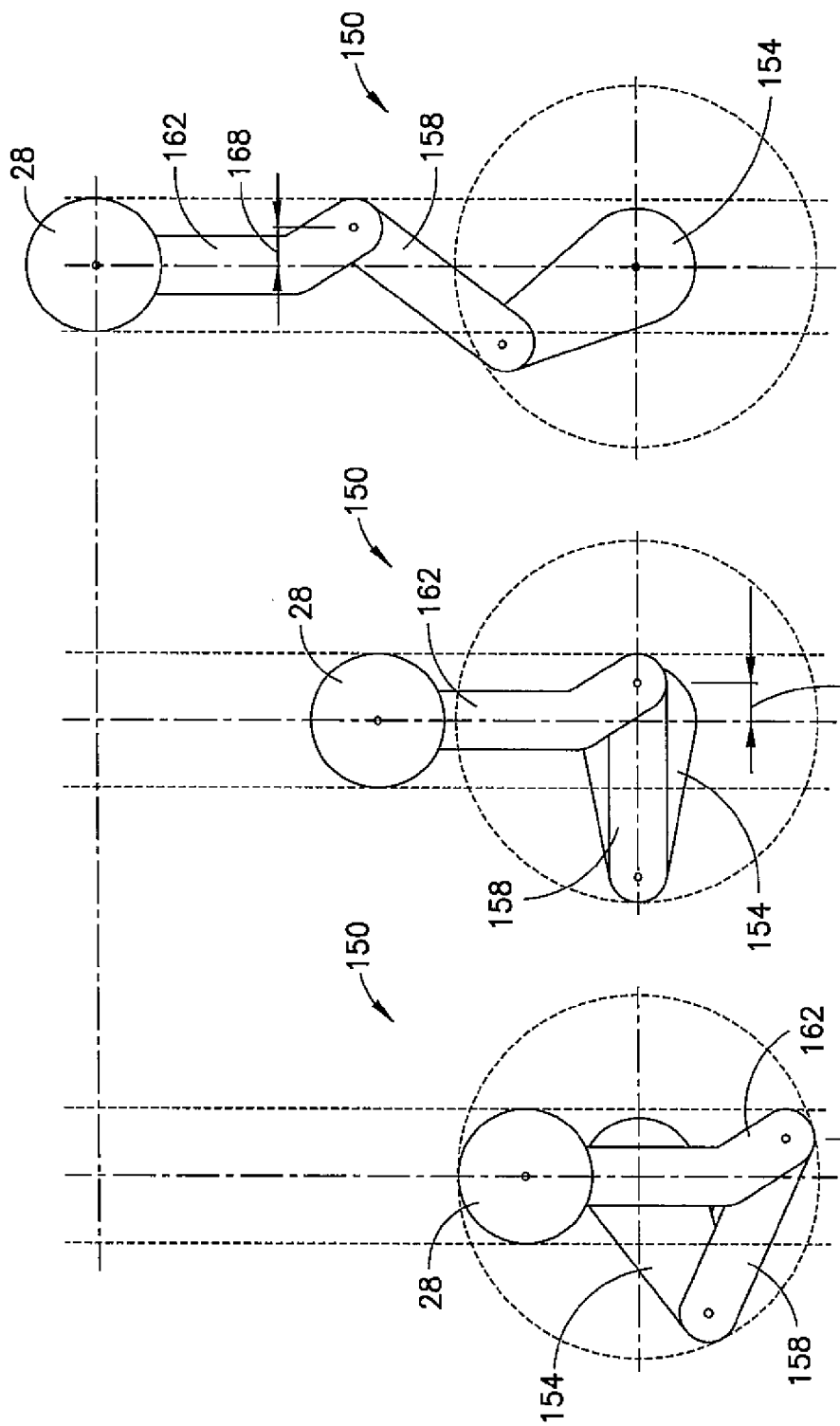

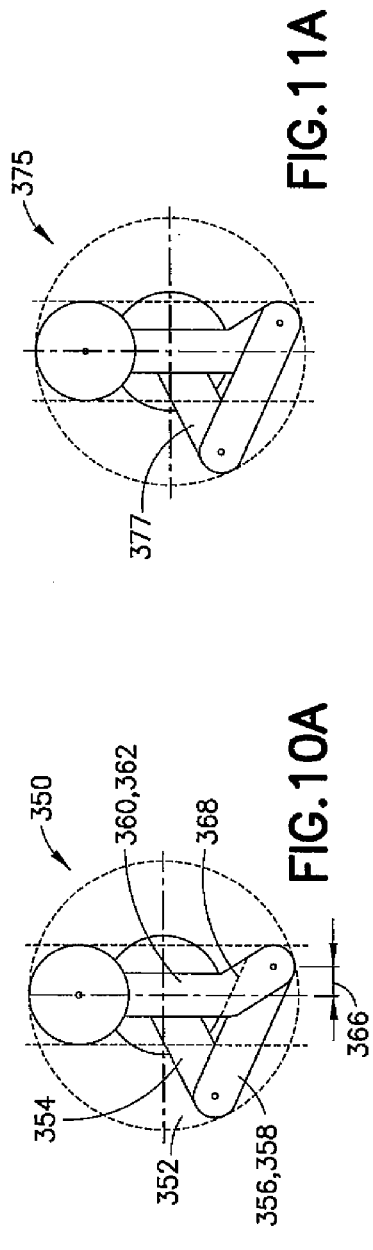
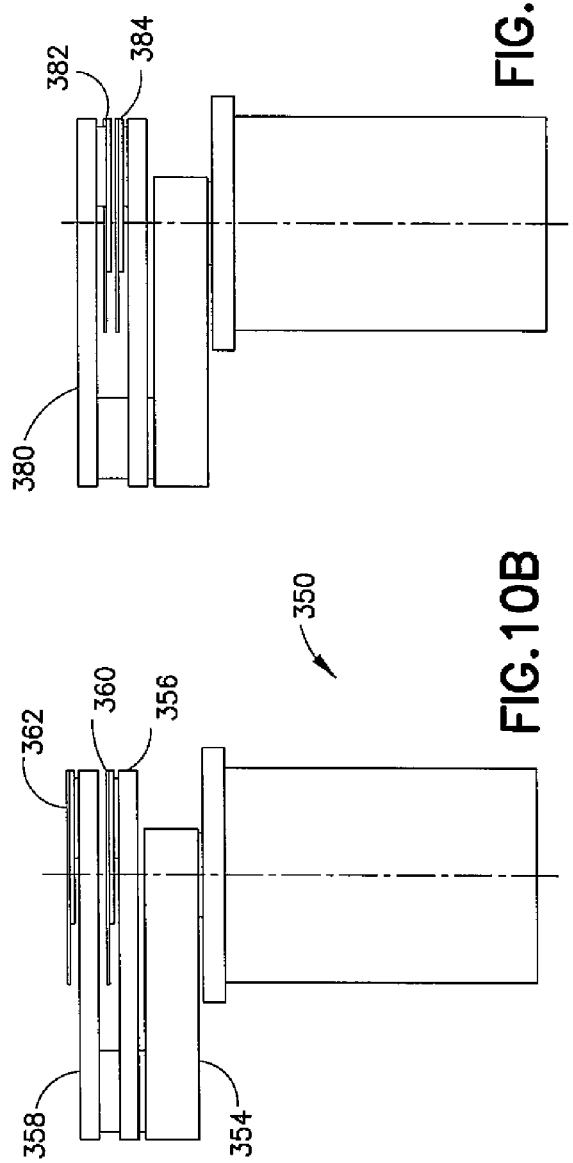

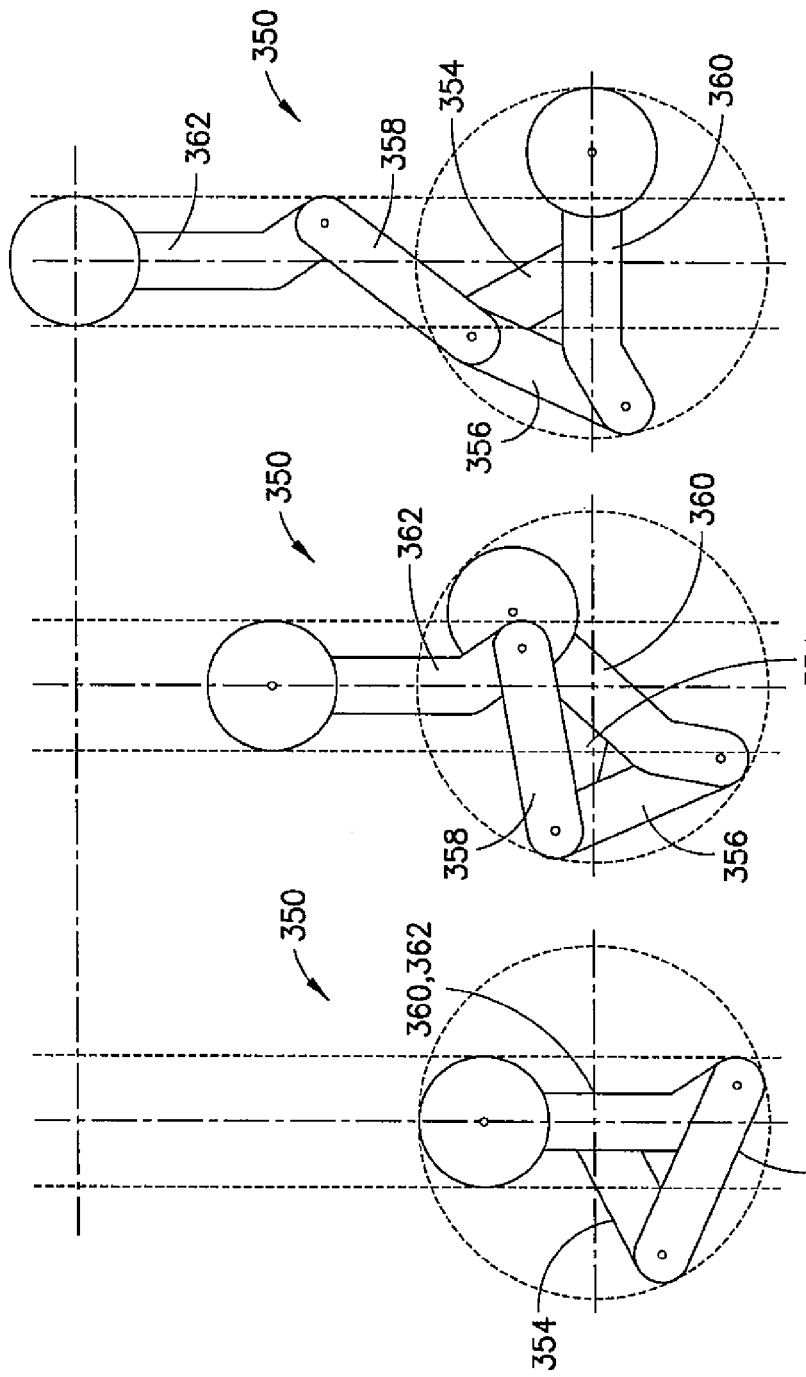

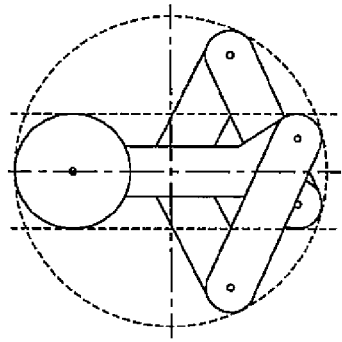
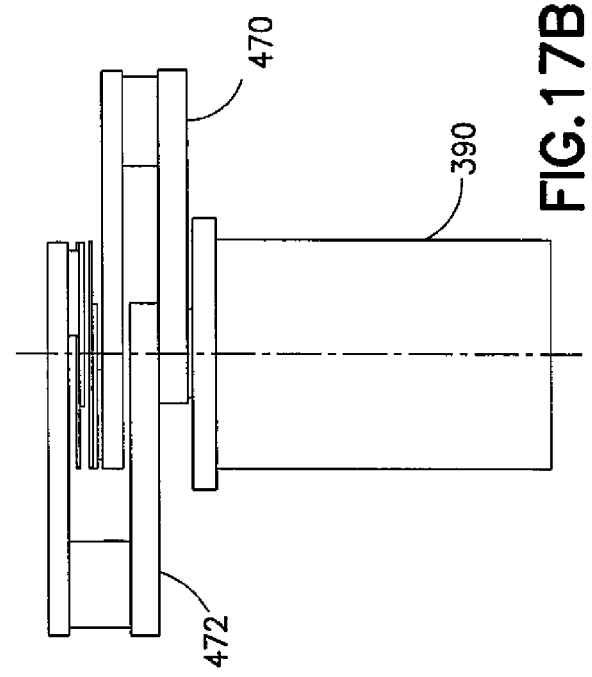
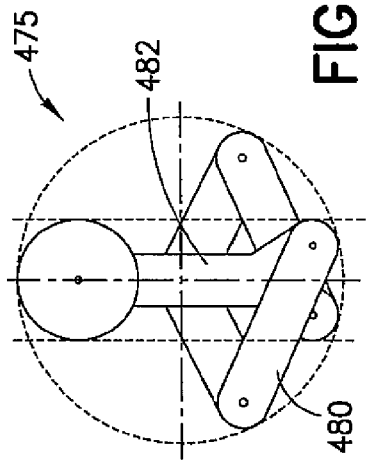
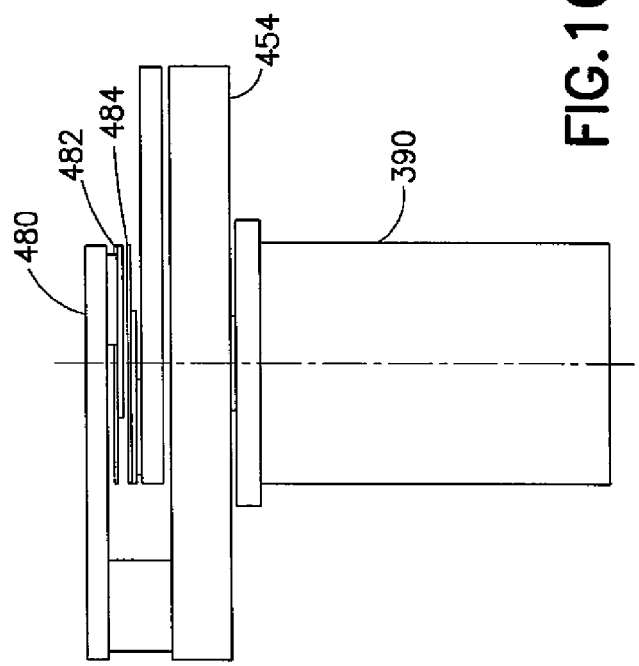

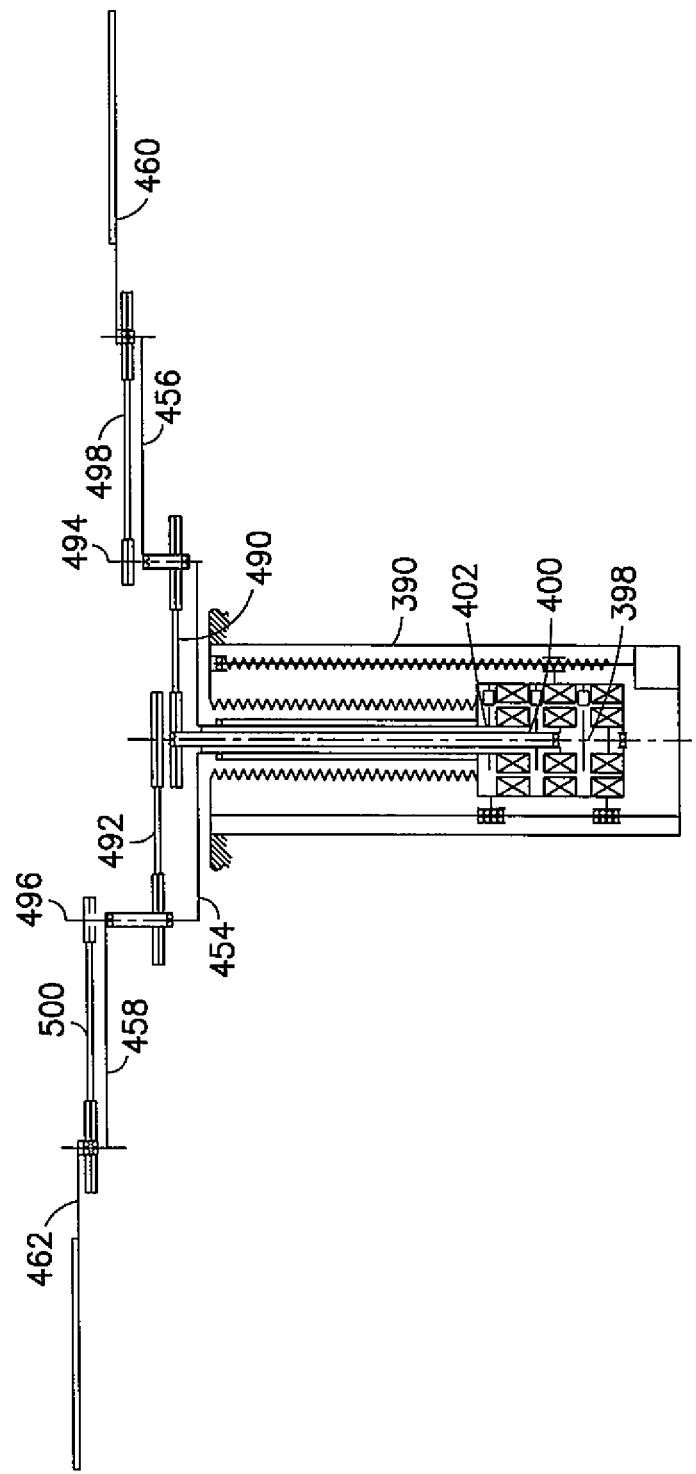

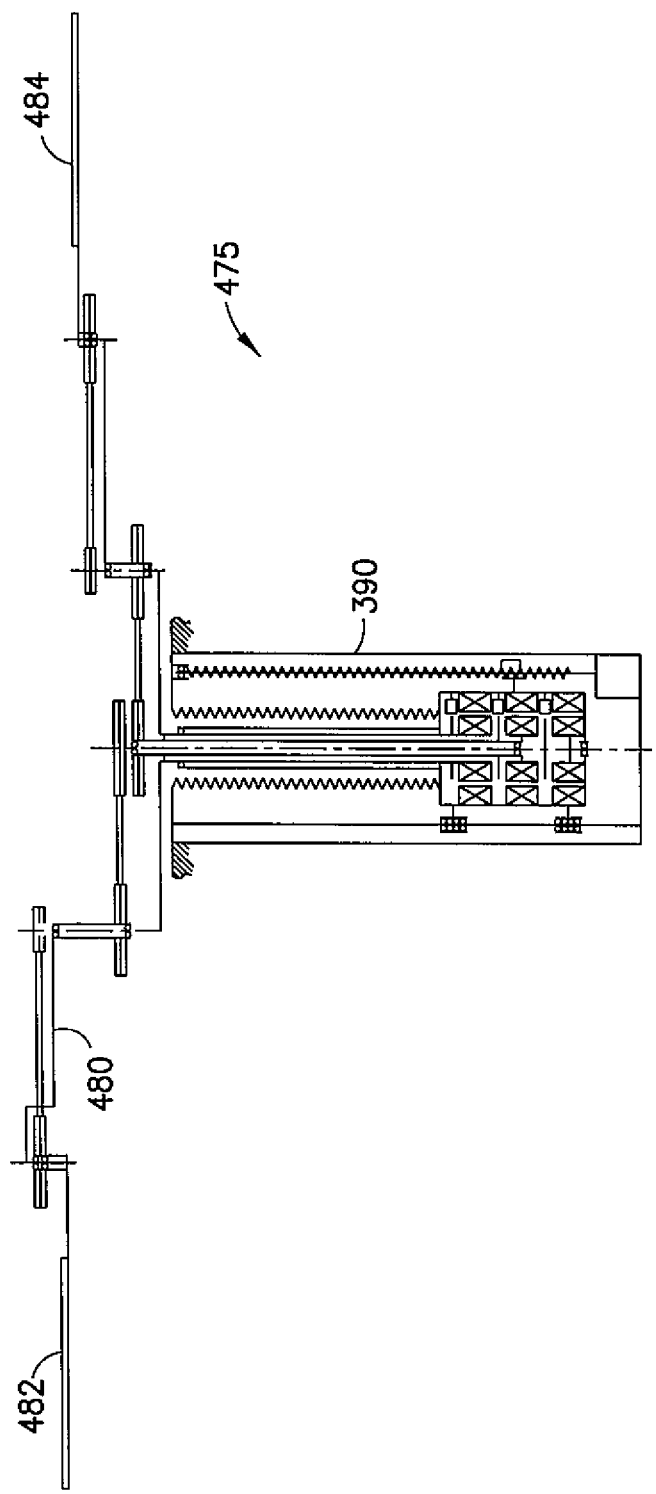

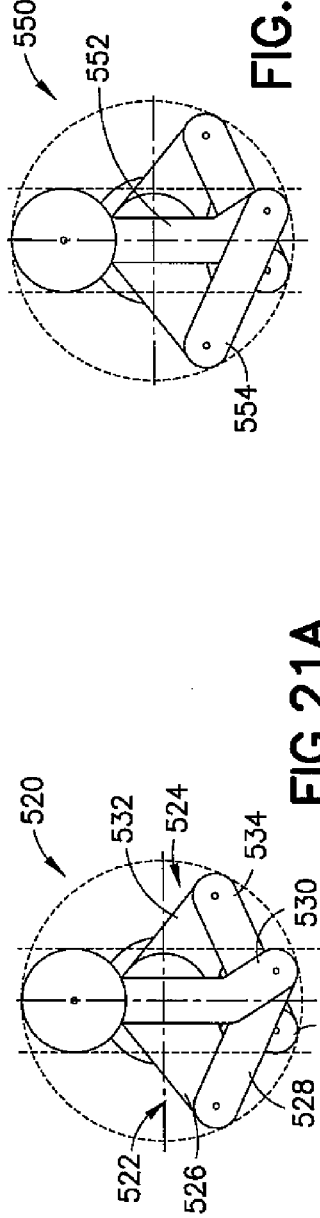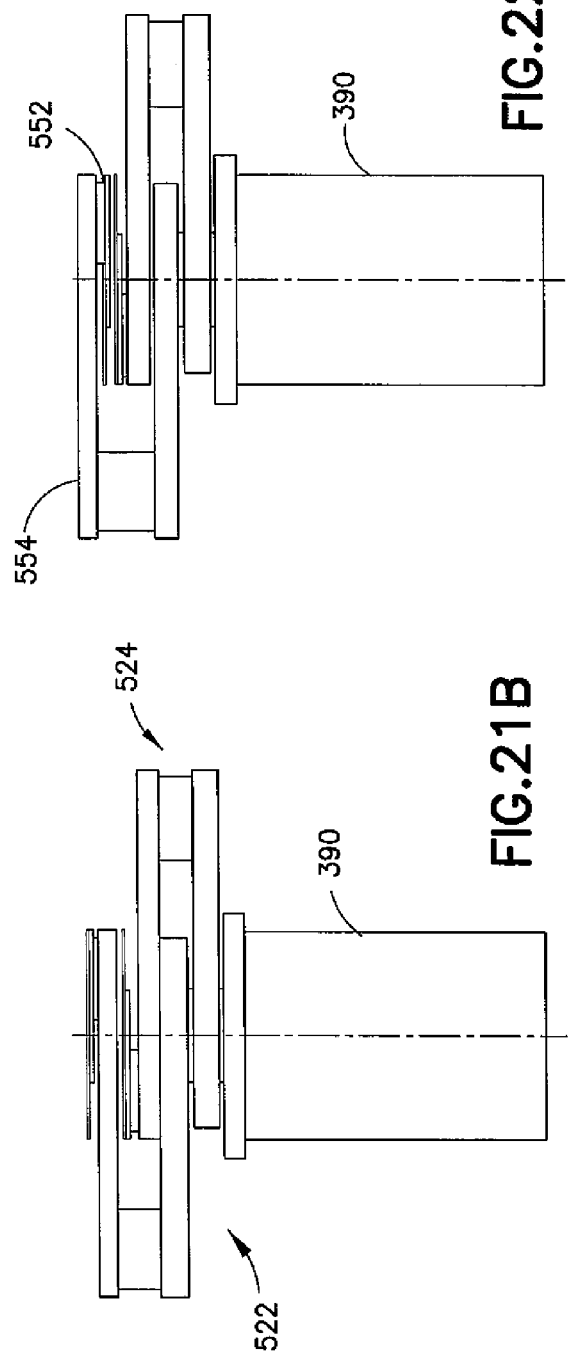

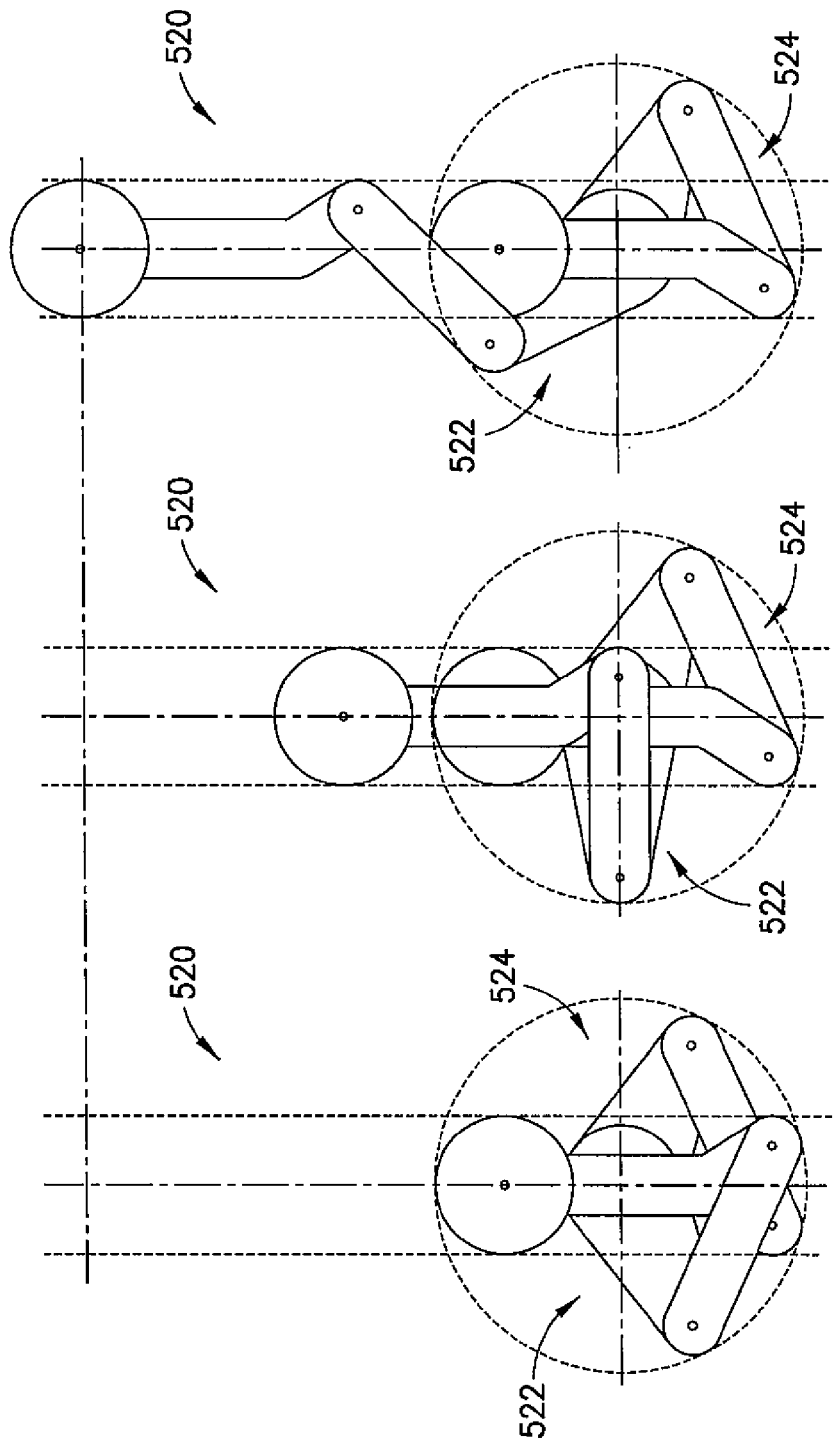

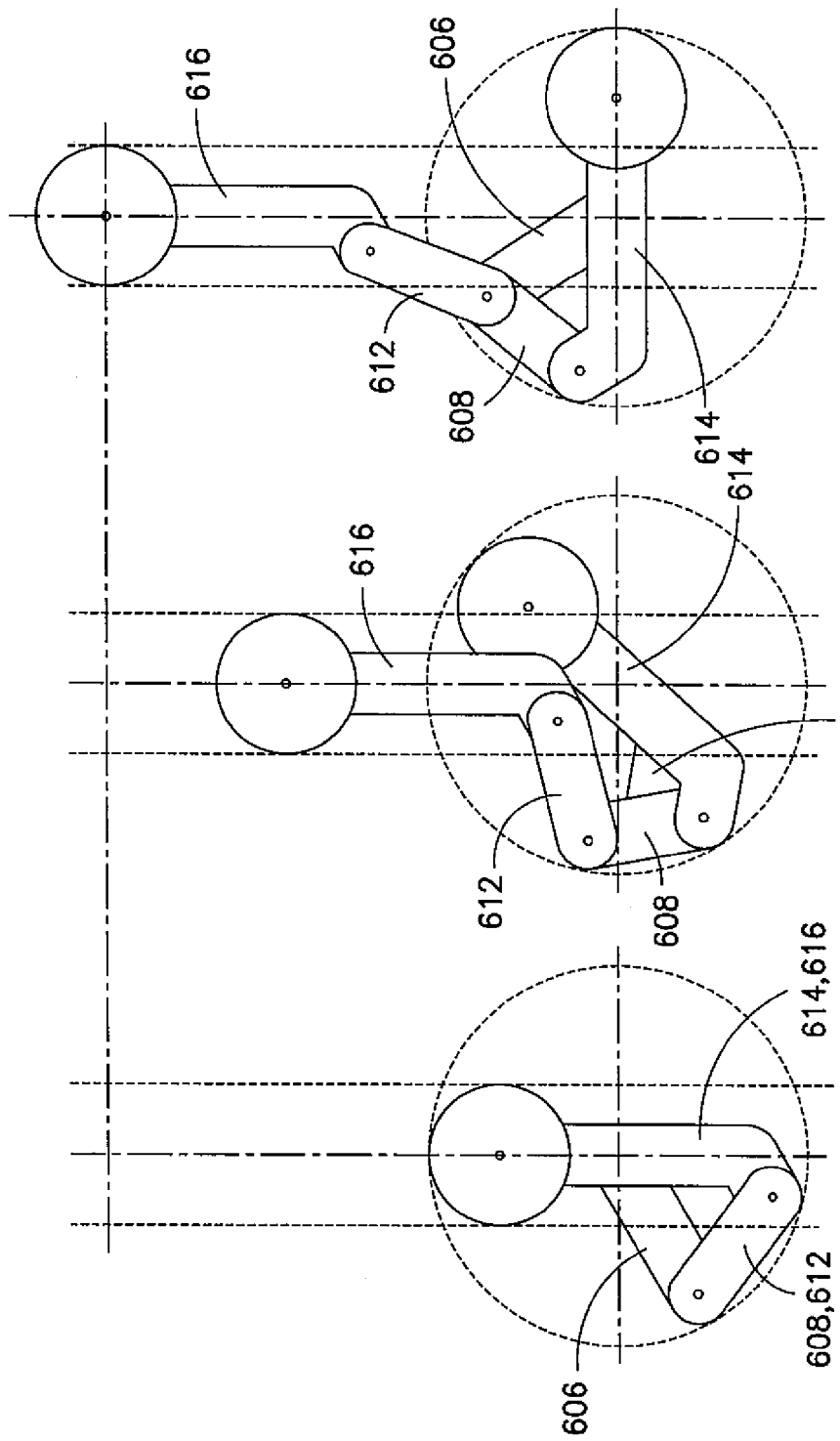

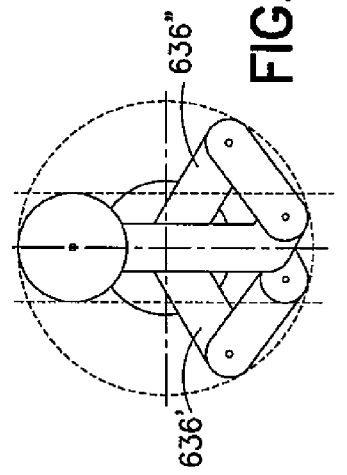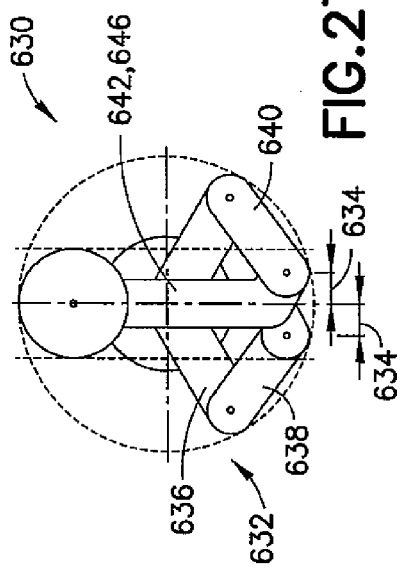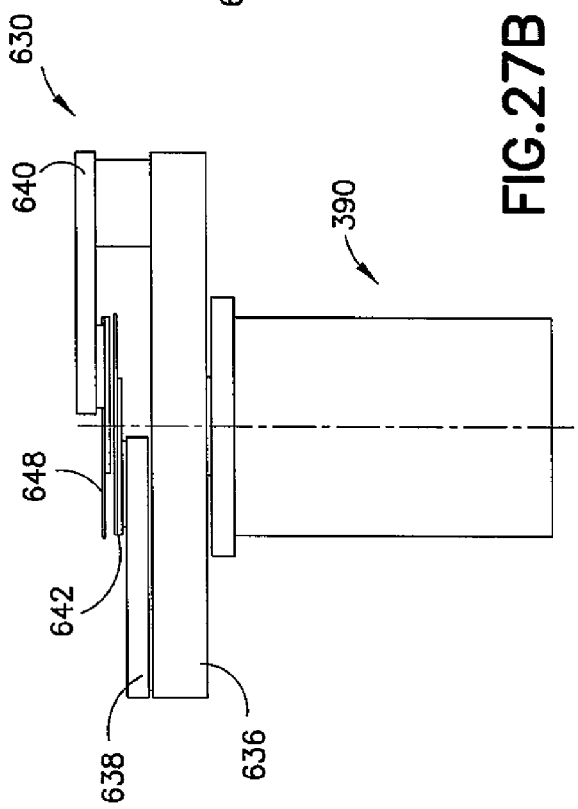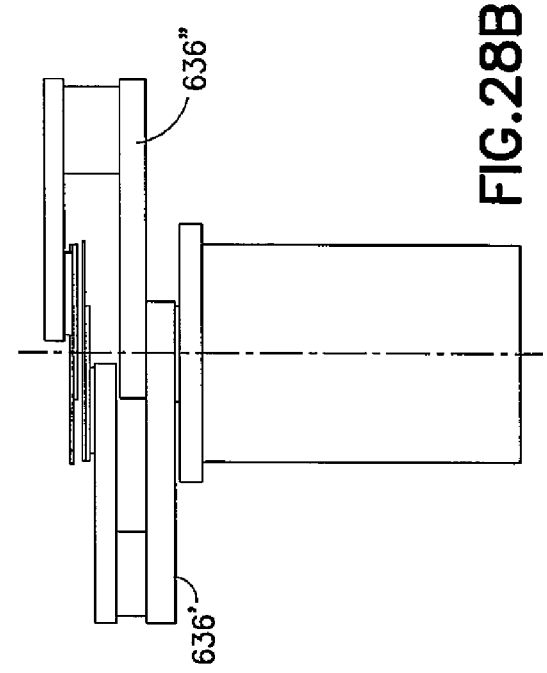

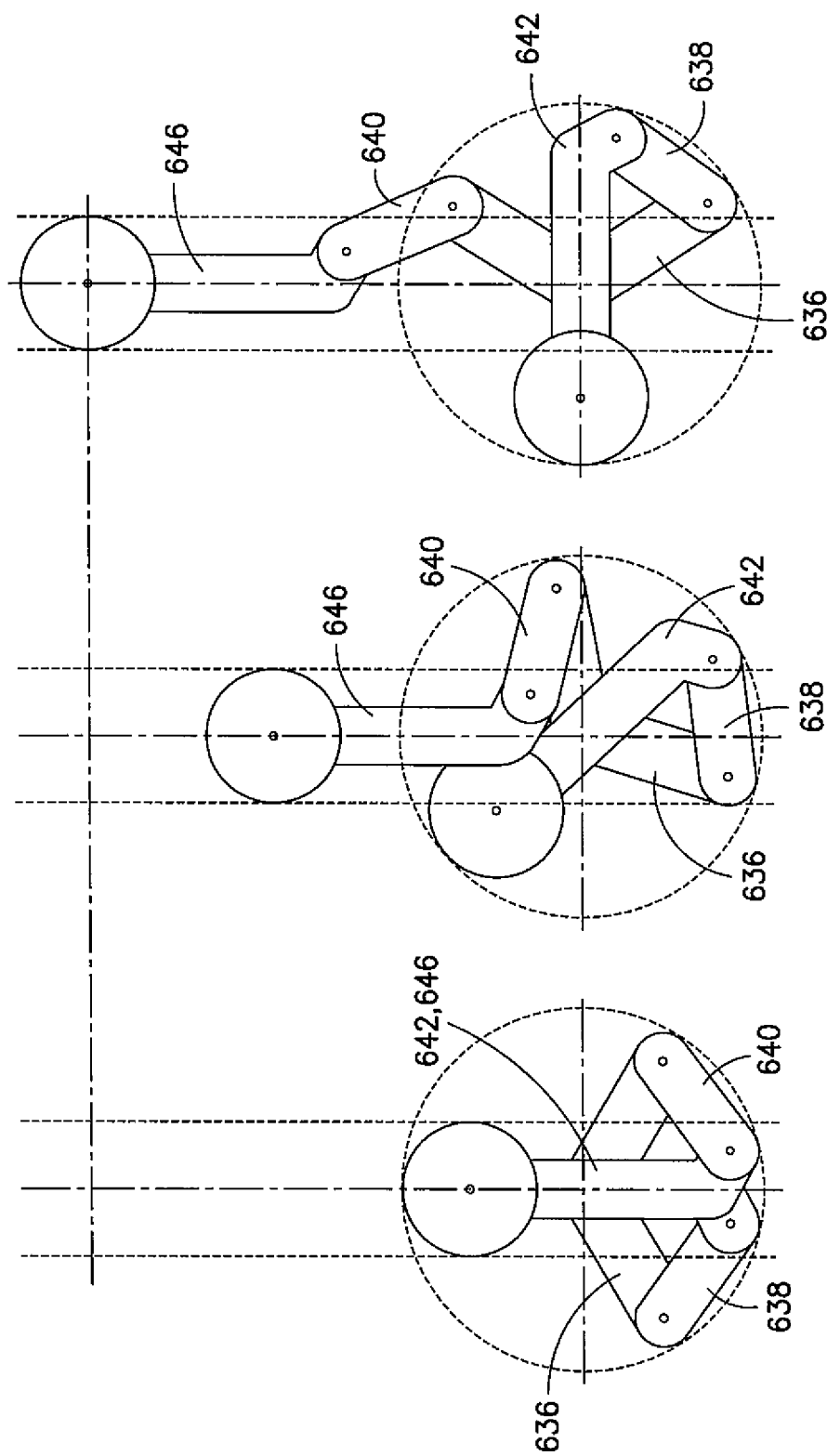

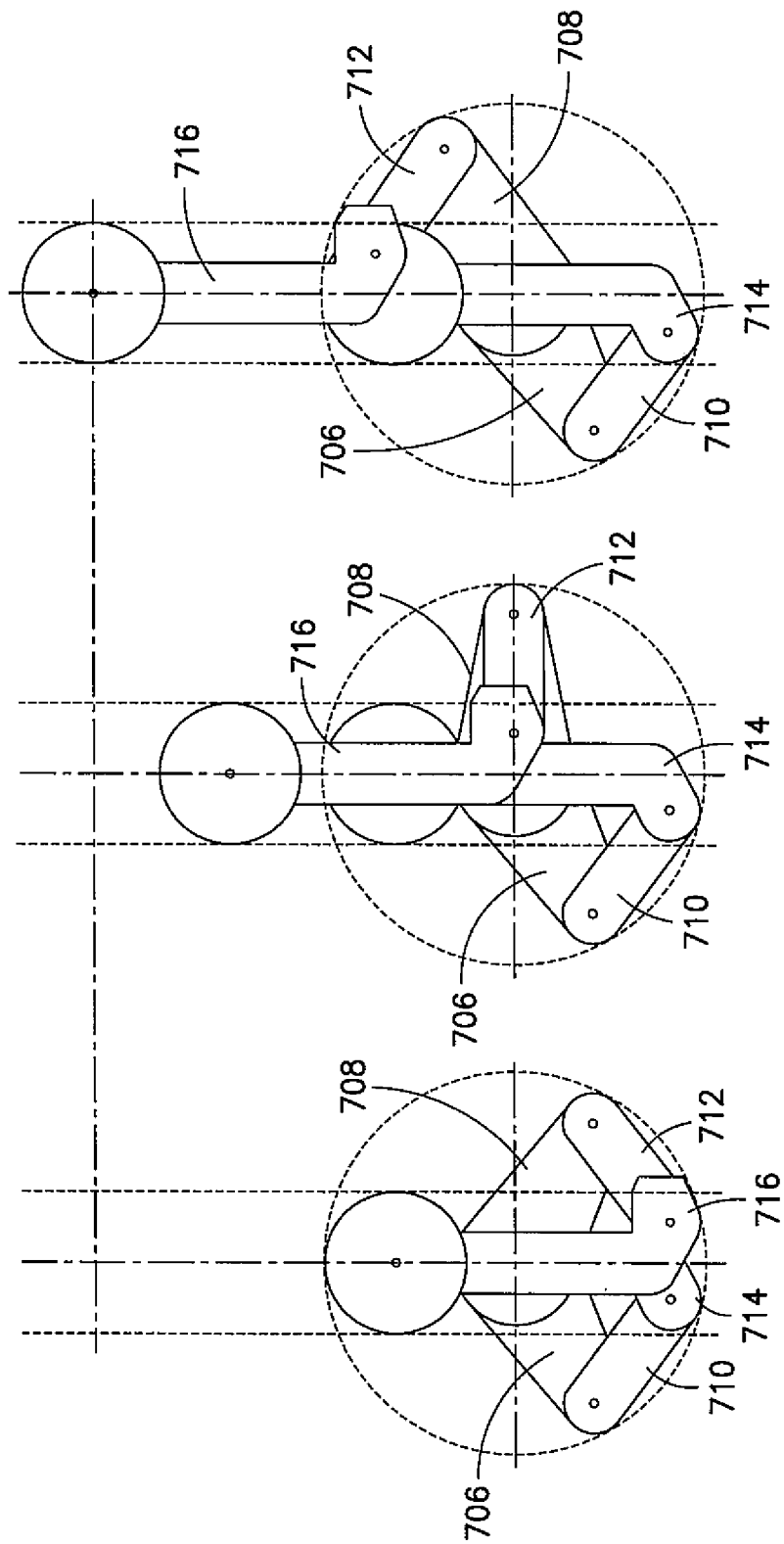

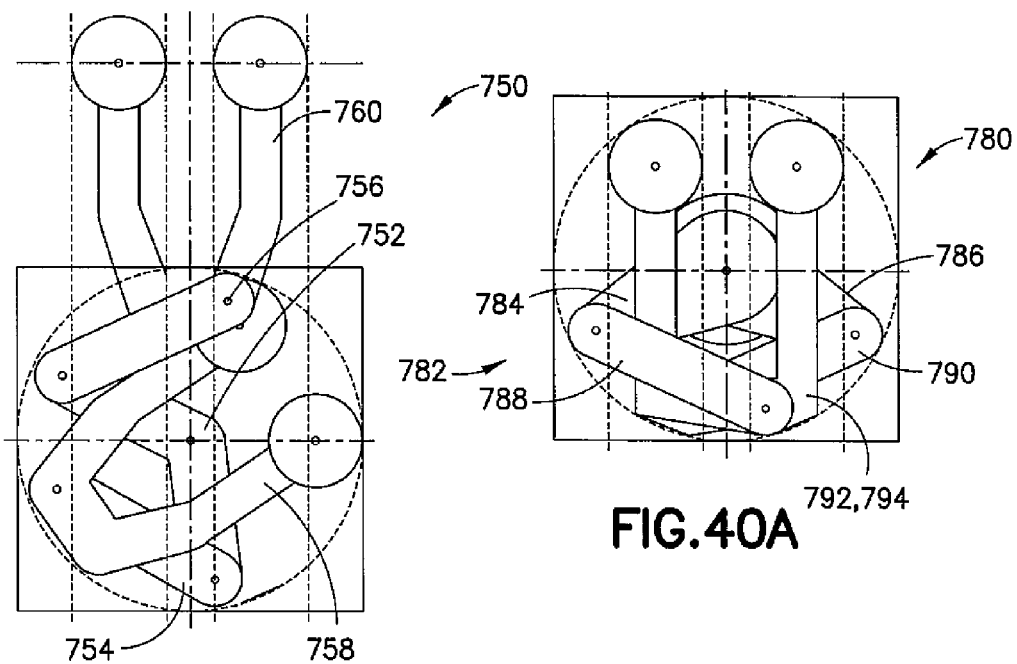
FIG.39
FIG.40A
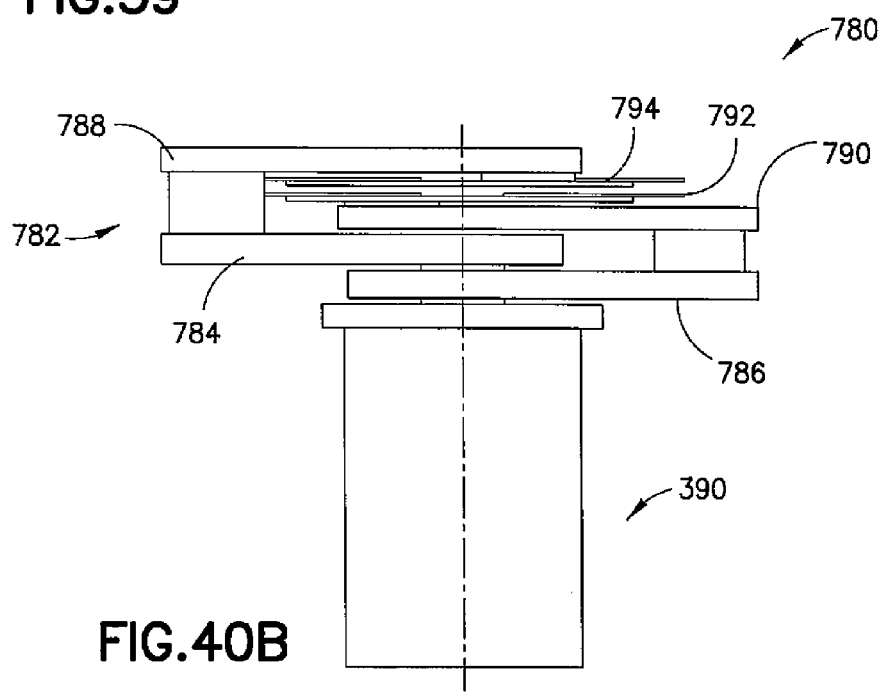
FIG.40B

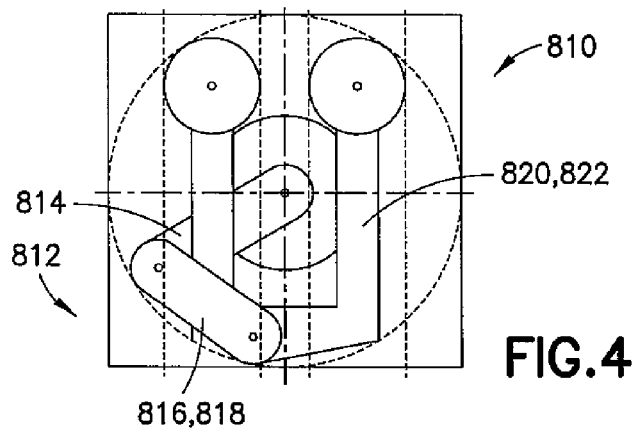
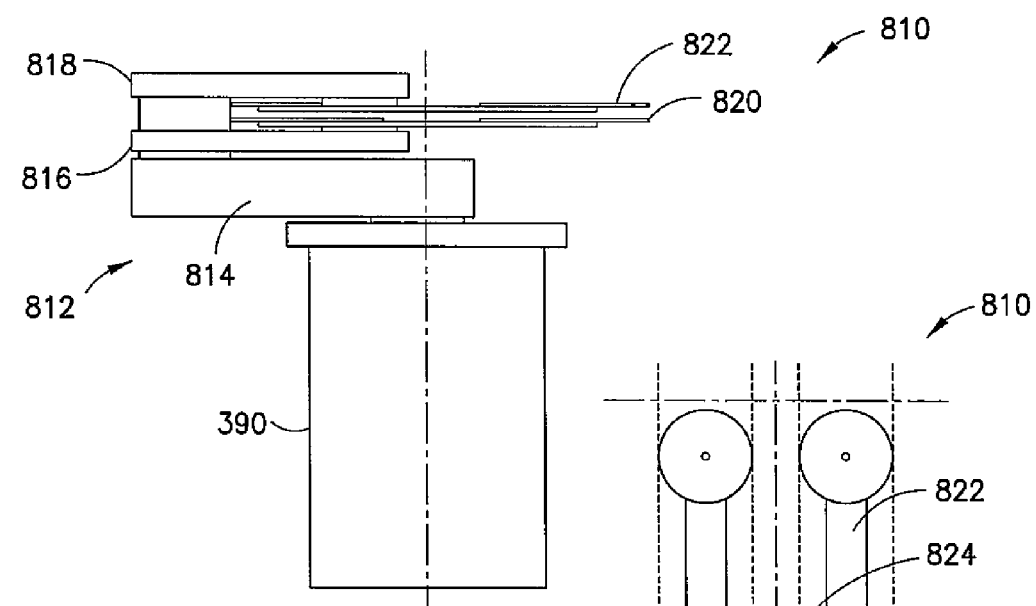
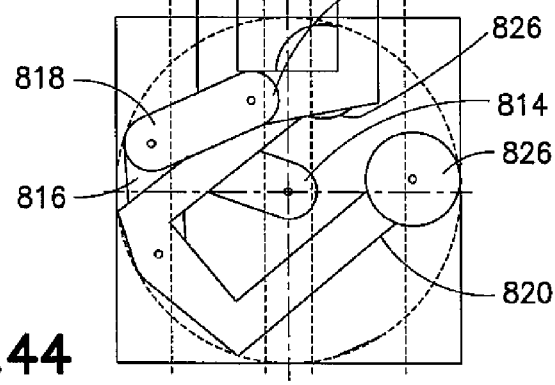

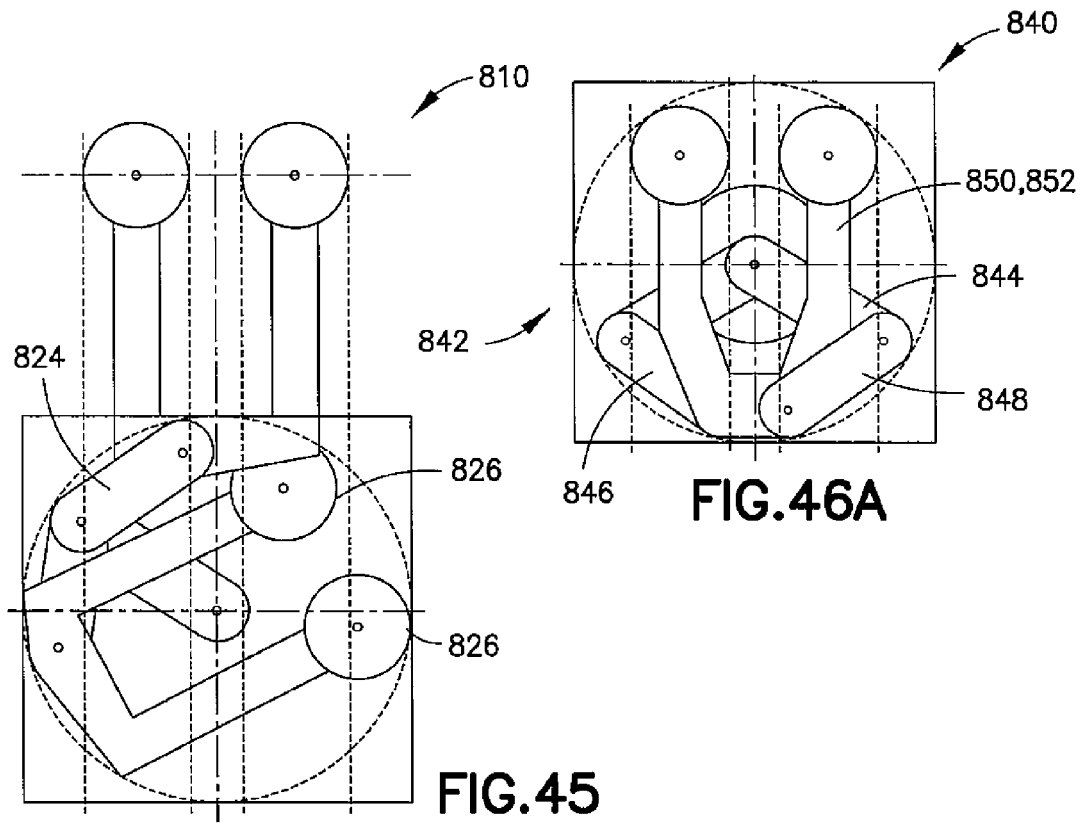
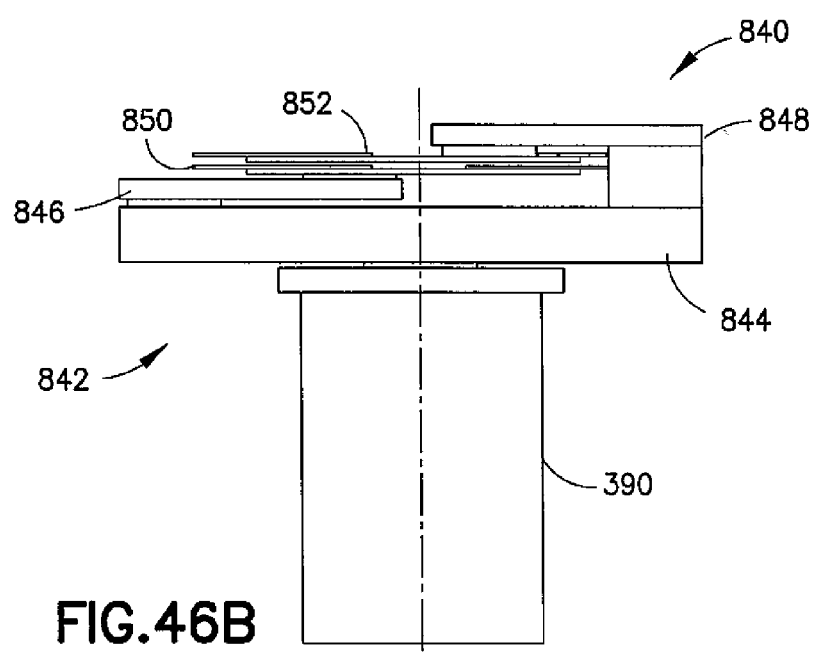
FIG. 45
FIG. 46A
FIG. 46B

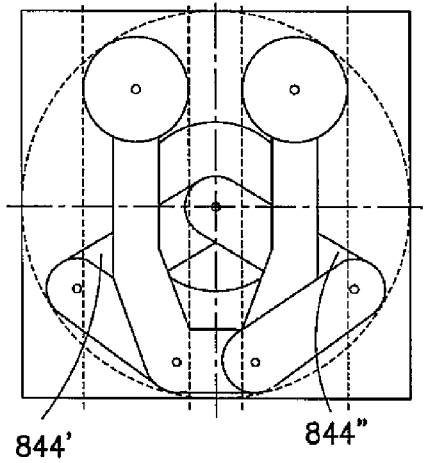
FIG.47A
FIG.47B
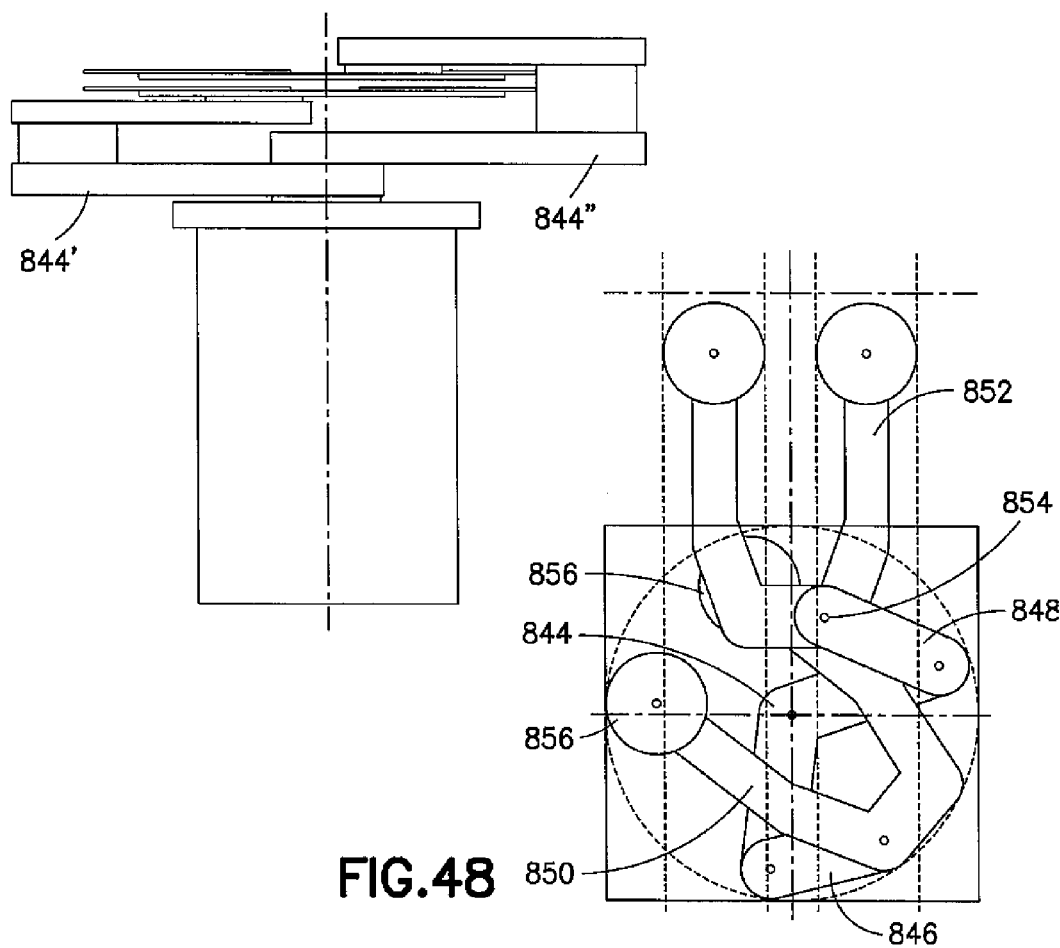
FIG.48

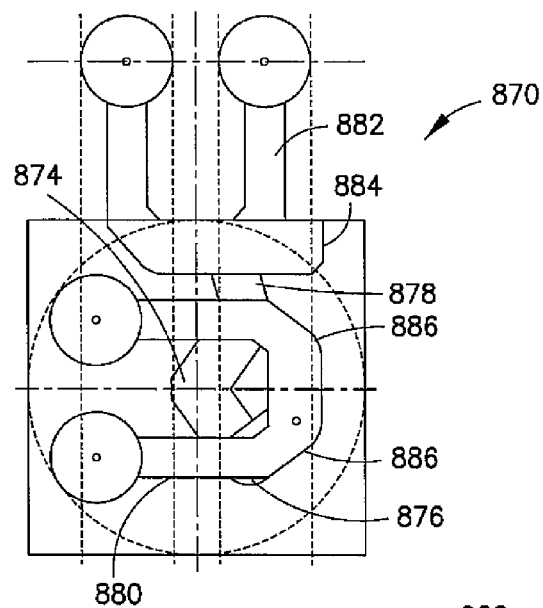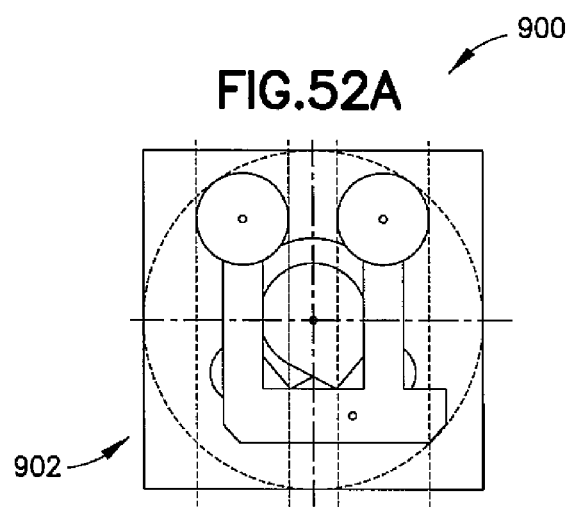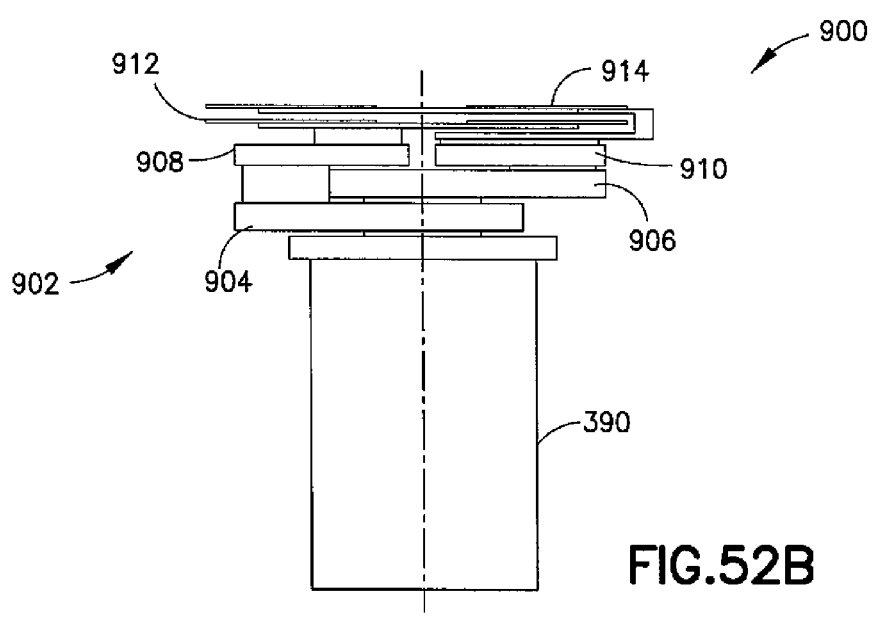

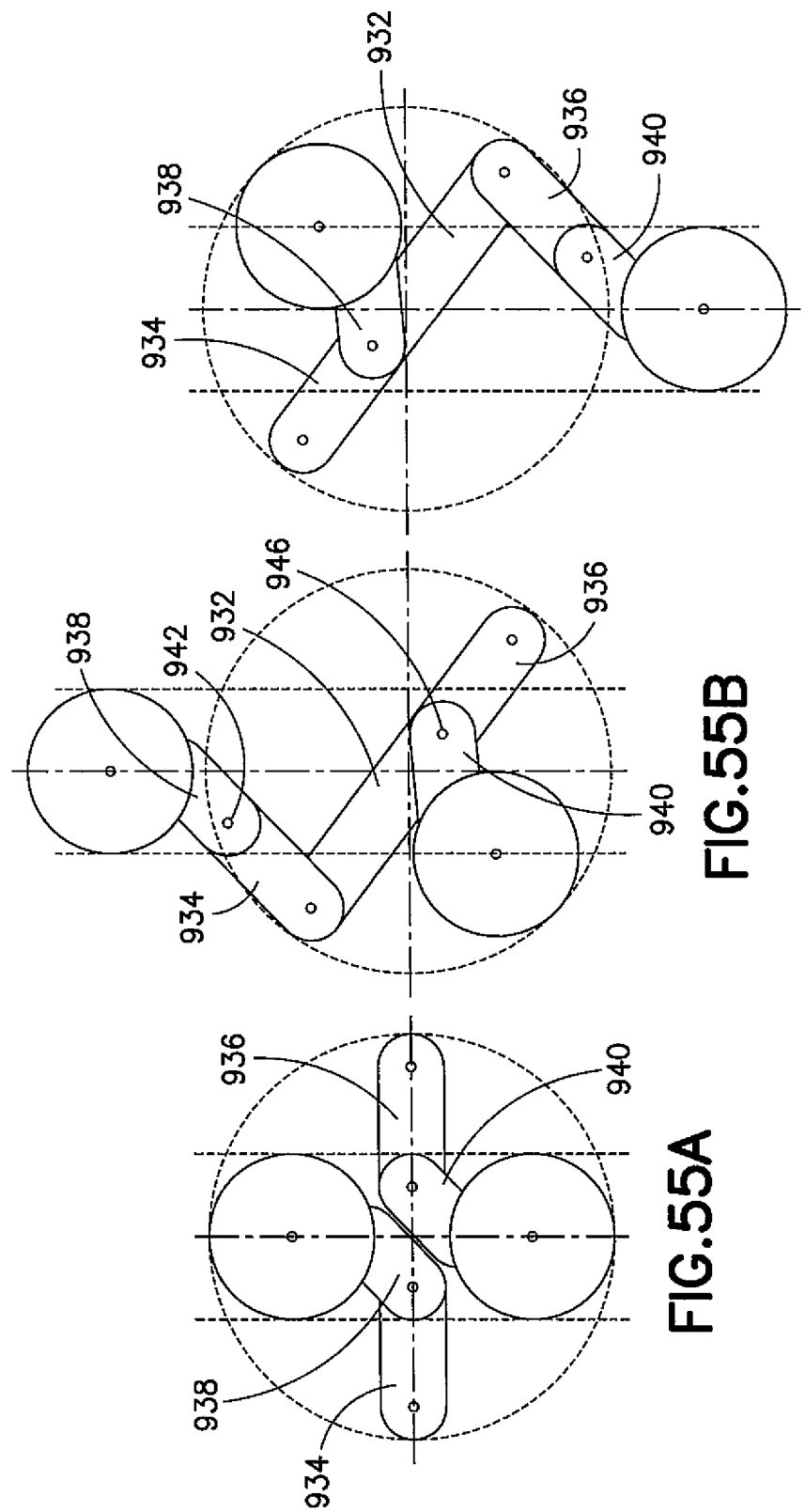

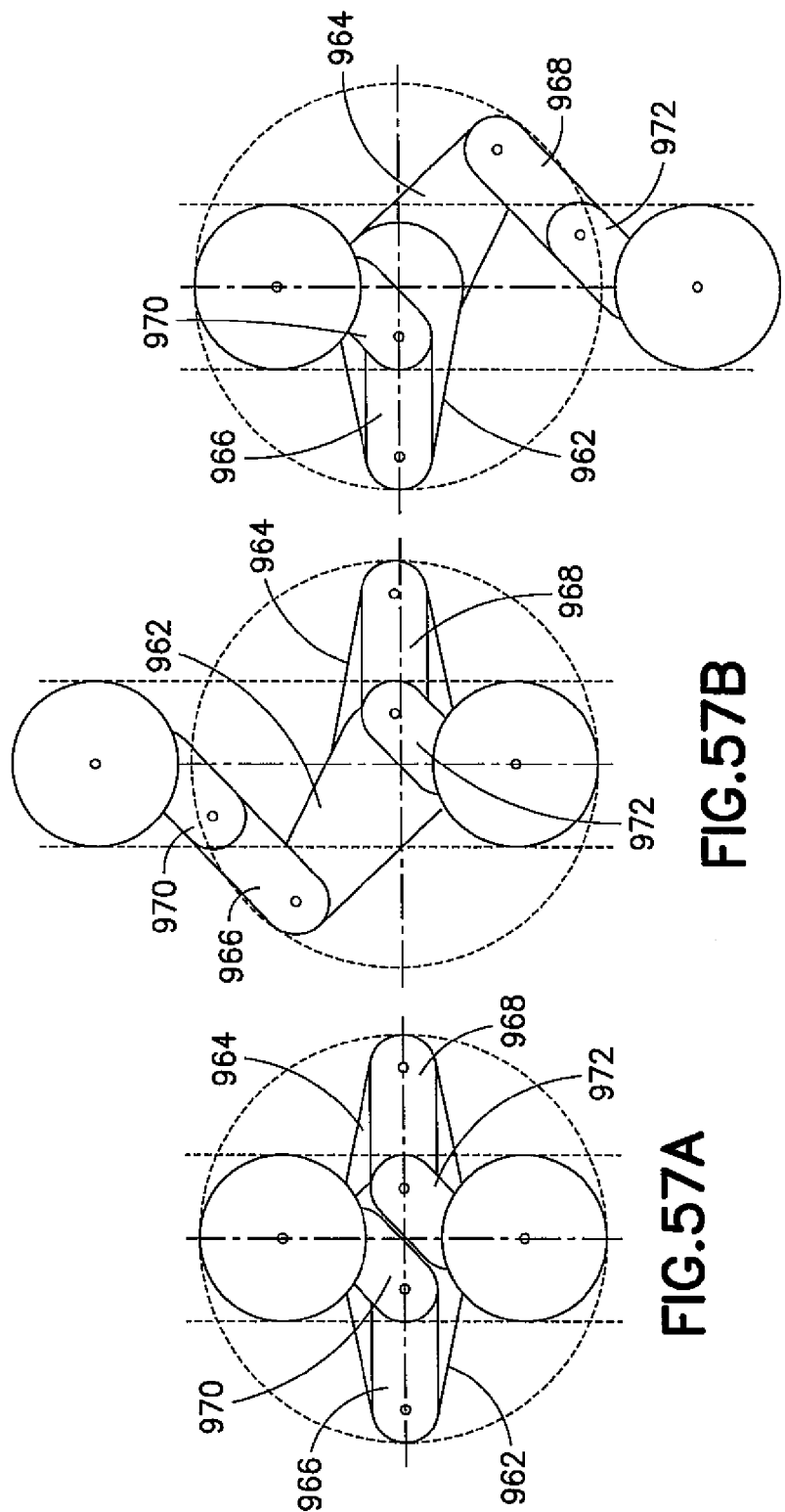

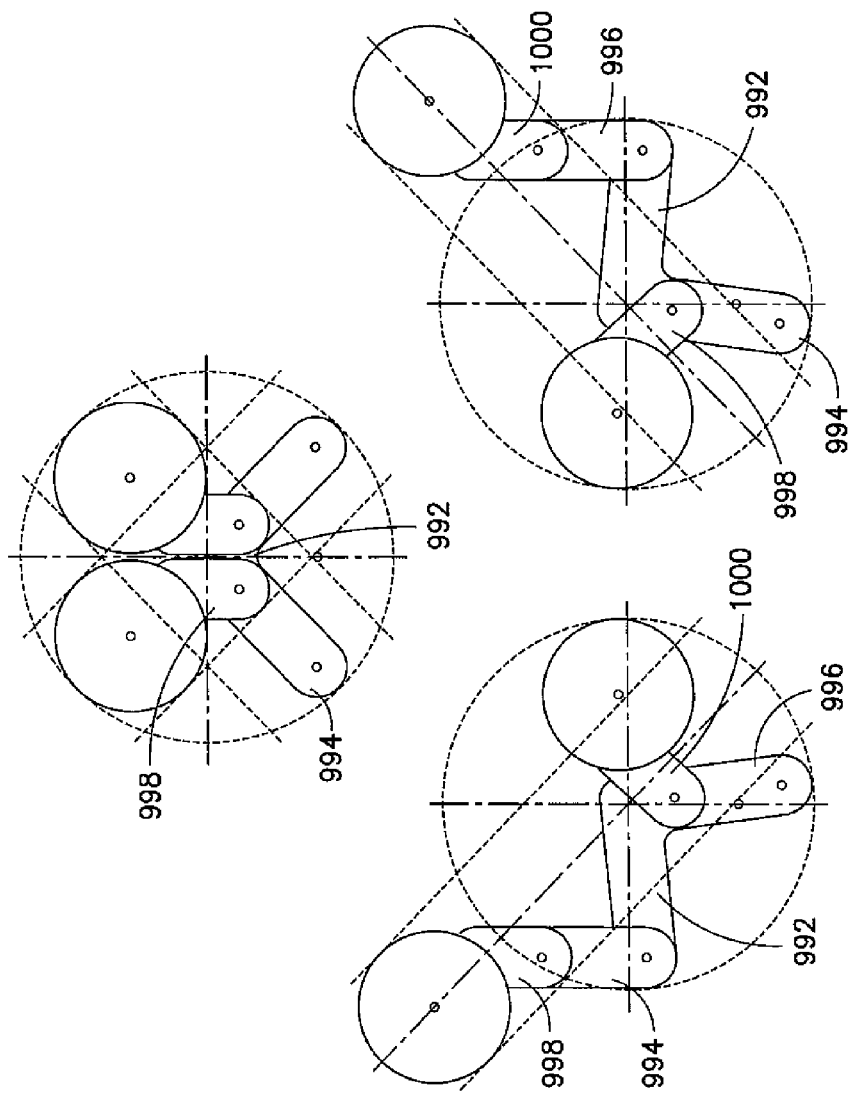

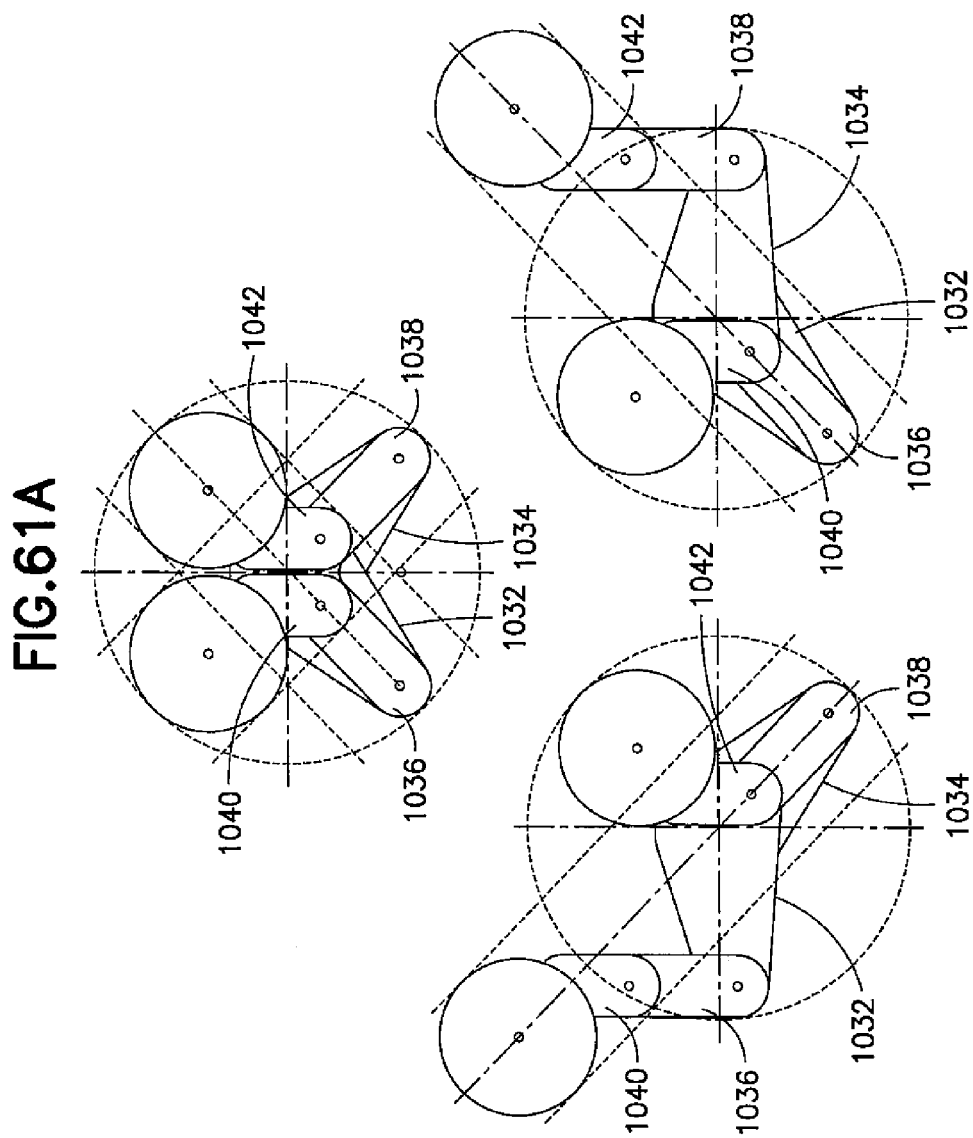

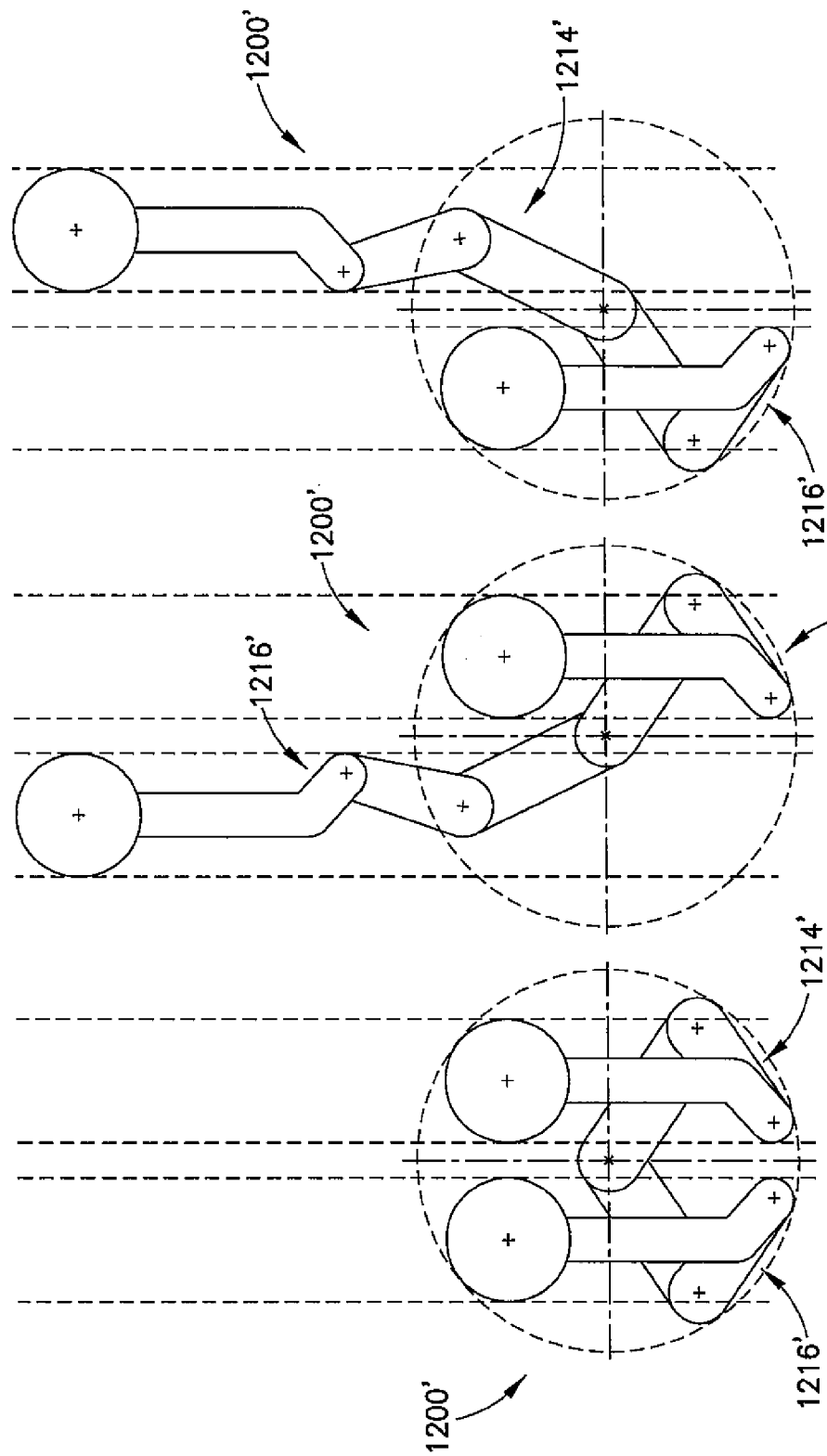

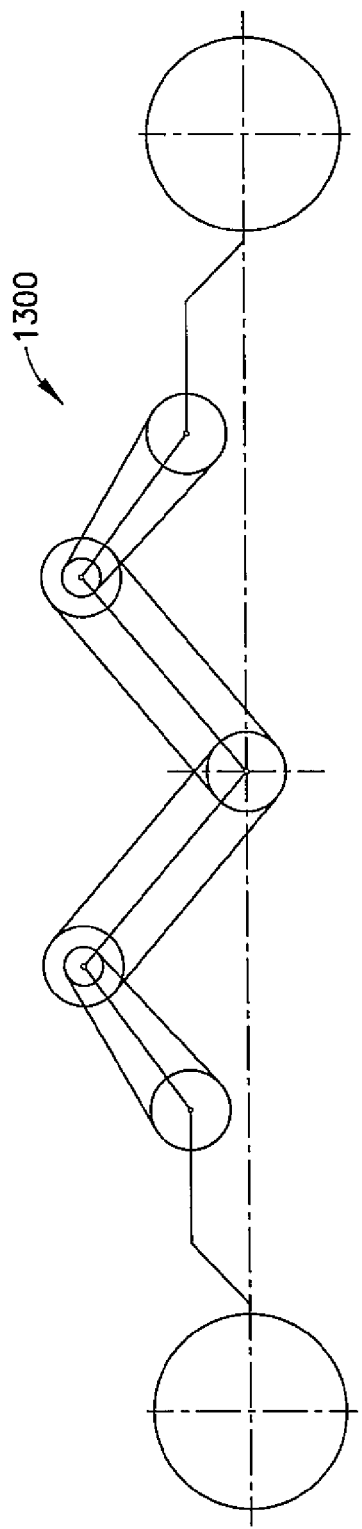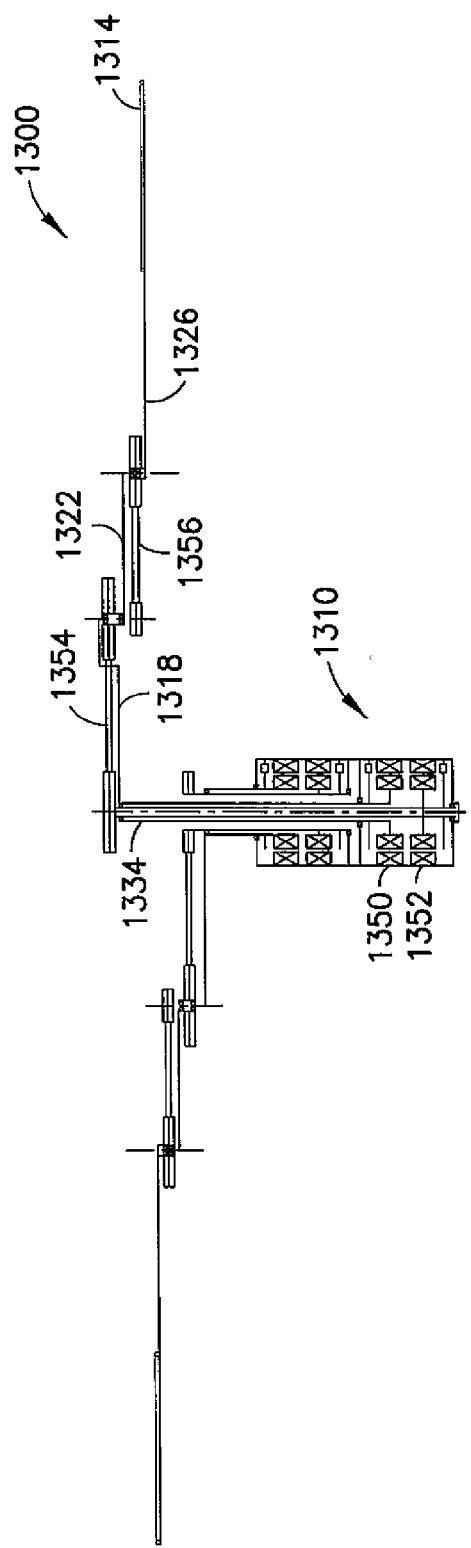

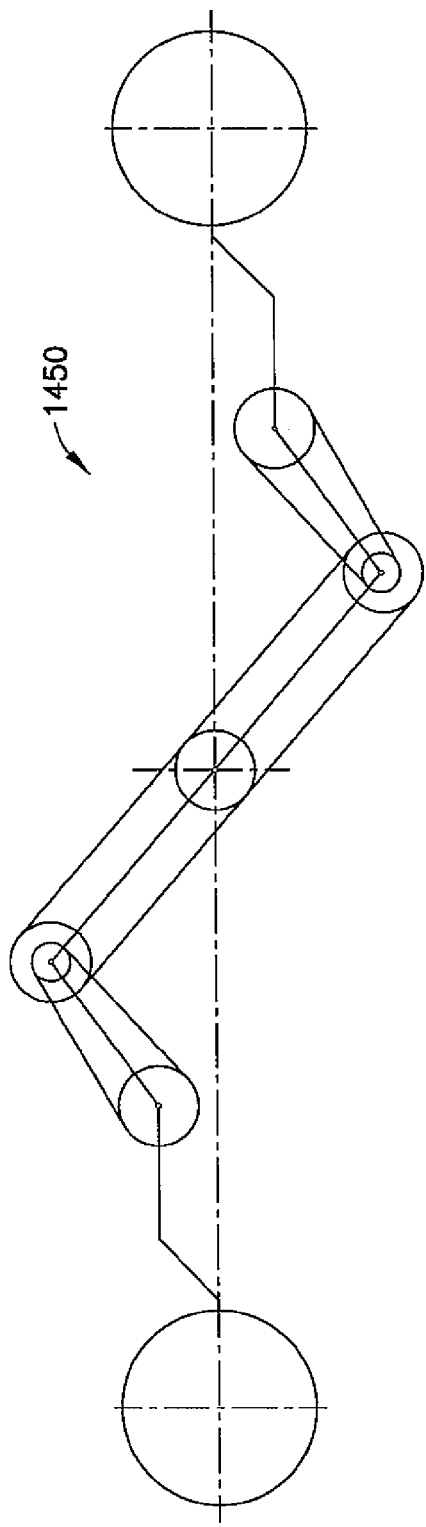
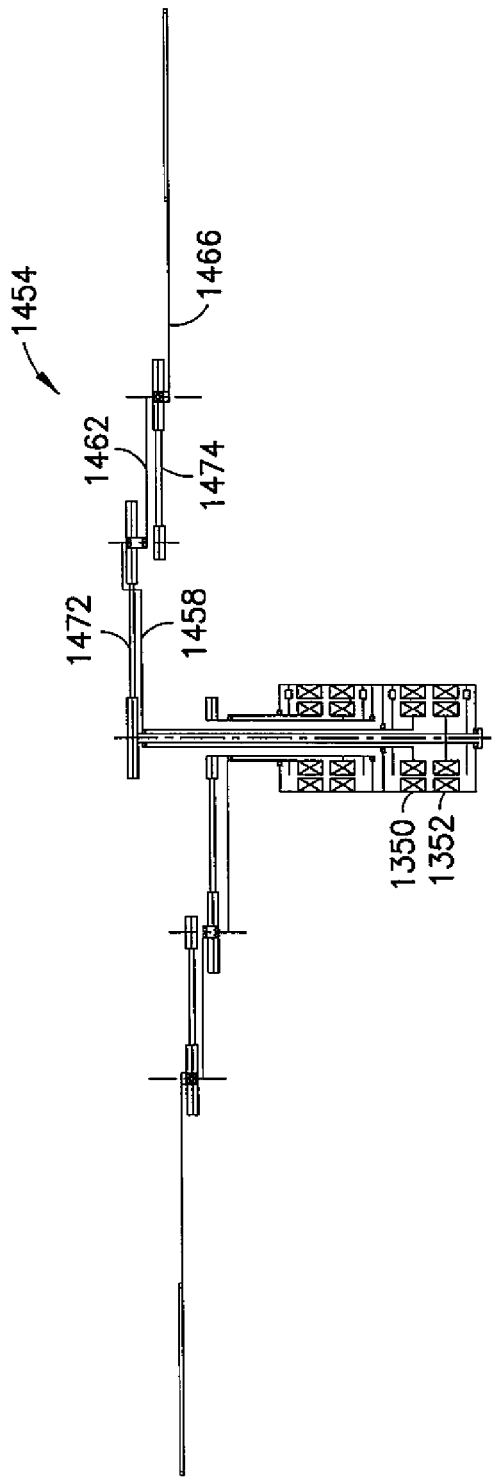

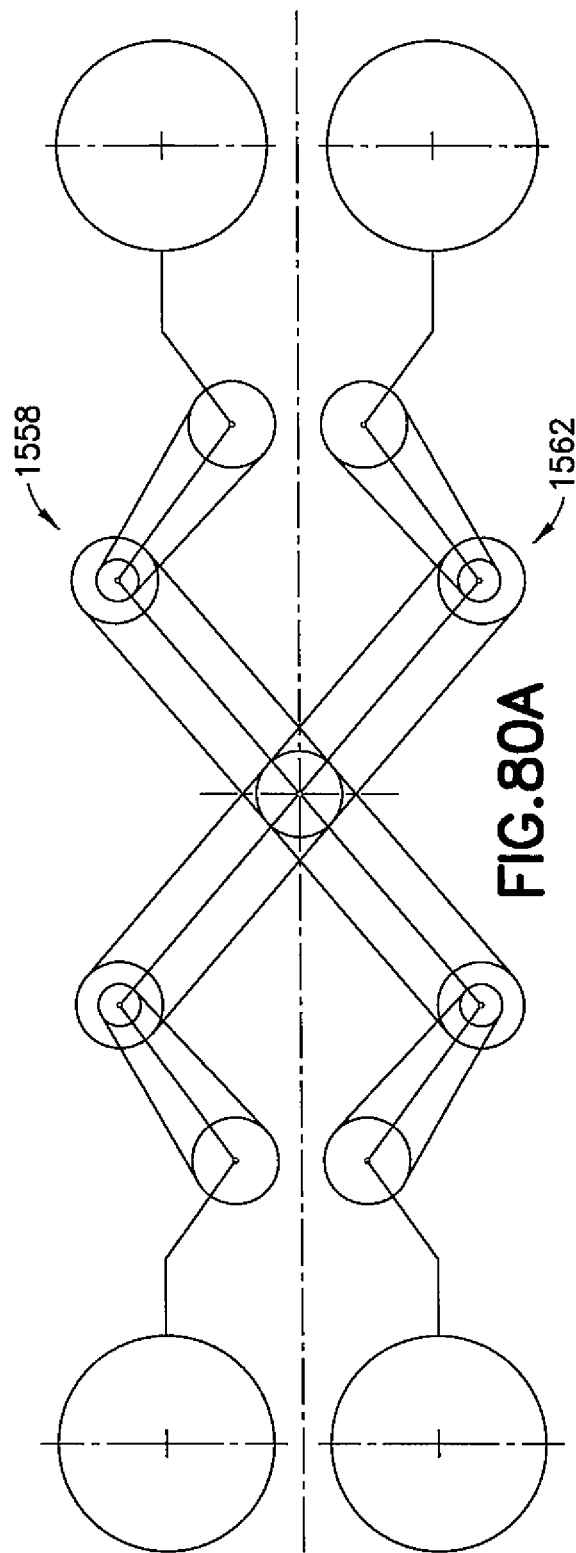

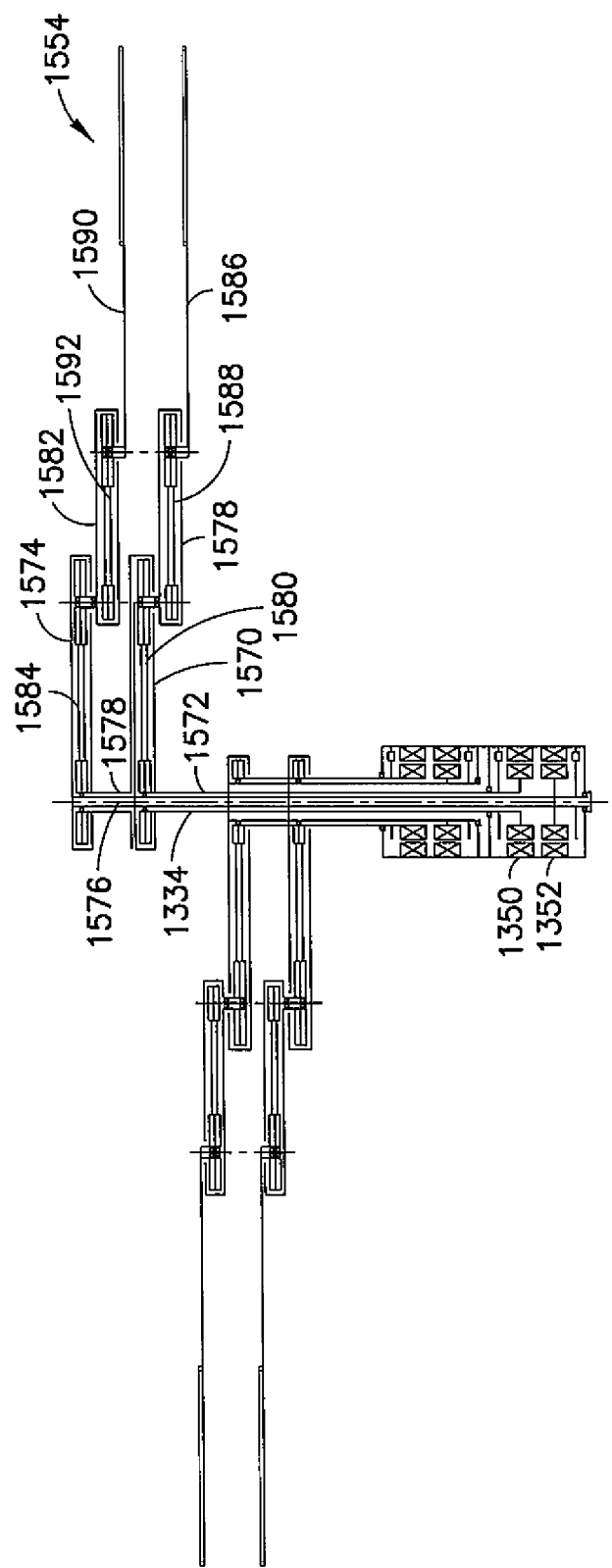

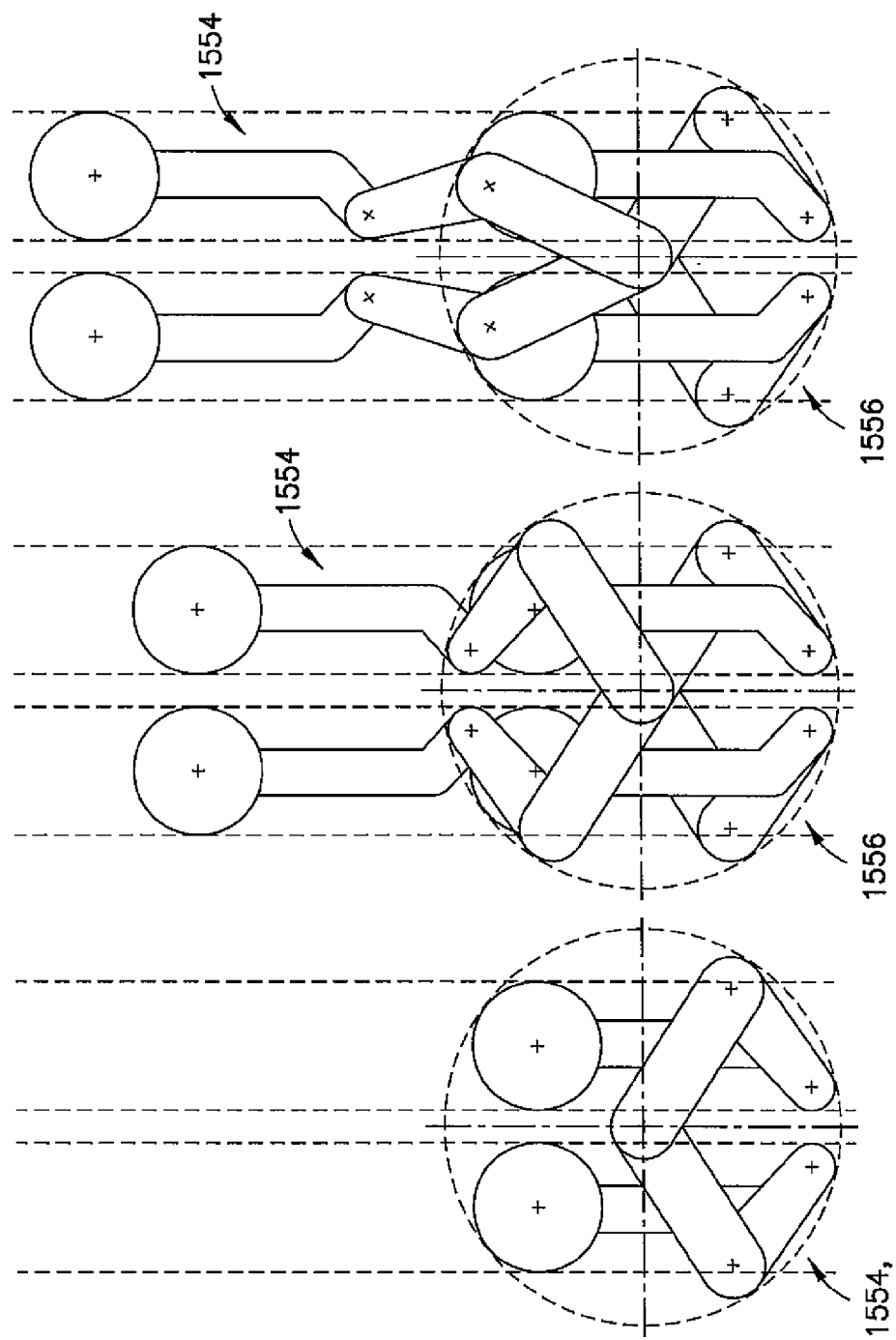

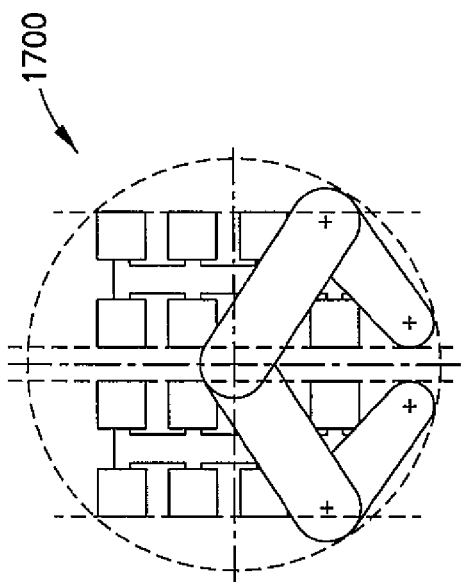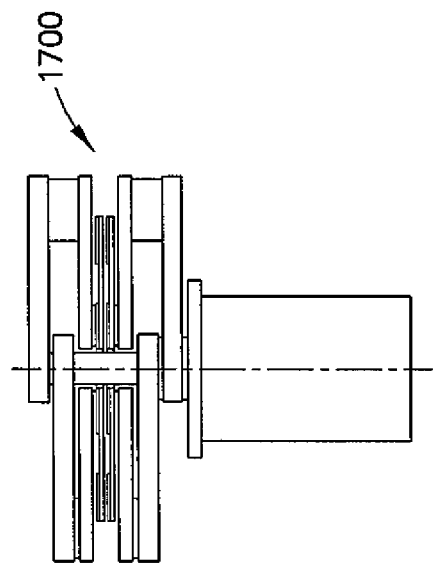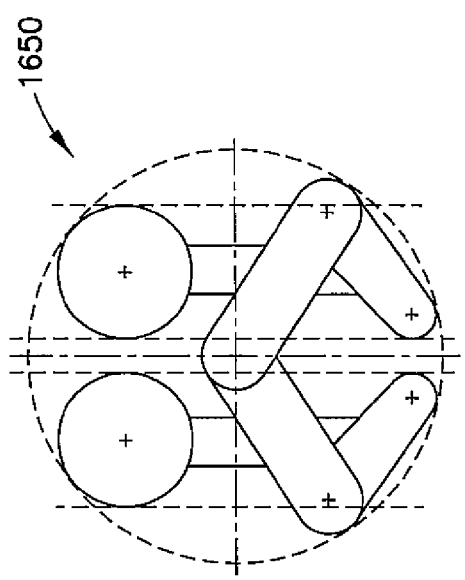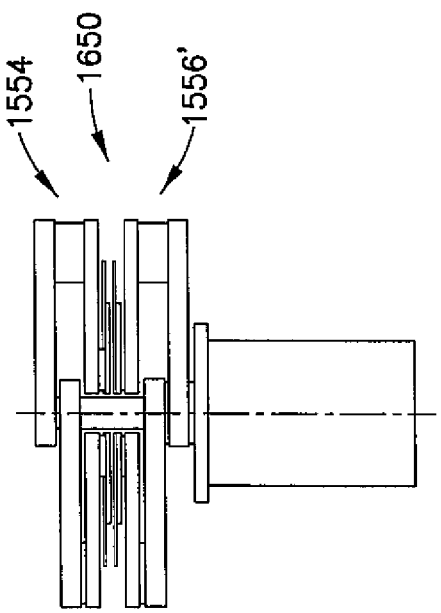

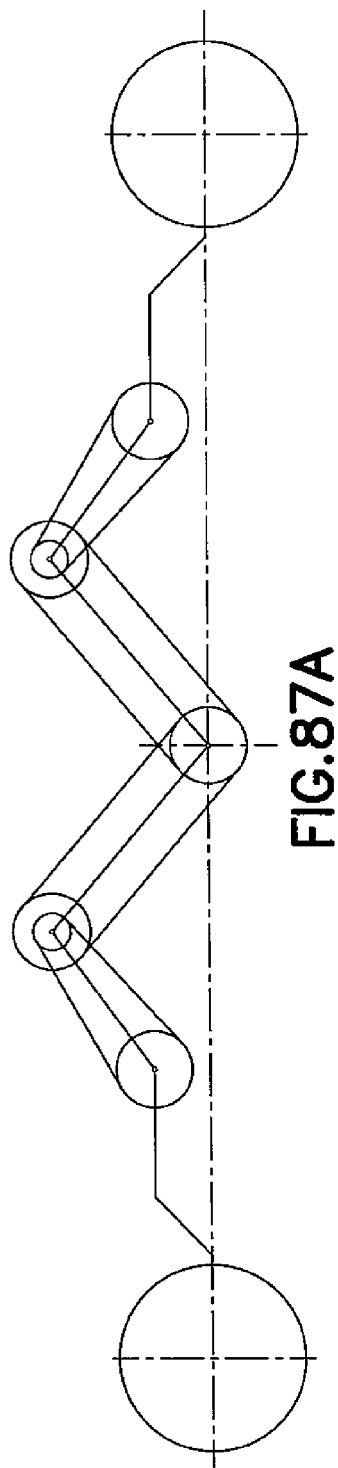
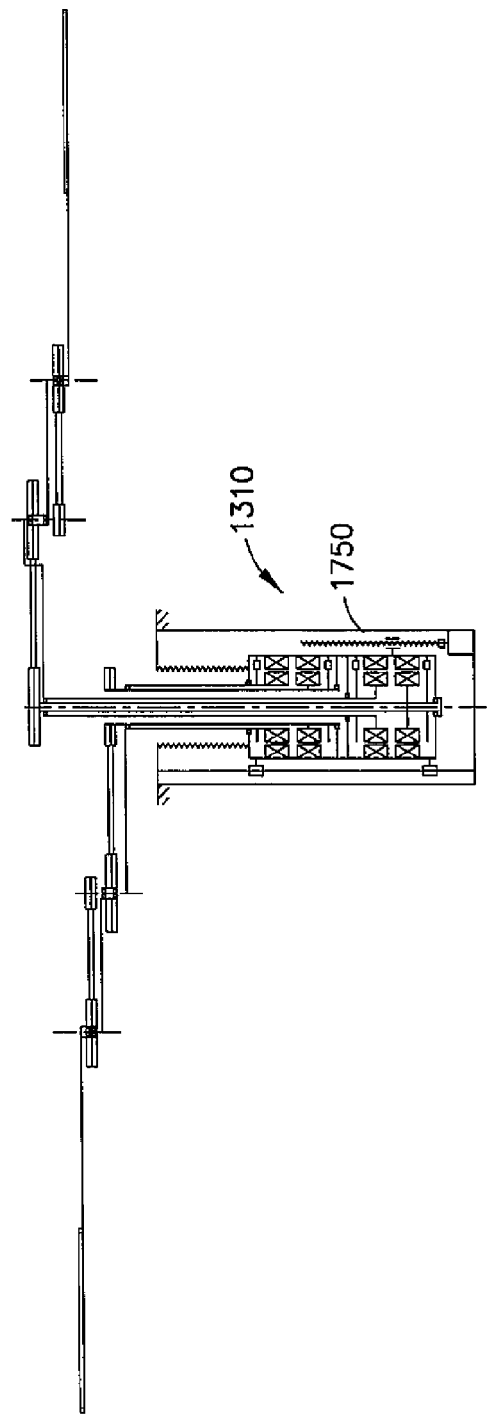
FIG.87A
FIG.87B

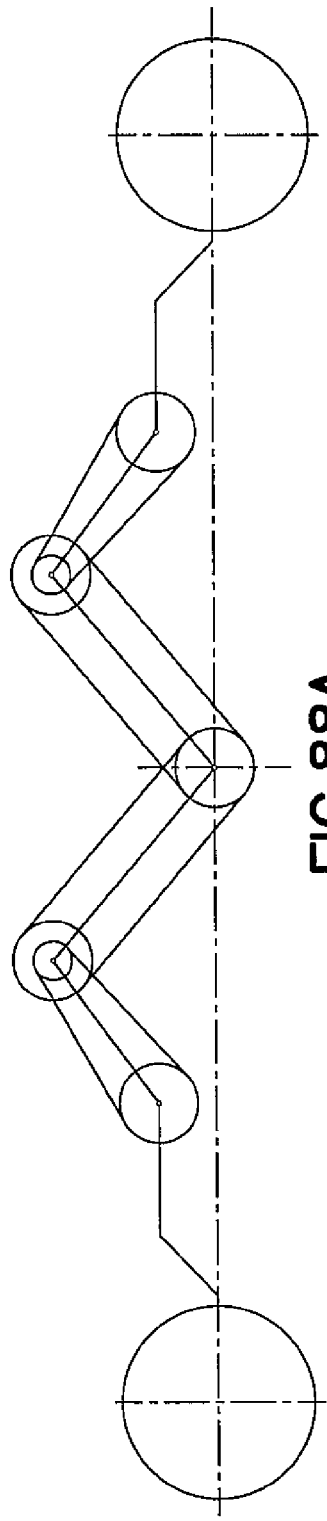
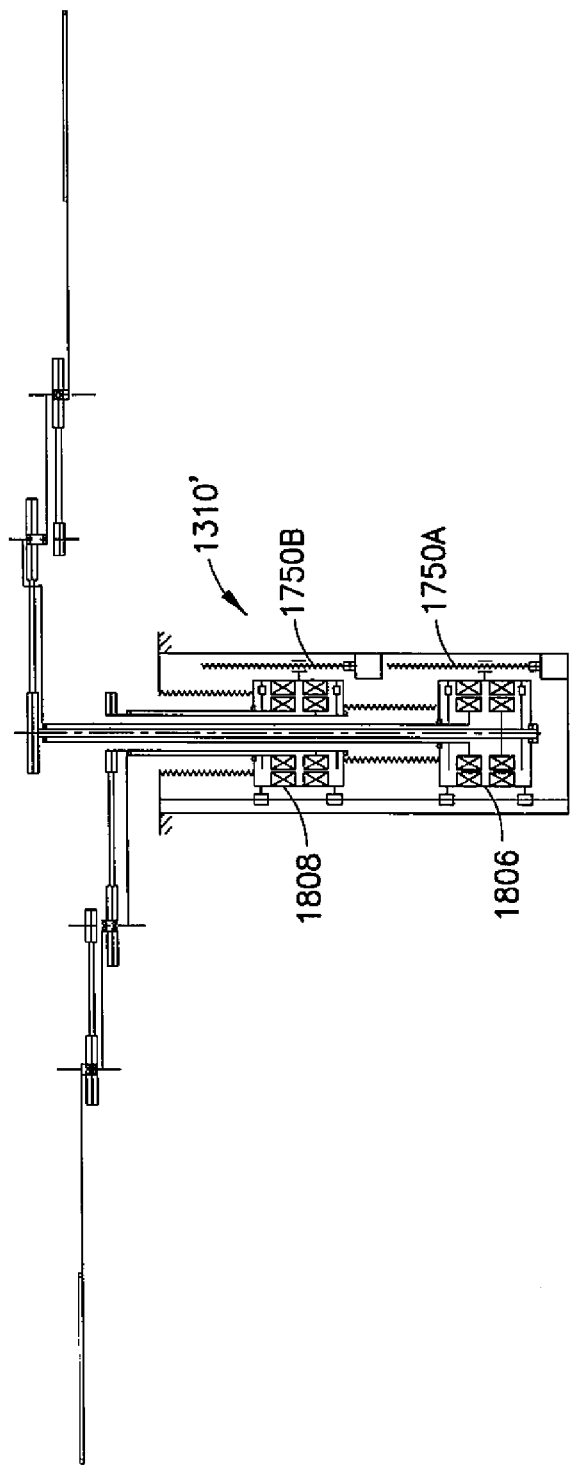
FIG.88A
FIG.88B

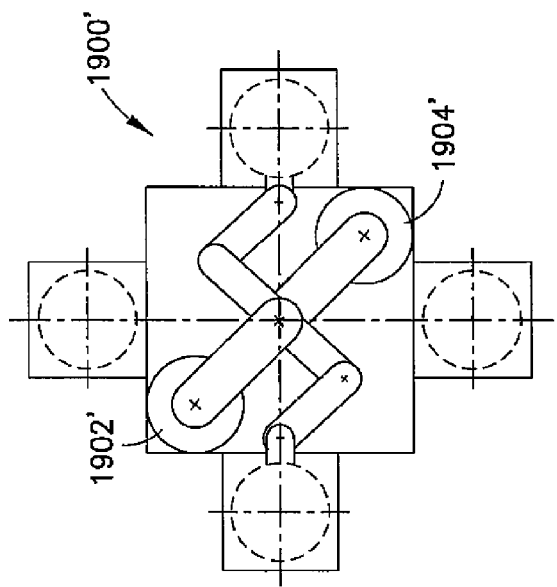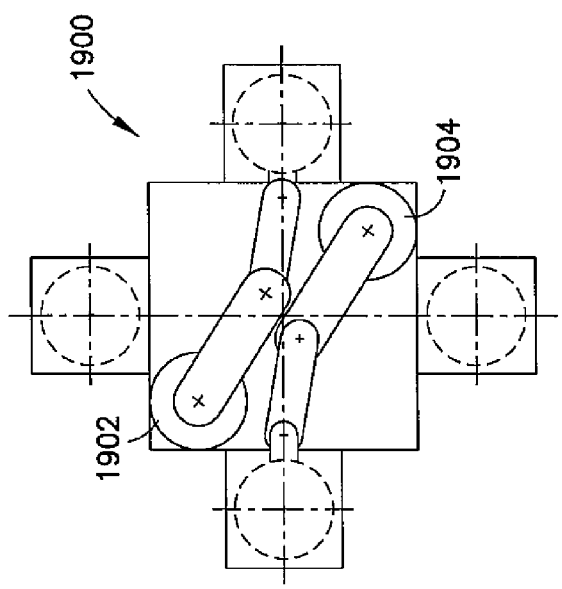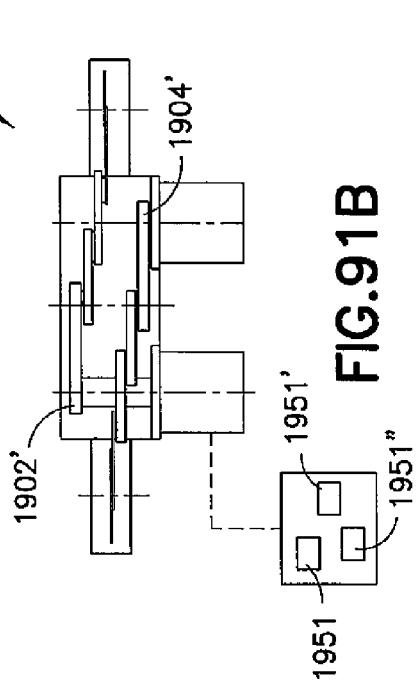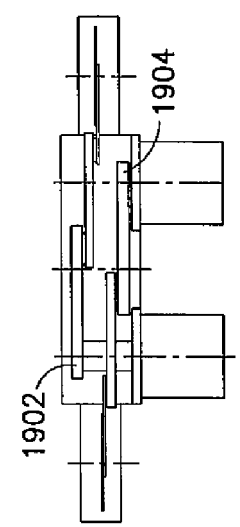

ROBOT HAVING ARM WITH UNEQUAL LINK LENGTHS

CROSS REFERENCE TO RELATED APPLICATIONS

This is a national stage application of International Application No. PCT/US2014/011416 filed 14 Jan. 2014, which claims priority on U.S. provisional application No. 61/825,162 filed 20 May 2013, and U.S. application Ser. No. 13/833,732 filed 15 Mar. 2013, and U.S. provisional application No. 61/762,063 filed 7 Feb. 2013, and U.S. provisional application No. 61/754,125 filed 18 Jan. 2013.

BACKGROUND

Technical Field

The disclosed embodiment relates to a robot having an arm with unequal link lengths and more particularly to a robot having one or more arms with unequal link lengths, each supporting one or more substrates.

Brief Description of Prior Developments

Vacuum, atmospheric and controlled environment processing for applications such as associated with manufacturing of semiconductor, LED, Solar, MEMS or other devices utilize robotics and other forms of automation to transport substrates and carriers associated with substrates to and from storage locations, processing locations or other locations. Such transport of substrates may be moving individual substrates, groups of substrates with single arms transporting one or more substrates or with multiple arms, each transporting one or more substrate. Much of the manufacturing, for example, as associated with semiconductor manufacturing is done in a clean or vacuum environment where footprint and volume are at a premium. Further, much of the automated transport is conducted where minimization of transport times results in reduction of cycle time and increased throughput and utilization of the associated equipment. Accordingly, there is a desire to provide substrate transport automation that requires minimum footprint and workspace volume for a given range of transport applications with minimized transport times.

SUMMARY

The following summary is merely intended to be exemplary. The summary is not intended to limit the claims.

In accordance with one aspect of the exemplary embodiment, a transport apparatus has a drive; a first arm connected to the drive, where the first arm comprises a first link, a second link and an end effector connected in series with the drive, where the first link and the second link have different effective lengths; and a system for limiting rotation of the end effector relative to the second link to provide substantially only straight movement of the end effector relative to the drive when the first arm is extended or retracted.

In accordance with another aspect of the exemplary embodiment, a method is provided comprising: rotating a first link of an arm by a drive; rotating a second link of the arm when the first link is rotated, where the second link is rotated on the first link; and rotating an end effector on the second link, where the first and second links have different effective lengths, and where rotation of the end effector on the second link is constrained such that, when the arm is extended or retracted, the end effector is limited to substantially only straight movement relative to the drive.

In accordance with another aspect of the exemplary embodiment, a transport apparatus is provided having a drive; and an arm connected to the drive, where the arm comprises a first link connected to the drive at a first joint, a second link connected to the first link at a second joint, and an end effector connected to the second link at a third joint, where the first link comprises a first length between the first and second joints which is different from a second length of the second link between the second and third joints, where movement of the end effector at the third joint is constrained to track in a substantially straight radial line relative to the center of rotation of the drive during extending and retracting of the arm.

BRIEF DESCRIPTION OF THE DRAWINGS

The foregoing aspects and other features are explained in the following description, taken in connection with the accompanying drawings, wherein:

FIG. 2A is a top partial schematic view of a transport apparatus;
FIG. 2B is a side section partial schematic view of a transport apparatus;
FIG. 5A is a top view of a transport apparatus;
FIG. 5B is a side view of a transport apparatus;
FIG. 6A is a top partial schematic view of a transport apparatus;
FIG. 7A is a top view of a transport apparatus;
FIG. 7B is a top view of a transport apparatus;
FIG. 7C is a top view of a transport apparatus;
FIG. 10A is a top view of a transport apparatus;
FIG. 10B is a side view of a transport apparatus;
FIG. 11A is a top view of a transport apparatus;
FIG. 11B is a side view of a transport apparatus;
FIG. 14A is a top view of a transport apparatus;
FIG. 14B is a top view of a transport apparatus;
FIG. 14C is a top view of a transport apparatus;
FIG. 16A is a top view of a transport apparatus;
FIG. 16B is a side view of a transport apparatus;
FIG. 17A is a top view of a transport apparatus;
FIG. 17B is a side view of a transport apparatus;
FIG. 18 is a side section partial schematic view of a transport apparatus;
FIG. 19 is a side section partial schematic view of a transport apparatus;
FIG. 21A is a top view of a transport apparatus;
FIG. 21B is a side view of a transport apparatus;

FIG. 22A is a top view of a transport apparatus;
FIG. 22B is a side view of a transport apparatus;
FIG. 24A is a top view of a transport apparatus;
FIG. 24B is a top view of a transport apparatus;
FIG. 24C is a top view of a transport apparatus;
FIG. 26A is a top view of a transport apparatus;
FIG. 26B is a top view of a transport apparatus;
FIG. 26C is a top view of a transport apparatus;
FIG. 27A is a top view of a transport apparatus;
FIG. 27B is a side view of a transport apparatus;
FIG. 28A is a top view of a transport apparatus;
FIG. 28B is a side view of a transport apparatus;
FIG. 29A is a top view of a transport apparatus;
FIG. 29B is a top view of a transport apparatus;
FIG. 29C is a top view of a transport apparatus;
FIG. 34A is a top view of a transport apparatus;
FIG. 34B is a top view of a transport apparatus;
FIG. 34C is a top view of a transport apparatus;
FIG. 39 is a top view of a transport apparatus;
FIG. 40A is a top view of a transport apparatus;
FIG. 40B is a side view of a transport apparatus;
FIG. 43A is a top view of a transport apparatus;
FIG. 43B is a side view of a transport apparatus;
FIG. 44 is a top view of a transport apparatus;
FIG. 45 is a top view of a transport apparatus;
FIG. 46A is a top view of a transport apparatus;
FIG. 46B is a side view of a transport apparatus;
FIG. 47A is a top view of a transport apparatus;
FIG. 47B is a side view of a transport apparatus;
FIG. 48 is a top view of a transport apparatus;
FIG. 51 is a top view of a transport apparatus;
FIG. 52A is a top view of a transport apparatus;
FIG. 52B is a side view of a transport apparatus;
FIG. 55A is a top view of a transport apparatus;
FIG. 55B is a top view of a transport apparatus;
FIG. 55C is a top view of a transport apparatus;
FIG. 57A is a top view of a transport apparatus;
FIG. 57B is a top view of a transport apparatus;
FIG. 57C is a top view of a transport apparatus;
FIG. 59A is a top view of a transport apparatus;
FIG. 59B is a top view of a transport apparatus;
FIG. 59C is a top view of a transport apparatus;
FIG. 61A is a top view of a transport apparatus;
FIG. 61B is a top view of a transport apparatus;
FIG. 61C is a top view of a transport apparatus;
FIGS. 67A-67C are top views of an example substrate transport robot;
FIG. 70A is a top schematic view of an example substrate transport robot;
FIG. 70B is a section schematic view of an example substrate transport robot;
FIG. 75A is a top schematic view of an example substrate transport robot;
FIG. 75B is a section schematic view of an example substrate transport robot;
FIG. 80A is a top schematic view of an example substrate transport robot;
FIG. 80B is a section schematic view of an example substrate transport robot.

FIGS. 82A-82C are top views of an example substrate transport robot;

FIG. 83A is a top view of an example substrate transport robot;

FIG. 83B is a side view of an example substrate transport robot;

FIG. 84A is a top view of an example substrate transport robot;

FIG. 84B is a side view of an example substrate transport robot;

FIG. 87A is a top schematic view of an example substrate transport robot;

FIG. 87B is a section schematic view of an example substrate transport robot;

FIG. 88A is a top schematic view of an example substrate transport robot;

FIG. 88B is a section schematic view of an example substrate transport robot;

FIG. 90A is a top view of an example substrate transport apparatus;

FIG. 90B is a side view of an example substrate transport apparatus;

FIG. 91A is a top view of an example substrate transport apparatus; and

FIG. 91B is a side view of an example substrate transport apparatus.

DETAILED DESCRIPTION OF THE EXEMPLARY EMBODIMENT

Figure 1A:
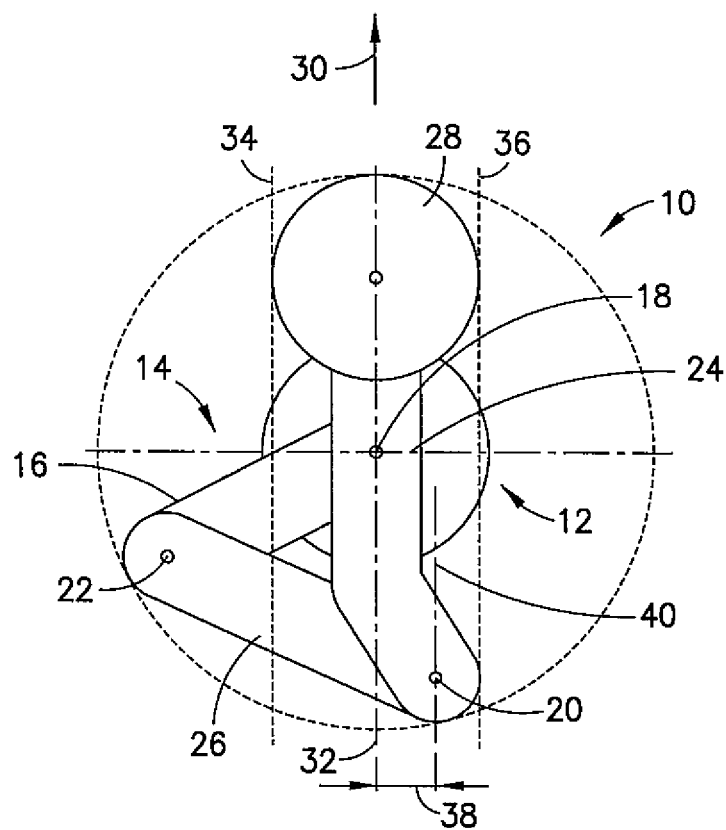
FIG. 1A is a top view of a transport apparatus.

Aside from the embodiment disclosed below, the disclosed embodiment is capable of other embodiments and of being practiced or being carried out in various ways. Thus, it is to be understood that the disclosed embodiment is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1B:
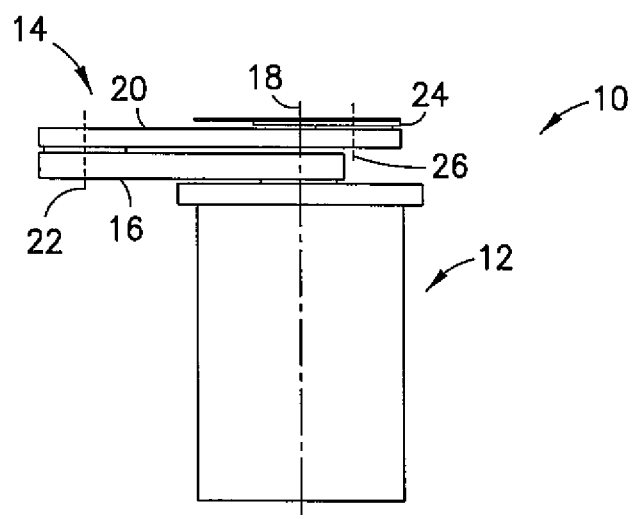
FIG. 1B is a side view of a transport apparatus.

Referring now to FIGS. 1A and 1B, there is shown top and side views respectively of robot 10 having drive 12 and arm 14. Arm 14 is shown in a retracted position. Arm 14 has upper arm or first link 16 rotateable about a central axis of rotation 18 of drive 12. Arm 14 further has forearm or second link 20 rotatable about an elbow axis of rotation 22. Arm 14 further has end effector or third link 24 rotatable about a wrist axis of rotation 26. End effector 24 supports substrate 28. As will be described, arm 14 is configured to cooperate with drive 12 such that substrate 28 is transported along a radial path 30 that may coincide with (as seen in FIG. 1A) or a path, for example, path 34, 36 or otherwise parallel to a linear path 32 that coincides with the central axis of rotation 18 of drive 12. In the embodiment shown, the joint-to-joint length of forearm or second link 20 is larger than the joint-to-joint length of the upper arm or first link 16. In the embodiment shown, the lateral offset 38 of the end-effector or third link 24 corresponds to the difference of the joint-to-joint lengths of the forearm 20 and upper arm 14. As will be described in greater detail below, the lateral offset 38 is maintained substantially constant during extension and retraction of arm 14 such that substrate 28 is moved along a linear path without rotation of substrate 28 or end effector 24 with respect to the linear path. This is accomplished with structure internal to arm 14 as will be described without the use of an additional controlled axis to control rotation of end effector 24 at wrist 26 with respect to forearm 20. In one aspect of the disclosed embodiment, with respect to FIG. 1A, the center of mass of the third link or end effector 24 may reside at the wrist centerline or axis of rotation 26. Alternately, the center of mass of the third link or end effector 24 may reside along path 40 offset 38 from the central axis of rotation 18. In this manner, the disturbance to the bands that constrain end effector 24 with respect to links 16, 18 may be minimized due to a moment applied as a result of the mass being offset otherwise during extension and retraction of the arm. Here, the center of mass may be determined with or without the substrate or may be in between. Alternately, the center of mass of the third link or end effector 24 may reside at any suitable location. In the embodiment shown, substrate transport apparatus 10 transports substrate 28 with moveable arm assembly 14 coupled to drive section 12 on central axis of rotation 18. Substrate support 24 is coupled to the arm assembly 14 on wrist axis of rotation 26 where arm assembly 14 rotates about central axis of rotation 18 during extension and retraction as will be seen with respect to FIGS. 3A-C. Wrist axis of rotation 26 moves along wrist path 40 parallel to and offset 38 or otherwise from radial path, for example, path 30, 34 or 36 relative to the central axis of rotation 18 during extension and retraction. Substrate support 24 similarly moves parallel to radial path 30 during extension and retraction without rotation. As will be described in greater detail in other aspects of the disclosed embodiment, the principles and structure that constrain the end effector to move in a substantially purely radial motion may be applied where the length of the fore arm is shorter than that of the upper arm. Further, the features may be applied where more than one substrate is being handled by the end effector. Further, the features may be applied where a second arm is used in connection with the drive handling one or more additional substrates. Accordingly, all such variations may be embraced.

Figure 3C:
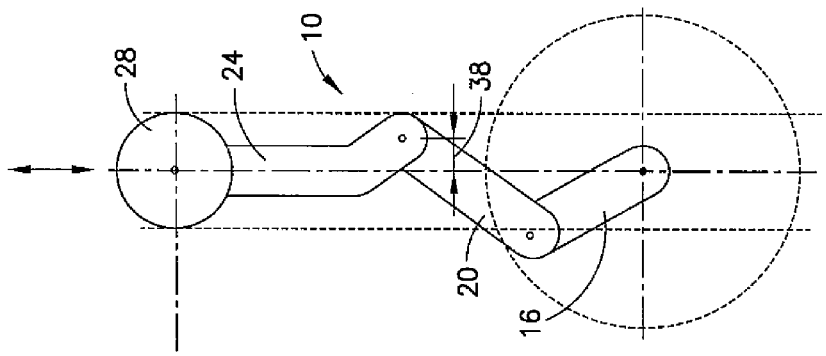
FIG. 3C is a top view of a transport apparatus.
Figure 3B:
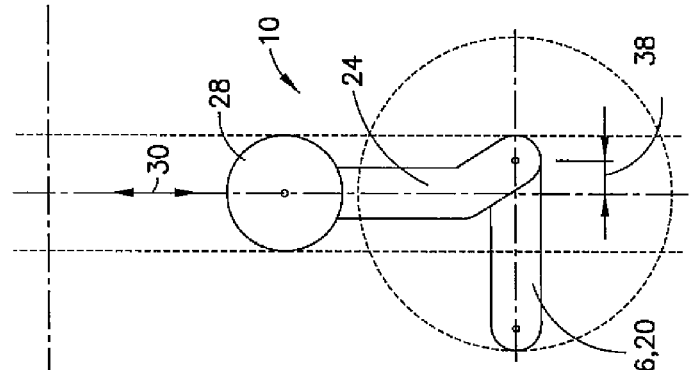
FIG. 3B is a top view of a transport apparatus.
Figure 3A:
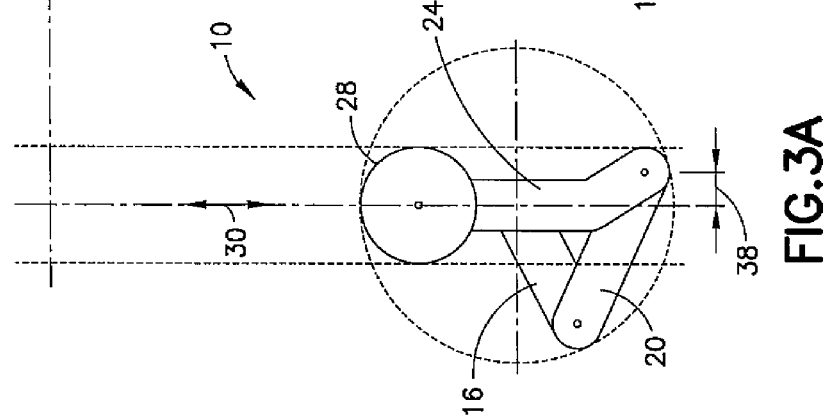
FIG. 3A is a top view of a transport apparatus.
Figure 4:
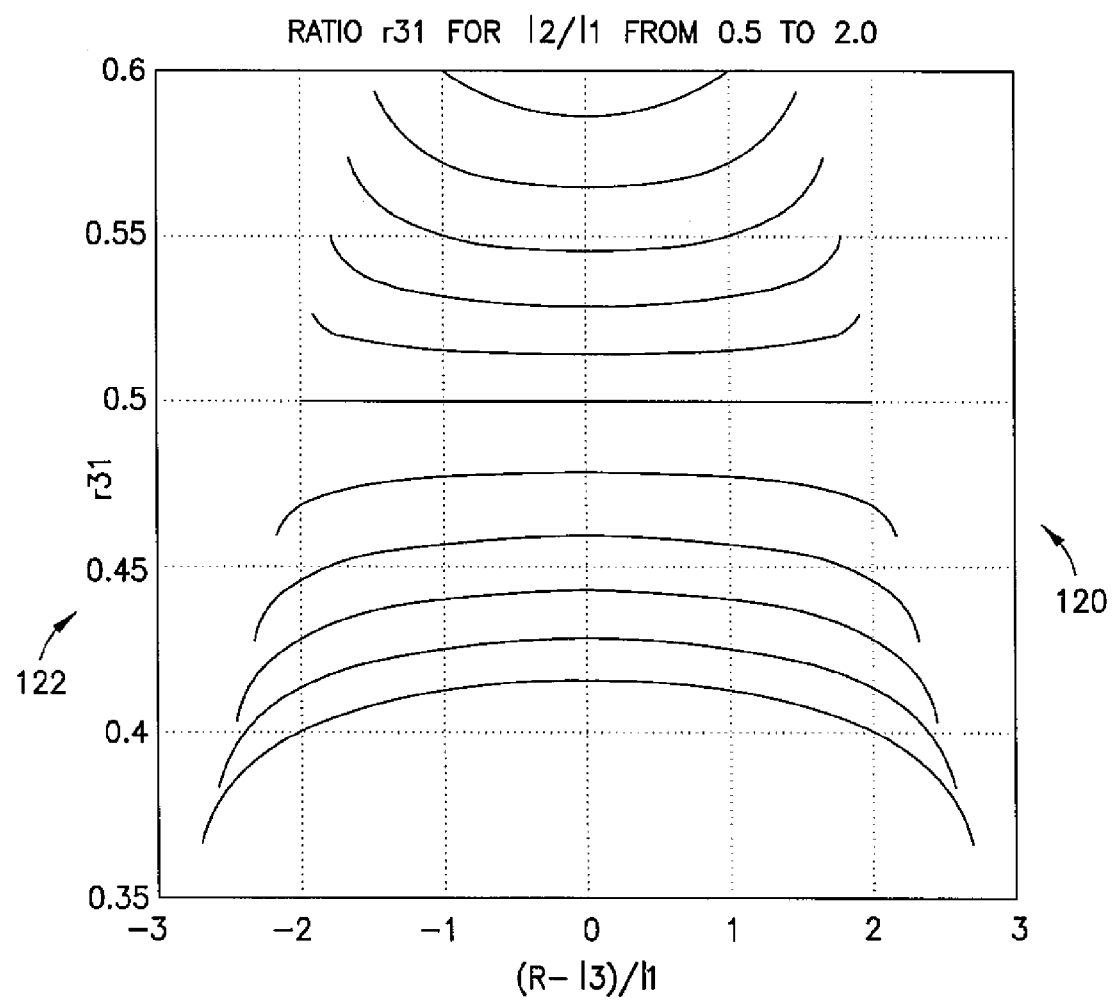
FIG. 4 is a graphical plot.

Referring also to FIGS. 2A and 2B, there are shown partial schematic top and side views respectively of system 10 showing the internal arrangements used to drive the individual links of arm 14 shown in FIGS. 1A and 1B. Drive 12 has first and second motors 52, 54 with corresponding first and second encoders 56, 58 coupled to housing 60 and respectively driving first and second shafts 62, 64. Here shaft 62 may be coupled to pulley 66 and shaft 64 may be coupled to upper arm 64 where shafts 62, 64 may be concentric or otherwise disposed. In alternate aspects, any suitable drive may be provided. Housing 60 may be in communication with chamber 68 where bellows 70, chamber 68 and an internal portion of housing 60 isolate a vacuum environment 72 from an atmospheric environment 74. Housing 60 may slide in a z direction as a carriage on slides 76 where a lead screw or other suitable vertical or linear z drive 78 may be provided to selectively move housing 60 and arm 14 coupled there to in a z 80 direction. In the embodiment shown, upper arm 16 is driven by motor 54 about the central axis of rotation 18. Similarly, forearm is driven by motor 52 through a band drive having pulleys 66, 82 and bands 84, 86 such as conventional circular pulleys and bands. In alternate aspects, any suitable structure may be provided to drive forearm 20 with respect to upper arm 16. The ratio between pulleys 66 and 82 may be 1:1, 2:1 or any suitable ratio. Third link 24 with the end-effector may be constrained by a band drive having pulley 88 grounded with respect to link 16, pulley 90 grounded with respect to end effector or third link 24 and bands 92, 94 constraining pulley 88 and pulley 90. As will be described, the ratio between pulleys 88, 90 may not be constant in order for third link 24 to track a radial path without rotation during extension and retraction of arm 14. This may be accomplished where pulleys 88, 90 may be one or more non circular pulleys, such as two non-circular pulleys or where one of pulley 88, 90 may be circular and the other being non circular. Alternately, any suitable coupling or linkage may be provided to constrain the path of third link or end effector 24 as described. In the embodiment shown, at least one non-circular pulley compensates for the effects of the unequal lengths of upper arm 16 and forearm 20 so that the end-effector 24 points radially 30 regardless of the position of the first two links 16, 20. The embodiment will be described with respect to pulley 90 being non circular and pulley 88 being circular. Alternately, pulley 88 may be non-circular and pulley 90 circular. Alternately, pulleys 88 and 92 may be non-circular or any suitable coupling may be provided to constrain the links of arm 14 as described. By way of example, non-circular pulleys or sprockets are described in U.S. Pat. No. 4,865,577 issued on Sep. 12, 1989 and entitled Noncircular Drive which is hereby incorporated by reference herein in its entirety. Alternately, any suitable coupling may be provided to constrain the links of arm 14 as described, for example, any suitable variable ratio drive or coupling, linkage gears or sprockets, cams or otherwise used alone or in combination with a suitable linkage or other coupling. In the embodiment shown, elbow pulley 88 is coupled to upper arm 16 and is shown round or circular where wrist pulley 90 coupled to wrist or third link 24 is shown non circular. The wrist pulley shape is non-circular and may have symmetry about a line 96 perpendicular to the radial trajectory 30 which also may coincide with or be parallel to the line between the two pulleys 88, 90 when the forearm 20 and upper arm 16 are lined up over each other with the wrist axis 26 closest to shoulder axis 18, for example as seen in FIG. 3B. The shape of pulley 90 is such that bands 92, 94 stay tight as arm 14 extends and retracts establishing points of tangency 98, 100 on opposing sides of pulley 90 having changing radial distances 102, 104 from the wrist axis of rotation 26. For example, at the orientation shown in FIG. 3B, each of the points of tangency 98, 100 of the two bands on the pulley is at an equal radial distance 102, 104 from the wrist axis of rotation 26. This will be further described with respect to FIG. 4 showing respective ratios. In order for arm 14 to rotate, both drive shafts 62, 64 of the robot need to move in the direction of rotation of the arm by the same amount. In order for the end-effector 24 to extend and retract radially along a straight-line path, the two drive shafts 62, 64 need to move in a coordinated manner, for example, in accordance with the exemplary inverse kinematic equations presented later in this section. Here, a substrate transport apparatus 10 is adapted to transport substrate 28. Forearm 20 is rotatably coupled to upper arm 16 and rotatable about elbow axis 22 being offset from central axis 18 by an upper arm link length. End effector 24 is rotatably coupled to forearm 20 and rotatable about wrist axis 26 offset from the elbow axis 22 by a forearm link length. Wrist pulley 90 is fixed to the end effector 24 and coupled to elbow pulley 88 with band 92, 94. Here, the forearm link length is different than the upper arm link length and the end effector is constrained with respect to the upper arm by the elbow pulley, the wrist pulley and the band such that the substrate moves along a linear radial path 30 with respect to the central axis 18. Here, substrate support 24 coupled to the upper arm 16 with a substrate support coupling 92 and driven about the wrist axis of rotation 26 by relative movement between the forearm 20 and the upper arm 16 about the elbow axis of rotation 22. FIGS. 3A, 3B and 3C illustrate extension motion of the robot of FIGS. 1 and 2. FIG. 3A shows the top view of the robot 10 with the arm 14 in its retracted position. FIG. 3B depicts the arm 14 partially extended with the forearm 20 aligned on top of the upper arm 16, illustrating that the lateral offset 38 of the end-effector corresponds to the difference of the joint-to-joint lengths of the forearm 20 and upper arm 16. FIG. 3C shows the arm 14 in an extended position although not full extension.

Exemplary direct kinematics may be provided. In alternate aspects, any suitable direct kinematics may be provided to correspond to alternative structure. The following exemplary equations may be used to determine the position of the end-effector as a function of the position of the motors:

$$x_2 = l_1 \cos \theta_1 + l_2 \cos \theta_2 \quad (1.1)$$

$$y_2 = l_1 \sin \theta_1 + l_2 \sin \theta_2 \quad (1.2)$$

$$R_2 = \mathrm{sqrt}(x_2^2 + y_2^2) \quad (1.3)$$

$$T_2 = a\tan 2(y_2, x_2) \quad (1.4)$$

$$\alpha_3 = a\sin(d_3/R_2) \text{ where } d_3 = l_2 - l_1 \quad (1.5)$$

$$\alpha_{12} = \theta_1 - \theta_2 \quad (1.6)$$

$$\text{If } \alpha_{12} < \pi : R = \mathrm{sqrt}(R_2^2 - d_3^2) + l_3, T = T_2 + \alpha_3, else\ R = -\mathrm{sqrt}(R_2^2 - d_3^2) + l_3, T = T_2 - \alpha_3 + \pi \quad (1.7)$$

Exemplary inverse kinematics may be provided. In alternate aspects, any suitable inverse kinematics may be provided to correspond to alternative structure. The following exemplary equations may be utilized to determine the position of the motors to achieve a specified position of the end-effector:

$$x_3 = R\cos T \quad (1.8)$$

$$y_3 = R\sin T \quad (1.9)$$

$$x_2 = x_3 - l_3 \cos T + d_3 \sin T \quad (1.10)$$

$$y_2 = y_3 - l_3 \sin T - d_3 \cos T \quad (1.11)$$

$$R_2 = \mathrm{sqrt}(x_2^2 + y_2^2) \quad (1.12)$$

$$T_2 = a\tan 2(y_2, x_2) \quad (1.13)$$

$$\alpha_1 = a\cos((R_2^2 + l_1^2 - l_2^2)/(2R_2^1 l_1)) \quad (1.14)$$

$$\alpha_2 = a\cos((R_2^2 - l_1^2 + l_2^2)/(2R_2^1 l_2)) \quad (1.15)$$

$$\text{If } R > l_3 : \theta_1 = T_2 + \alpha_1, \theta_2 = T_2 - \alpha_2, else:\ \theta_1 = T_2 - \alpha_1, \theta_2 = T_2 + \alpha_2 \quad (1.16)$$

The following nomenclature may be used in the kinematic equations:
$d_3$ = lateral offset of end-effector (m)
$l_1$ = join-to-joint length of first link (m)
$l_2$ = joint-to-joint length of second link (m)

$l_3$=length of third link with end-effector, measured from wrist joint to reference point on end-effector (m)
R=radial position of end-effector (m)
$R_2$=radial coordinate of wrist joint (m)
T=angular position of end-effector (rad)
$T_2$=angular coordinate of wrist joint (rad)
$x_2$=x-coordinate of wrist joint (m)
$x_3$=x-coordinate of end-effector (m)
$y_2$=y-coordinate of wrist joint (m)
$y_3$=y-coordinate of end-effector (m)
$\theta_1$=angular position of drive shaft coupled to first link (rad)
$\theta_2$=angular position of drive shaft coupled to second link (rad).

The above exemplary kinematic equations may be used to design a suitable drive, for example, a band drive that constraints the orientation of the third link 24 so that the end-effector 24 points radially 30 regardless of the position of the first two links 16, 20 of the arm 14.

Referring to FIG. 4, there is shown a plot 120 of the transmission ratio $r_{31}$ 122 of the band drive that constrains the orientation of the third link as a function of normalized extension of the arm measured from the center of the robot to the root of the end-effector, i.e., $(R-l_3)/l_1$. The transmission ratio $r_{31}$ is defined as a ratio of the angular velocity of the pulley attached to the third link, $\omega_{32}$, over the angular velocity of the pulley attached to the first link, $\omega_{12}$, both defined relative to the second link. The figure graphs the transmission ratio $r_{31}$ for different $l_2/l_1$ (from 0.5 to 1.0 with increment of 0.1, and from 1.0 to 2.0 with increment of 0.2). The profile of the non-circular pulley(s) may be calculated to achieve the transmission ratio $r_{31}$ in accordance with FIG. 4, for example, the profile depicted in FIGS. 2A, 54A and 54B.

In the disclosed embodiment, a longer reach may be obtained compared to an equal-link arm with the same containment volume with the use of one or more with non-circular pulley(s) or other suitable device to constrain the end effector motion. In alternate aspects, the first link may be driven by a motor either directly or via any kind of coupling or transmission arrangement. Here, any suitable transmission ratio can be used. Alternately, the band drive that actuates the second link may be substituted by any other arrangement with an equivalent functionality, such as a belt drive, cable drive, gear drive, linkage-based mechanism or any combination of the above. Similarly, the band drive that constrains the third link may be substituted by any other suitable arrangement, such as a belt drive, cable drive, non-circular gears, linkage-based mechanism or any combination of the above. Here, the end-effector may but does not need to point radially. For example, the end effector may be positioned with respect to the third link with any suitable offset and point in any suitable direction. Further, in alternate aspects, the third link may carry more than one end-effector or substrate. Any suitable number of end-effectors and/or material holders can be carried by the third link. Further, in alternate aspects, the joint-to-joint length of the forearm can be smaller than the joint-to-joint length of the upper arm, for example, as seen represented by $l_2/l_1<1$ in FIG. 4 and as seen and described with respect to FIGS. 25-34 and 43-53.

Figure 6B:
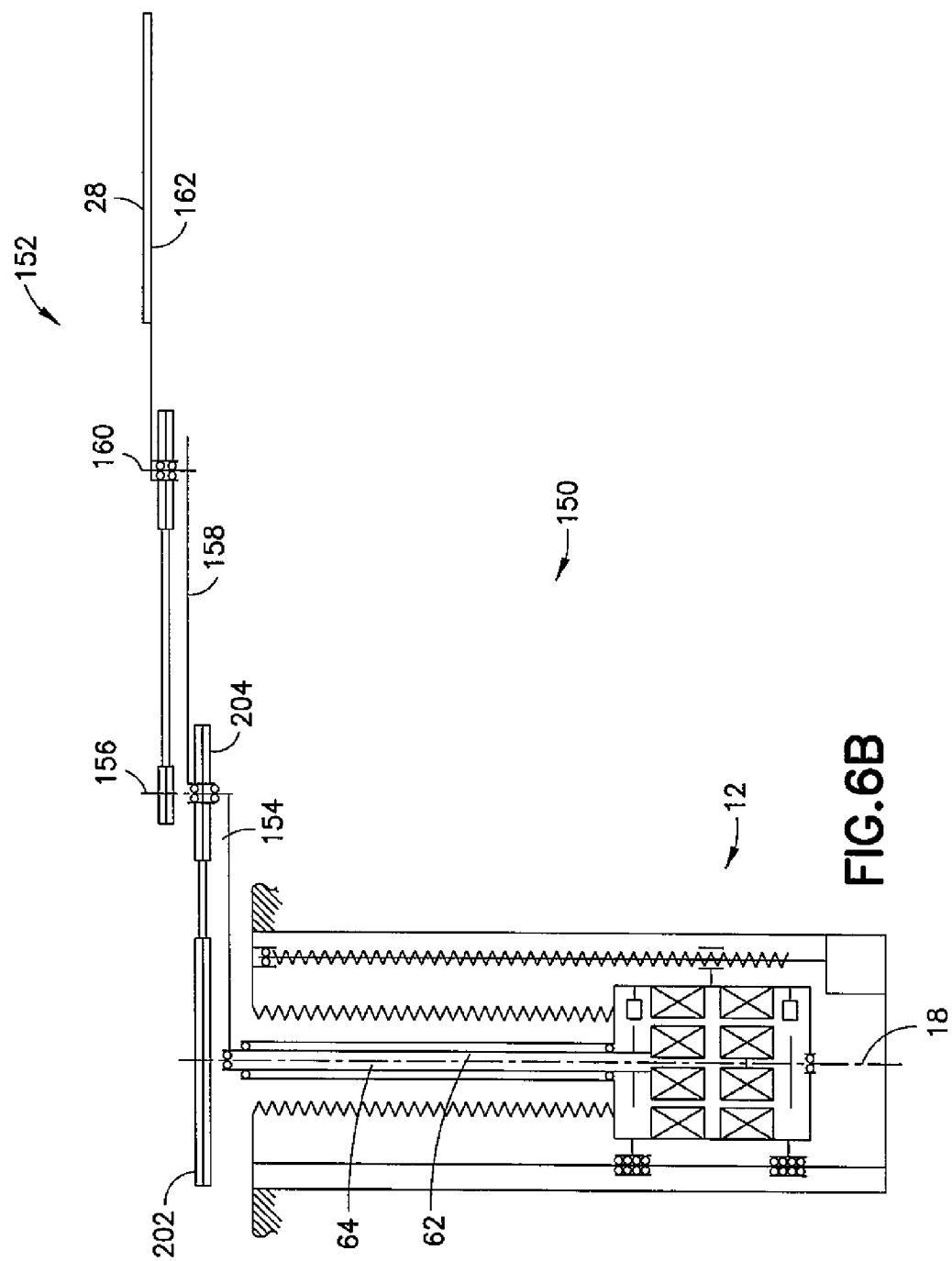
FIG. 6B is a side section partial schematic view of a transport apparatus.
Figure 8:
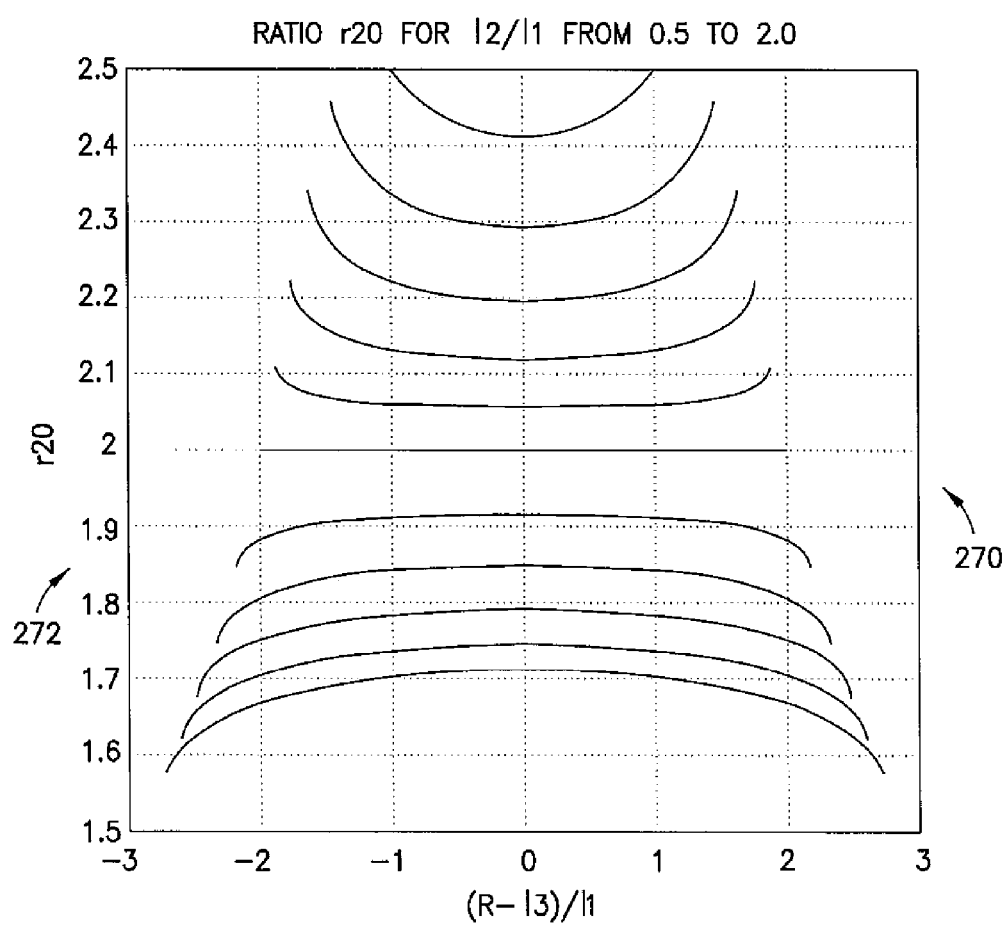
FIG. 8 is a graphical plot.

Referring now to FIGS. 5A and 5B, there are shown top and side views respectively of robot 150 incorporating some features of robot 10. Robot 150 is shown having drive 12 with arm 152 shown in a retracted position. Arm 152 has features similar to that of arm 14 except as described herein. By way of example, the joint-to-joint length of the forearm or second link 158 is larger than the joint-to-joint length of the upper arm or first link 154. Similarly, the lateral offset 168 of the end-effector or third link 162 corresponds to the difference of the joint-to-joint lengths of the forearm 158 and upper arm 154. Referring also to FIGS. 6A and 6B, there is shown drive 150 with the internal arrangements used to drive the individual links of the arm. In the embodiment shown, upper arm 154 is driven by one motor through shaft 64 as described with respect to arm 14 of FIGS. 1 and 2. Similarly, end effector or third link 162 is constrained with respect upper arm 154 by a non-circular pulley arrangement as described with respect to arm 14 of FIGS. 1 and 2. The exemplary difference between arm 152 and arm 14 is seen where forearm 158 is coupled via a band arrangement with at least one non-circular pulley to shaft 62 and another motor of drive 12. Here, the coupling or band arrangement may have features as described herein or as described with respect to pulley drive 88, 90 of FIGS. 1 and 2. The coupling or band arrangement has non circular pulley 202 coupled to shaft 62 of drive 12 and is rotateable about axis 18 with shaft 62. The band arrangement of arm 152 further has circular pulley 204 coupled to upper arm link 158 and rotatable about elbow axis 156. Circular pulley 204 is coupled to non-circular pulley 202 via bands 206, 208 where bands 206, 208 may be kept tight by virtue of the profile of non-circular pulley 202. In alternate aspects, any combination of pulleys or other suitable transmission may be provided. Pulleys 202 and 204 and bands 206, 208 cooperate such that rotation of upper arm 154 relative to pulley 202 (for example, holding pulley 202 stationary while rotating upper arm 154) causes wrist joint 160 to extend and retract along a straight line parallel to the desired radial path 180 of the end-effector and offset 168 from the path 180. Here, third link 162 with the end-effector is constrained by a band drive as described with respect to arm 14, for example, with at least one non-circular pulley so that the end-effector points radially 180 regardless of the position of the first two links 154, 158. Here, any suitable coupling may be provided to constrain the links of arm 14 as described, for example, one or more suitable variable ratio drive or coupling, linkage gears or sprockets, cams or otherwise used alone or in combination with a suitable linkage or other coupling. In the embodiment shown, elbow pulley 204 is coupled to fore arm 158 and is shown round or circular where shoulder pulley 202 coupled to shaft 62 is shown non circular. The shaft pulley shape is non-circular and may have symmetry about a line 218 perpendicular to the radial trajectory 180 which also may coincide with or be parallel to the line between the two pulleys 202, 204 when the forearm 158 and upper arm 154 are lined up over each other with the wrist axis 160 closest to shoulder axis 18, for example as seen in FIG. 7B. The shape of pulley 202 is such that bands 206, 208 stay tight as arm 152 extends and retracts establishing points of tangency 210, 212 on opposing sides of pulley 202 having changing radial distances 214, 216 from the shoulder axis of rotation 18. For example, at the orientation shown in FIG. 7B, each of the points of tangency 210, 212 of the two bands on the pulley is at an equal radial distance 214, 216 from the shoulder axis of rotation 18. This will be further described with respect to FIG. 8 showing respective ratios. In order for arm 152 to rotate, both drive shafts 62, 64 of the robot need to move in the direction of rotation of the arm by the same amount. In order for the end-effector 162 to extend and retract radially along a straight-line path, the two drive shafts 62, 64 need to move in a coordinated manner, for example, in accordance with the exemplary inverse kinematic equations presented later in this section, for example, the drive shaft coupled to the upper arm needs to move according to the inverse kinematic equations presented below while the other motor is kept stationary. FIGS. 7A, 7B and 7C illustrate extension motion of robot 150 of FIGS. 5 and 6. FIG. 7A shows the top view of the robot with the arm 152 in its retracted position. FIG. 7B depicts the arm partially extended with the forearm aligned on top of the upper arm, illustrating that the lateral offset 168 of the end-effector 162 that corresponds to the difference of the joint-to-joint lengths of the forearm 158 and upper arm 154. FIG. 7C shows the arm in an extended position although not full extension.

Exemplary direct kinematics may be provided. In alternate aspects, any suitable direct kinematics may be provided to correspond to alternative structure. The following exemplary equations may be used to determine the position of the end-effector as a function of the position of the motors:

$$d_1 = l_1 \sin(\theta_1 - \theta_2) \quad (2.1)$$

$$\text{If}(\theta_1 - \theta_2) < \pi/2 : \theta_{21} = \theta_2 - l_2 a \sin((d_1 + d_3)/l_2), \text{ else}$$
$$\theta_{21} = \theta_2 + l_2 a \sin((d_1 + d_3)/l_2) + \pi \quad (2.2)$$

$$x_2 = l_1 \cos \theta_1 + l_2 \cos \theta_{21} \quad (2.3)$$

$$y_2 = l_1 \sin \theta_1 + l_2 \sin \theta_{21} \quad (2.4)$$

$$R_2 = \operatorname{sqrt}(x_2^2 + y_2^2) \quad (2.5)$$

$$T_2 = a \tan 2(y_2, x_2) \quad (2.6)$$

$$\text{If}(\theta_1 - \theta_2) < \pi/2 : R = \operatorname{sqrt}(R_2^2 - d_3^2) + l_3, T = \theta_2, \text{else} R = \operatorname{sqrt}(R_2^2 - d_3^2) + l_3, \ T = \theta_2 \quad (2.7)$$

Exemplary inverse kinematics may be provided. In alternate aspects, any suitable inverse kinematics may be provided to correspond to alternative structure. The following exemplary equations may be utilized to determine the position of the motors to achieve a specified position of the end-effector:

$$x_3 = R \cos T \quad (2.8)$$

$$y_3 = R \sin T \quad (2.9)$$

$$x_2 = x_3 - l_3 \cos T + d_3 \sin T \quad (2.10)$$

$$y_2 = y_3 - l_3 \sin T - d_3 \cos T \quad (2.11)$$

$$R_2 = \operatorname{sqrt}(x_2^2 + y_2^2) \quad (2.12)$$

$$T_2 = a \tan 2(y_2, x_2) \quad (2.13)$$

$$\alpha_1 = a \cos((R_2^2 + l_1^2 - l_2^2)/(2R_2 l_1)) \quad (2.14)$$

$$\text{If } R > l_3 : \theta_1 = T_2 + \alpha_1, \theta_2 = T, \text{ else: } \theta_1 = T_2 - \alpha_1, \theta_2 = T \quad (2.15)$$

The following nomenclature is used in the kinematic equations:

$d_3$=lateral offset of end-effector (m)
$l_1$=join-to-joint length of first link (m)
$l_2$=joint-to-joint length of second link (m)
$l_3$=length of third link with end-effector, measured from wrist joint to reference point on end-effector (m)
R=radial position of end-effector (m)
$R_2$=radial coordinate of wrist joint (m)
T=angular position of end-effector (rad)
$T_2$=angular coordinate of wrist joint (rad)
$x_2$=x-coordinate of wrist joint (m)
$x_3$=x-coordinate of end-effector (m)
$y_2$=y-coordinate of wrist joint (m)
$y_3$=y-coordinate of end-effector (m)
$\theta_1$=angular position of drive shaft coupled to first link (rad)
$\theta_2$=angular position of drive shaft coupled to second link (rad).

The above kinematic equations may be used to design the band drive that controls the second link 158 so that rotation of the upper arm 154 causes the wrist joint 160 to extend and retract along a straight line parallel to the desired radial path 180 of the end-effector 162.

Referring now to FIG. 8, there is shown a graph 270 that shows the transmission ratio $r_{20}$ 272 of the band drive that drives the second link as a function of normalized extension of the arm measured from the center of the robot to the root of the end-effector, i.e., $(R-l_3)/l_1$. The transmission ratio $r_{20}$ is defined as a ratio of the angular velocity of the pulley attached to the second link, $\omega_{21}$, over the angular velocity of the pulley attached to the second motor, $\omega_{01}$, both defined relative to the first link. The figure graphs the transmission ratio $r_{20}$ for different $l_2/l_1$.

The profile of the non-circular pulley(s) for the band drive that drives the second link is calculated to achieve the transmission ratio $r_{20}$ 272 in accordance with FIG. 8. An example pulley profile is depicted in FIG. 6A and as will be described with respect to FIGS. 55A and 55B.

The transmission ratio $r_{31}$ of the band drive that constraints the orientation of the third link 168 may be the same as depicted in FIG. 4 for the embodiment of FIGS. 1 and 2. The transmission ratio $r_{31}$ is defined as a ratio of the angular velocity of the pulley attached to the third link, $\omega_{32}$, over the angular velocity of the pulley attached to the first link, $\omega_{12}$, both defined relative to the second link. The figure graphs the transmission ratio $r_{31}$ for different $l_2/l_1$ (from 0.5 to 1.0 with increment of 0.1, and from 1.0 to 2.0 with increment of 0.2). The profile of the non-circular pulley(s) for the band drive that constrains the third link 162 may be calculated to achieve the transmission ratio $r_{31}$ in accordance with FIG. 4. An example pulley profile is depicted in FIG. 6A.

Figure 9:
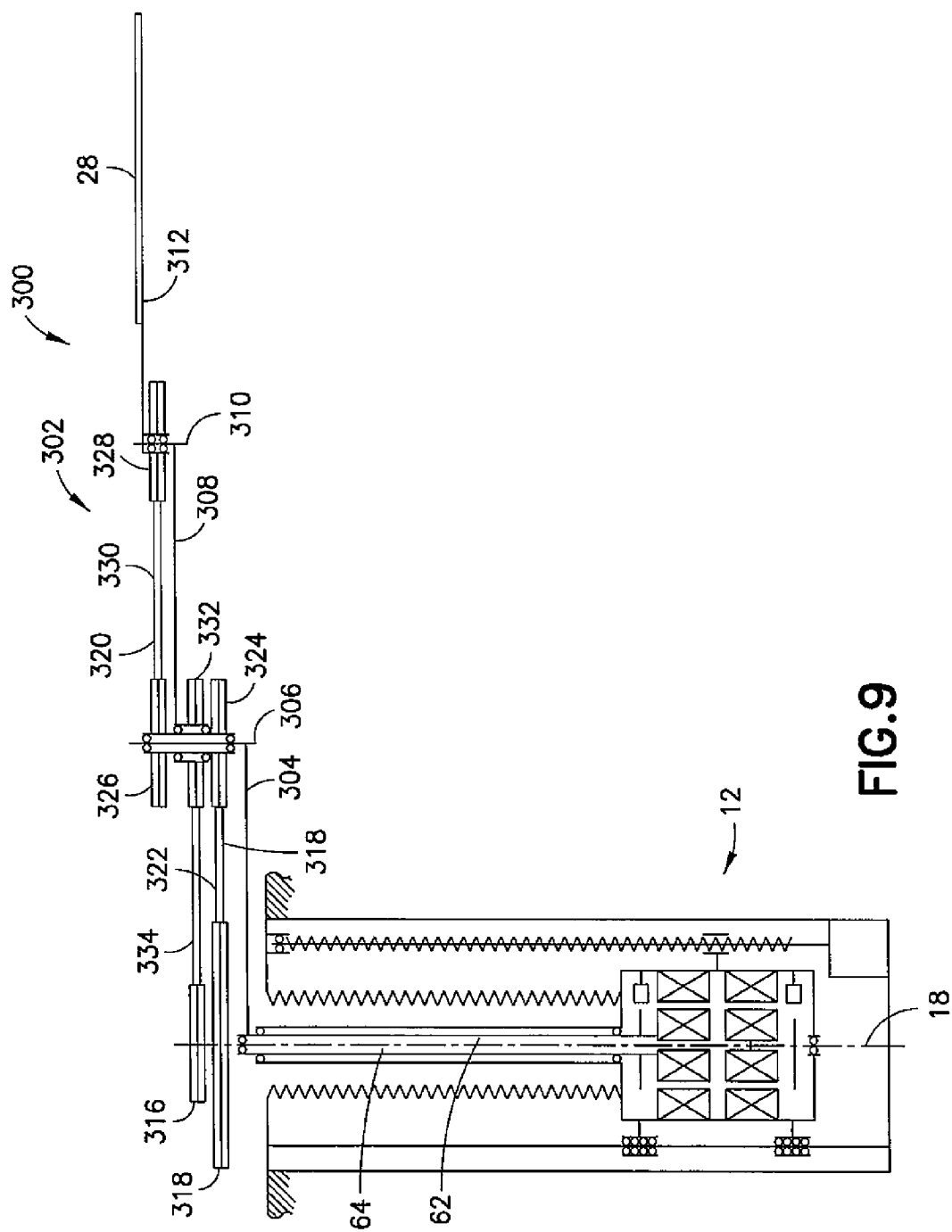
FIG. 9 is a side section partial schematic view of a transport apparatus.

In the embodiment shown, a longer reach may be obtained as compared to an equal-link arm with the same containment volume while using non-circular pulleys or other suitable mechanism to constrain the end effector as described. As compared to the embodiment disclosed in FIGS. 1 and 2, one more band drive with non-circular pulleys may be in place of conventional one at shoulder axis 18. In alternate aspects, the first link may be driven by a motor either directly or via any kind of coupling or transmission arrangement, for example, any suitable transmission ratio may be used. Alternately, the band drives that actuate the second link and constrain the third link may be substituted by any other arrangement with an equivalent functionality, such as a belt drive, cable drive, non-circular gears, linkage-based mechanism or any combination of the above. Further, the third link may be constrained to keep the end-effector radial via a conventional two stage band arrangement that synchronizes the third link to the pulley driven by the second motor, as illustrated in FIG. 9. Alternatively, the two stage band arrangement may be substituted by any other suitable arrangement, such as a belt drive, cable drive, gear drive, linkage-based mechanism or any combination of the above. In addition, the end-effector may but does not need to point radially. For example, the end effector may be positioned with respect to the third link with any suitable offset and point in any suitable direction. In alternate aspects, the third link may carry more than one end-effector or substrate. Here, any suitable number of end-effectors and/or material holders can be carried by the third link. Further, the joint-to-joint length of the forearm may be smaller than the joint-to-joint length of the upper arm, for example, as represented by $l_2/l_1<1$ in FIG. 8.

Referring now to FIG. 9, there is shown an alternative robot 300 where the third link may be constrained to keep the end-effector radial via a conventional two stage band arrangement that synchronizes the third link to the pulley driven by the second motor. Robot 300 is shown having drive 12 and arm 302. Arm 302 may have upper arm or first link 304 coupled to shaft 64 and rotatable about central or shoulder axis 18. Arm 302 has forearm or second link 308 rotateably coupled to upper arm 304 at elbow axis 306. Links 304, 308 may have unequal lengths as previously described. Third link or end effector 312 is rotatably coupled to the second link or forearm 308 at wrist axis 310 where end effector 312 may transport a substrate 28 along a radial path without rotation with links 304, 308 having unequal link lengths as previously described. In the embodiment shown, shaft 62 is coupled to two pulleys, 314, 316 where pulley 314 may be circular and where pulley 316 may be non-circular. Here, circular pulley 314 constrains the third link 312 to keep the end-effector 312 radial via a conventional two stage 318, 320 circular band arrangement that synchronizes the third link 312 to the pulley driven by shaft 314. The two stage arrangement 318, 320 has pulley 314 coupled by bands 322 to elbow pulley 324 that is coupled to elbow pulley 326 where elbow pulley 326 is coupled to wrist pulley 328 via bands 330. Forearm 308 may further have elbow pulley 332 that may be circular and coupled to shoulder pulley 316 through bands 334 where shoulder pulley may be non-circular and coupled to pulley 314 and shaft 62.

The disclosed embodiment may be further embodied with respect to robots having robot drives with additional axis and where the arms coupled to the robot drive may have independently operable additional end effectors capable of carrying one or more substrates. By way of example, arms with two independently operable arms linkages or "dual arm" configurations may be provided where each independently operable arm may have an end effector adapted to support one, two or any suitable number of substrates. Here and as will be described below, each independently operable arm may have first and second links having different link lengths and where the end effector and supported substrate coupled to the links operate and track as described above. Here, a substrate transport apparatus may transport first and second substrates and having first and second independently moveable arm assemblies coupled to a drive section on a common axis of rotation. First and second substrate supports are coupled to the first and second arm assemblies respectively on first and second wrist axis of rotation. One or both of the first and second arm assemblies rotate about the common axis of rotation during extension and retraction. The first and second wrist axis of rotation move along first and second wrist paths parallel to and offset from a radial path relative to the common axis of rotation during extension and retraction. The first and second substrate supports move parallel to the radial path during extension and retraction without rotation. Variations on the disclosed embodiment having multiple and independently operable arms are provided below where in alternate aspects any suitable combination of features may be provided.

Figure 12:
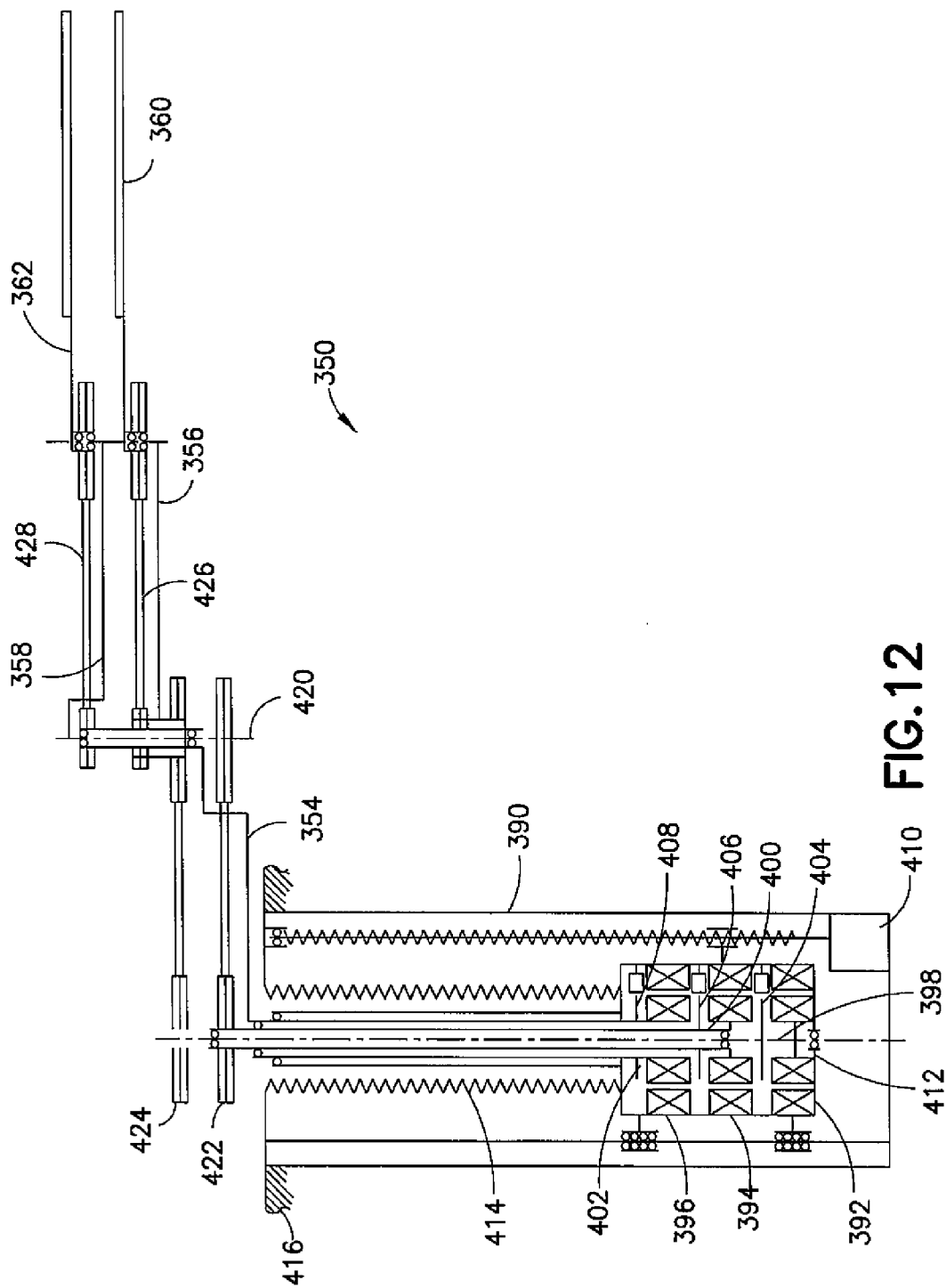
FIG. 12 is a side section partial schematic view of a transport apparatus.
Figure 13:
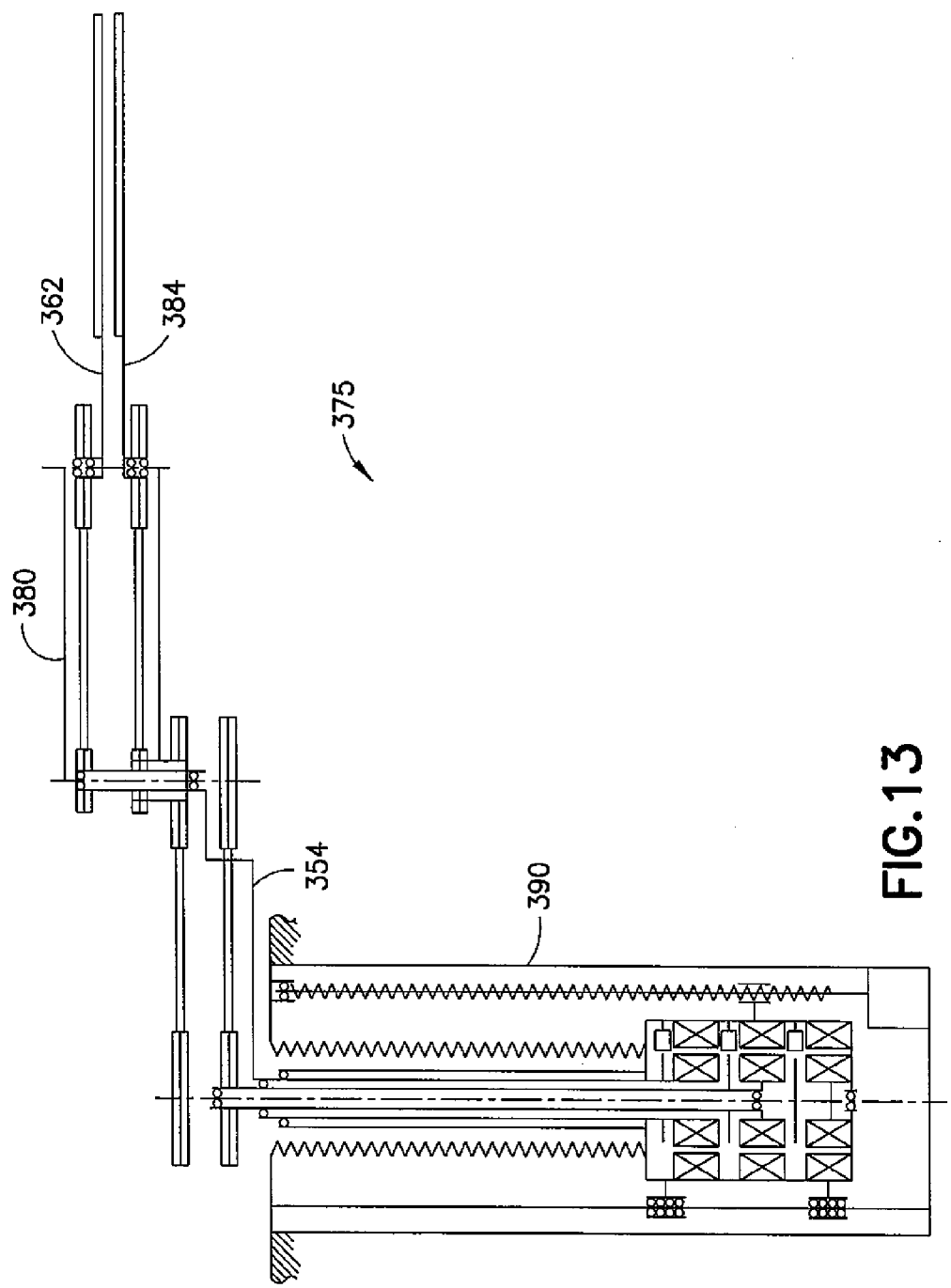
FIG. 13 is a side section partial schematic view of a transport apparatus.

Referring now to FIGS. 10A and 10B, there are shown top and side views respectively of robot 350 with a dual arm arrangement. Robot 350 has arm 352 having a common upper arm 354 and independently operable forearms 356, 358 each having respective end effectors 360, 362. In the embodiment shown, both linkages are shown in their retracted positions. The lateral offset of the end-effectors 366 corresponds to the difference of the joint-to-joint lengths of the forearm 354 and upper arms 356, 358. In the embodiment shown, the upper arms may have the same length and being longer than the forearm. Further, end effectors 360, 362 are positioned above forearms 356, 358. Referring now to FIGS. 11A and 11B show top and side views respectively of a robot 375 with the arm in an alternative configuration. In the embodiment shown, arm 377 may have features as described with respect to FIGS. 10A and 10B with both linkages are shown in their retracted positions. In this configuration, the third link with the end-effector 382 of the upper linkage is suspended underneath the forearm 380 to reduce vertical spacing between the two end-effectors 382, 384. Here, a similar effect may be achieved by stepping 368 the top end-effector 360 of the configuration of FIGS. 10A and 10B down. Referring also to FIGS. 12 and 13 there is shown the internal arrangements of robots 350, 375 respectively used to drive the individual links of the arms of FIGS. 10 and 11, respectively. In the embodiment shown, drive 390 may have first second and third driving motors 392, 394, 396 that may be rotor stator arrangements driving concentric shafts 398, 400, 402 respectively and having position encoders 404, 406, 408 respectively. Z drive 410 may drive the motors in a vertical direction where the motors may be contained partially or completely within housing 412 and where bellows 414 seals an internal volume of housing 412 to chamber 416 and where the internal volume and an interior of chamber 416 may operate within an isolated environment such as vacuum or otherwise. In the embodiment shown, the common upper arm 354 is driven by one motor 396. Each of the two forearms 356, 358 pivot on a common axis 420 at the elbow of upper arm 354 and are driven independently by motors 394, 396 respectively through band drives 422, 424 respectively that may have conventional pulleys. The third links with the end-effectors 360, 362 are constrained by band drives 426, 428 respectively, each with at least one non-circular pulley, which compensate for the effects of the unequal lengths of the upper arms and forearms. Here, the band drives in each of the linkages may be designed using the methodology described for FIGS. 1 and 2 and where the kinematic equations presented for FIGS. 1 and 2 may also be used for each of the two linkages of the dual arm. In order for the arm to rotate, all three drive shafts 398, 400, 402 of the robot need to move in the direction of rotation of the arm by the same amount. In order for one of the end-effectors to extend and retract radially along a straight-line path, the drive shaft of the common upper arm and the driveshaft coupled to the forearm associated with the active end effector need to move in a coordinated manner in accordance with the inverse kinematic equations for FIGS. 1 and 2. At the same time, the driveshaft coupled to the other forearm needs to rotate in synch with the drive shaft of the common upper arm in order for the inactive end-effector to remain retracted. Referring also to FIGS. 14A, 14B and 14C there is shown the arm of FIGS. 11A and 11B as the upper and lower linkages extend. Here, the inactive linkage 356, 360 rotates while the active linkage 358, 362 extends. By way of example, the upper linkage 358, 362 rotates as the lower linkage 356, 360 extends, and the lower linkage 356, 360 rotates as the upper linkage 358, 362 extends. In the disclosed embodiment of FIGS. 10 and 11, set up and control may be simplified where the arm arrangement may be used on a coaxial drive with no dynamic seals while providing a longer reach compared to equal-link length arms with the same containment volume. Here, no bridge is used to support any of the end-effectors.

In the embodiment shown, the inactive arm rotates while the active one extends. One of the wrist joints travels above the lower end-effector (closer to wafer than in an equal-link arrangement).

Figure 15A:
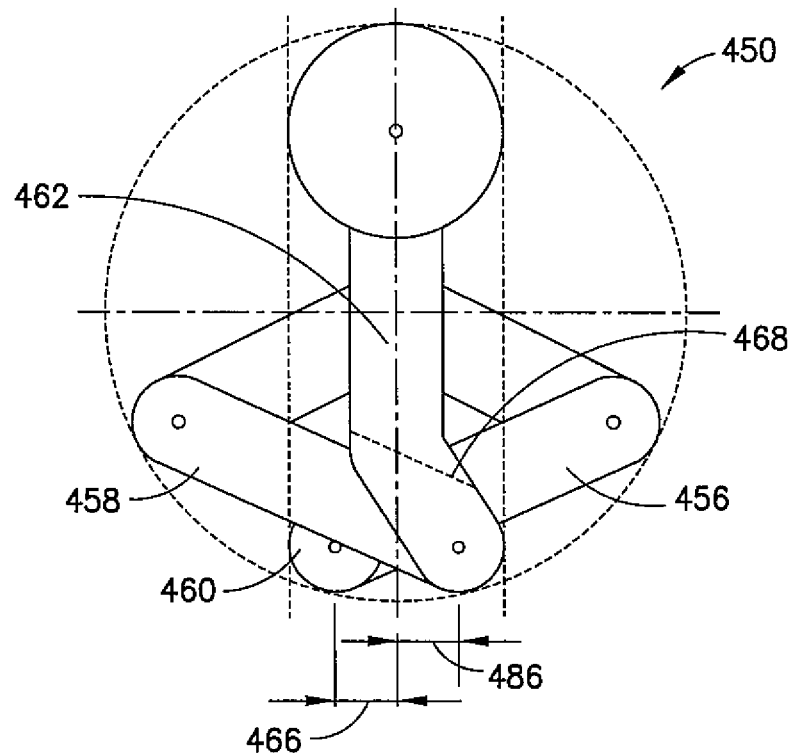
FIG. 15A is a top view of a transport apparatus.
Figure 15B:
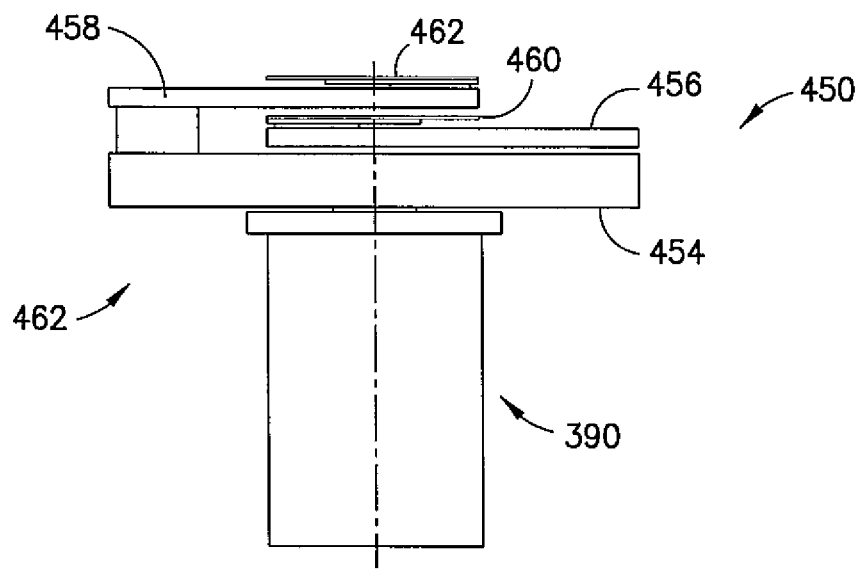
FIG. 15B is a side view of a transport apparatus.
Figure 20C:
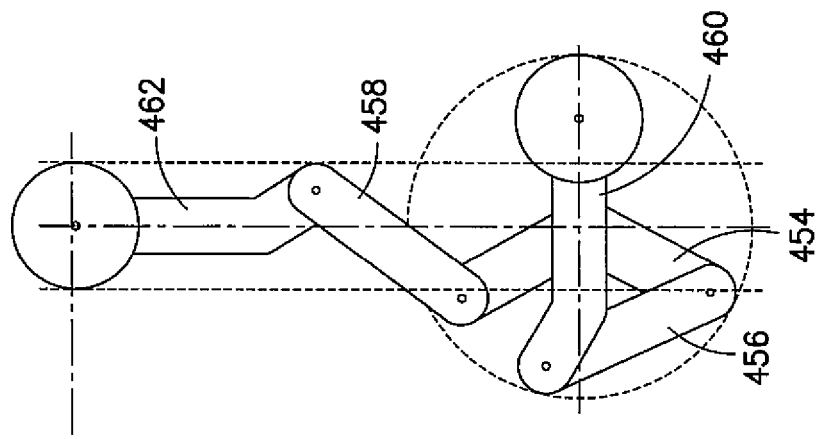
FIG. 20C is a top view of a transport apparatus.
Figure 20B:
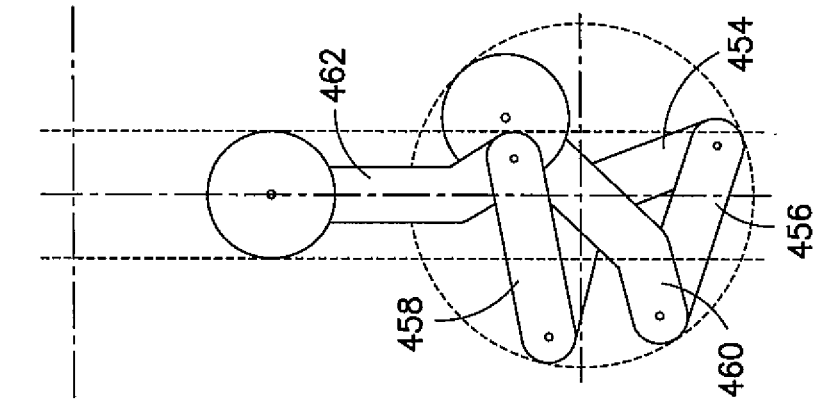
FIG. 20B is a top view of a transport apparatus.
Figure 20A:
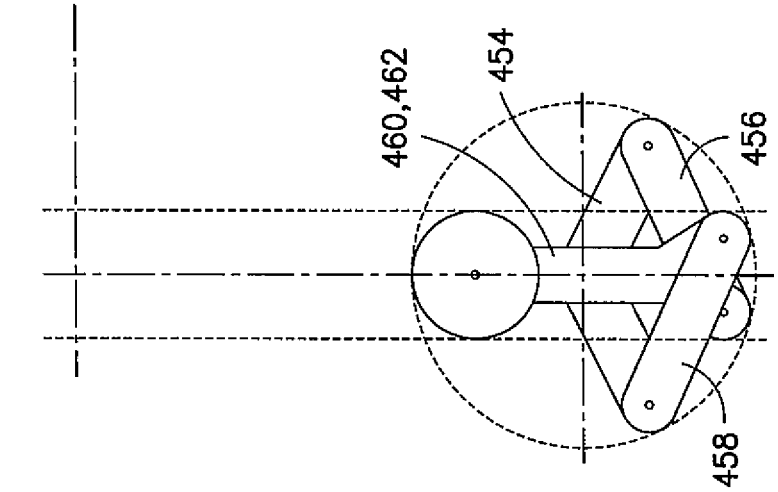
FIG. 20A is a top view of a transport apparatus.

Referring now to FIGS. 15A and 15B, there are shown top and side views respectively of robot 450 with a dual arm arrangement. Robot 450 has arm 452 having a common upper arm 454 and independently operable forearms 456, 458 each having respective end effectors 460, 462. In the embodiment shown, both linkages are shown in their retracted positions. The lateral offset of the end-effectors 466 corresponds to the difference of the joint-to-joint lengths of the forearm 454 and upper arms 456, 458. In the embodiment shown, the upper arms may have the same length and being longer than the forearm. Further, end effectors 460, 462 are positioned above forearms 456, 458. Referring also to FIGS. 16A and 16B show the top and side views of the robot 475 with the arm in an alternative configuration. Again, both linkages are shown in their retracted positions. In this configuration, the third link and the end-effector 482 of the left linkage is suspended underneath the forearm 480 to reduce vertical spacing between the two end-effectors 482, 484. A similar effect can be achieved by stepping 468 the top end-effector of the configuration of FIGS. 15A and 15B down. Alternatively, a bridge can be used to support one of the end-effectors. The combined upper arm link 454 may be a single piece as depicted in FIGS. 15 and 16 or it can be formed by two or more sections 470, 472, as shown in the example of FIGS. 17A and 17B. Here, a two-section design may be provided as lighter and using less material, with the left 472 and right 470 sections may be identical components. Here, a two piece design may also have provisions for adjustment of the angular offset between the left and right sections, which may be convenient when different retracted positions need to be supported. Referring also to FIGS. 18 and 19, there is shown the internal arrangements used to drive the individual links of the arm of FIGS. 15 and 16, respectively. The combined upper arm 554 is shown driven by one motor with shaft 402. Each of the two forearms 456, 458 is driven independently by one motor each via shafts 400, 398 respectively through band drives 490, 492 with conventional pulleys. Here, links 456, 458 rotate on separate axis' 494, 496 respectively. The third links with the end-effectors 460, 462 are constrained by band drives 498, 500 respectively, each with at least one non-circular pulley, which compensate for the effects of the unequal lengths of the upper arms and forearms. Here, band drives 498, 500 in each of the linkages 456, 460 and 458, 462 are designed using the methodology described for FIGS. 1 and 2. Here, the kinematic equations presented for FIGS. 1 and 2 may also be used for each of the two linkages 456, 460 and 458, 462 of the dual arm. In order for the arm 452 to rotate, all three drive shafts 398, 400, 402 of the robot need to move in the direction of rotation of the arm by the same amount. In order for one of the end-effectors to extend and retract radially along a straight-line path, the drive shaft of the common upper arm and the driveshaft coupled to the forearm associated with the active end effector need to move in a coordinated manner in accordance with the inverse kinematic equations presented with respect to FIGS. 1 and 2. At the same time, the driveshaft coupled to the other forearm needs to rotate in synch with the drive shaft of the common upper arm in order for the inactive end-effector to remain retracted. Referring also to FIGS. 20A, 20B and 20C, there is shown the arm of FIGS. 16A and 16B as the left 458, 462 and right 456, 460 linkages extend. Note that the inactive linkage 456, 460 rotates while the active linkage 458, 462 extends. Here, the right linkage 456, 460 rotates as the left linkage 458, 462 extends, and the left linkage 458, 462 rotates as the right linkage 456, 460 extends. The embodiment shown leverages the benefits of a solid link design being easy to set up and control and the coaxial drive, for example, with no dynamic seals while providing a longer reach compared to equal-link arms with the same containment volume. Here, no bridge is used to support any of the end-effectors. Here, the inactive arm rotates while the active one extends. One of the wrist joints travels above the lower end-effector, closer to the wafer than in an equal-link arrangement. This can be avoided by using a bridge (not shown) to support the top end-effector. In this case, the unsupported length of the bridge may be longer compared to an equal-link arm design. Further, the retract angle may be more difficult to change compared to the configuration with common elbow joint, for example, as seen in FIGS. 10 and 11 and independent dual arm, for example, as seen in FIGS. 21 and 22.

Figure 23:
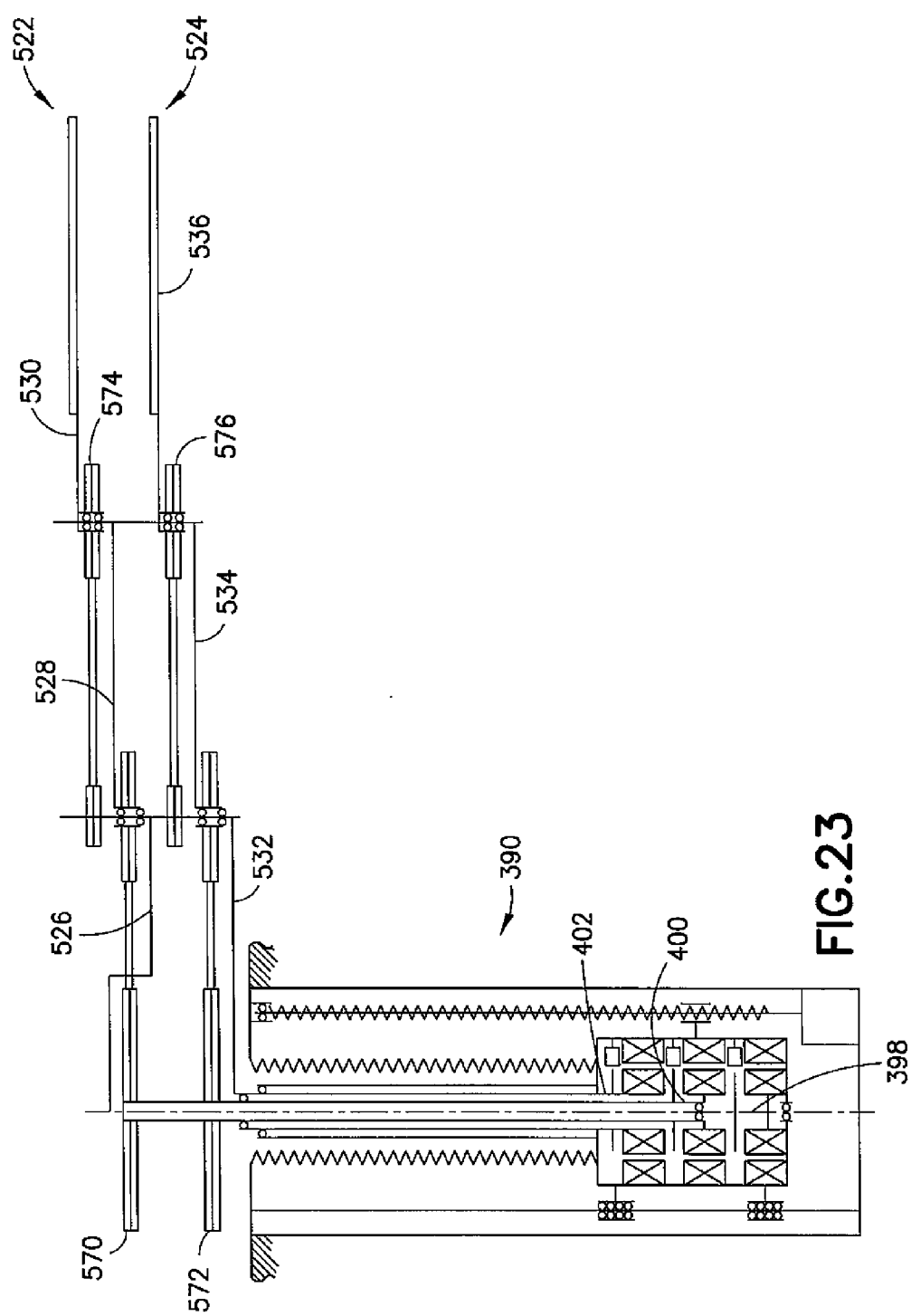
FIG. 23 is a side section partial schematic view of a transport apparatus.

Referring now to FIGS. 21A and 21B, there is shown top and side views respectively of robot 520 with independent dual arms 522, 524. In the embodiment shown, both linkages 522, 524 are shown in their retracted positions. Arm 522 has independently operable upper arm 526, forearm 528 and third link with end effector 530. Arm 524 has independently operable upper arm 532, forearm 534 and third link with end effector 536. In the embodiment shown, forearms 528, 534 are shown longer than upper arms 526, 532 where end effectors 530, 536 are positioned above forearms 528, 534 respectively. Referring also to FIGS. 22A and 22B show the top and side views of robot 550 with features similar to that of robot 520 with the arm in an alternative configuration and with both linkages shown in their retracted positions. In this configuration, the third link and the end-effector 552 of the left linkage is suspended underneath the forearm 554 to reduce vertical spacing between the two end-effectors. A similar effect can be achieved by stepping the top end-effector of the configuration of FIG. 21 down. Alternatively, a bridge can be used to support one of the end-effectors. In FIGS. 21 and 22, the right upper arm 532 is located below the left upper arm 526. Alternatively, the left upper may be located above the right upper arm, for example, where one linkage can be nested within the other. Referring also to FIG. 23, there is shown the internal arrangements used to drive the individual links of the arm of FIGS. 21A and 21B. Here, for graphical clarity, to avoid overlap of components, the elevations of the links are adjusted. Each of the two upper arms 526, 532 is driven independently by one motor each through shafts 398, 402 respectively. The forearms 528, 534 are coupled via band arrangements 570, 572, each with at least one non-circular pulley, to a third motor via shaft 400. The third links 530, 536 with the end-effectors are constrained by band drives 574, 576, each with at least one non-circular pulley. The band drives are designed so that rotation of one of the upper arms 526, 532 causes the corresponding linkage 528, 530 and 534, 536 respectively to extend and retract along a straight line while the other linkage remains stationary. The band drives in each of the linkages may be designed using the methodology described with respect to FIGS. 5 and 6 where the kinematic equations presented for FIGS. 5 and 6 can also be used for each of the two linkages of the dual arm. In order for the arm to rotate, all three drive shafts 398, 400, 402 of the robot need to move in the direction of rotation of the arm by the same amount. In order for one of the end-effectors to extend and retract radially along a straight-line path, the drive shaft of the upper arm associated with the active end-effector needs to be rotated according to the inverse kinematic equations for FIGS. 5 and 6 and the other two drive shafts need to be kept stationary. Referring also to FIGS. 24A, 24B and 24C, there is shown the arm of FIG. 22 as the left 522 and right 524 linkages extend. Note that the inactive linkage 524 remains stationary while the active linkage 522 extends. That is, the left linkage 522 does not move while the right linkage 524 extends, and the right linkage 524 does not move when the left linkage 522 extends. The embodiment shown provides a longer reach compared to equal-link arm design with the same containment volume. Here, no bridge is used to support any of the end-effectors and the inactive linkage remains stationary while the active one extends potentially leading to higher throughput as active linkage may extend or retract faster with no load. The embodiment shown may be more complex than shown in FIGS. 15 and 16 with two more band drives with non-circular pulleys in place of conventional ones. One of the wrist joints travels above the lower end-effector as seen in FIG. 24. This can be avoided by using a bridge (not shown) to support the top end-effector. In this case, the unsupported length of the bridge is longer compared to an equal-link arm design.

Figure 25A:
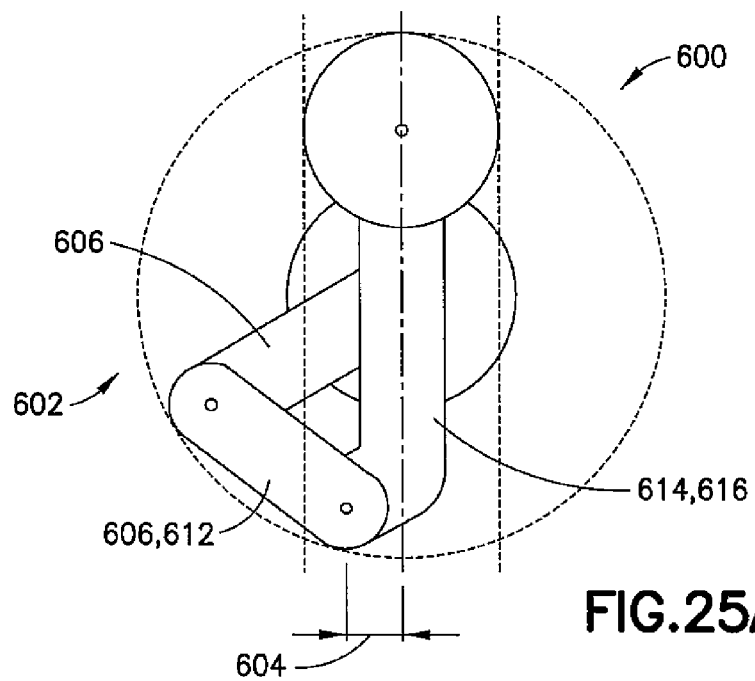
FIG. 25A is a top view of a transport apparatus.
Figure 25B:
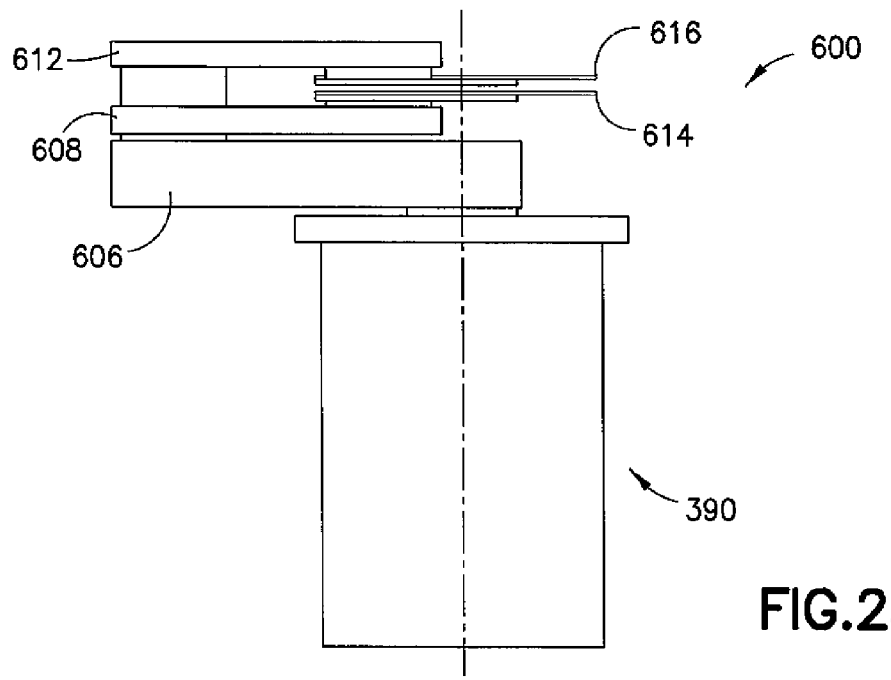
FIG. 25B is a side view of a transport apparatus.

Referring now to FIGS. 25A and 25B, there are shown top and side views respectively of robot 600 with arm 602. In the embodiment shown, both linkages are shown in their retracted positions. The lateral offset of the end-effectors 604 corresponds to the difference of the joint-to-joint lengths of the upper arm 606 and forearms 608, 612 where in this embodiment, forearms 608, 612 are shorter than the common upper arm 606. The internal arrangements used to drive the individual links of the arm may be similar to FIGS. 10-13, for example as in FIG. 13 however the forearms in this instance are shorter than the common upper arm. Here, the common upper arm is driven by one motor. Each of the two forearms is driven independently by one motor through a band drive with conventional pulleys. The third links 614, 616 with the end-effectors are constrained by band drives, each with at least one non-circular pulley, which compensate for the effects of the unequal lengths of the upper arms and forearms. The band drives in each of the linkages may be designed using the methodology described for FIGS. 1 and 2. The kinematic equations presented for FIGS. 1 and 2 may also be used for each of the two linkages of the dual arm. Referring also to FIGS. 26A, 26B and 26C, there is shown the arm of FIGS. 25A and 25B as the upper linkage 612, 616 extends. The lateral offset 604 of the end-effector corresponds to the difference of the joint-to-joint lengths of the upper arm and forearm, and the wrist joint travels along a straight line offset with respect to the trajectory of the center of the wafer by this difference. Note that the inactive linkage 608, 614 rotates while the active linkage 612, 616 extends. For instance, the upper linkage rotates as the lower linkage extends, and the lower linkage rotates as the upper linkage extends. Here, FIG. 26A depicts the arm with both linkages in the retracted positions. FIG. 26B shows the upper linkage 612, 616 partially extended in a position where the wrist joint of the upper linkage is closest to the wafer carried by the lower linkage. It is observed that the wrist joint of the upper linkage does not travel over the wafer (however, it moves in a plane above the wafer). FIG. 26C depicts farther extension of the upper linkage 612, 616. The embodiment shown may provide ease of to set up and control, and may be used on a coaxial or tri axial drive with no dynamic seals or other suitable drive. Here, no bridge may be used to support any of the end-effectors. The wrist joint of the upper linkage does not travel over the wafer on the lower end-effector, which is the case for an equal-link design (however, it moves in a plane above the wafer on the lower end-effector). Here, the inactive arm rotates while the active one extends. The elbow joint may be more complex which may translate to a larger swing radius or shorter reach. Here, the arm may be taller than that shown in FIGS. 30 and 31 and FIG. 33 due to the overlapping forearms 608, 612.

Referring now to FIGS. 27A and 27B, there is shown top and side views respectively of robot 630 with arm 632. Arm 630 may have features similar to that disclosed with respect to FIGS. 15-19 except the forearms 636, 640 are shown with shorter link length than the upper arm 636. Both linkages are shown in their retracted positions. The lateral offset 634 of the end-effectors 642, 646 corresponds to the difference of the joint-to-joint lengths of the upper arm 636 and forearms 638, 640. The combined upper arm link 636 may be a single piece as depicted in FIGS. 27A and 27B or it can be formed by two or more sections 636', 636", as shown in the example of FIGS. 28A and 28B. A two-section design may be lighter with less material and where left 636' and right 636" sections may be identical components. Allowances for adjustment of the angular offset between the left 636' and right 636" sections may be provided, for example, where different retracted positions need to be supported. The internal arrangements used to drive the individual links of the arm 632 may be similar to that in FIGS. 15-19, for example, as seen FIG. 19. The common upper arm 636 is driven by one motor. Each of the two forearms 638, 640 is driven independently by one motor through a band drive with conventional pulleys. The third links with the end-effectors 642, 646 may be constrained by band drives, each with at least one non-circular pulley, which compensate for the effects of the unequal lengths of the upper arm 636 and forearms 638, 640. The band drives in each of the linkages may be designed using the methodology described for FIGS. 1 and 2. The kinematic equations presented for FIGS. 1 and 2 may also be used for each of the two linkages of the dual arm. Referring also to FIGS. 29A, 29B and 29C, there is shown the arm of FIGS. 27A and 27B as the right, upper linkage 640, 646 extends. The lateral offset 634 of the end-effector corresponds to the difference of the joint-to-joint lengths of the upper arm and forearm, and the wrist joint travels along a straight line offset with respect to the trajectory of the center of the wafer by this difference. Here, the inactive linkage 638, 642 rotates while the active linkage 640, 646 extends. For instance, the upper linkage rotates as the lower linkage extends, and the lower linkage rotates as the upper linkage extends. In FIGS. 29A, 29B and 29C, FIG. 29A depict the arm with both linkages in the retracted positions. FIG. 29B shows the right upper linkage 640, 646 partially extended in a position where the wrist joint of the right upper linkage 640, 646 is closest to the wafer carried by the left lower linkage 638, 642. Here the wrist joint of the right upper 640, 646 linkage does not travel over the wafer however, it moves in a plane above the wafer. FIG. 29C depicts farther extension of the right upper linkage 640, 646. The embodiment shown leverages the benefits of a solid link design, ease of set up and control and the coaxial drive, for example, no dynamic seals. No bridge is used to support any of the end-effectors. The wrist joint of the upper linkage does not travel over the wafer on the lower end-effector, which is the case for an equal-link design however, it moves in a plane above the wafer on the lower end-effector. The inactive arm 638, 642 rotates while the active arm 640, 646 extends. The retract angle is more difficult to change compared to the configuration with common elbow joint, for example as seen in FIGS. 25A and 25B and independent dual arm, for example, as seen in FIGS. 33A and 33B.

Further, the arm is shown taller than FIGS. 30 and 31 and FIGS. 33A and 33B as forearm 640 is shown at a higher elevation than forearm 638.

Figure 30A:
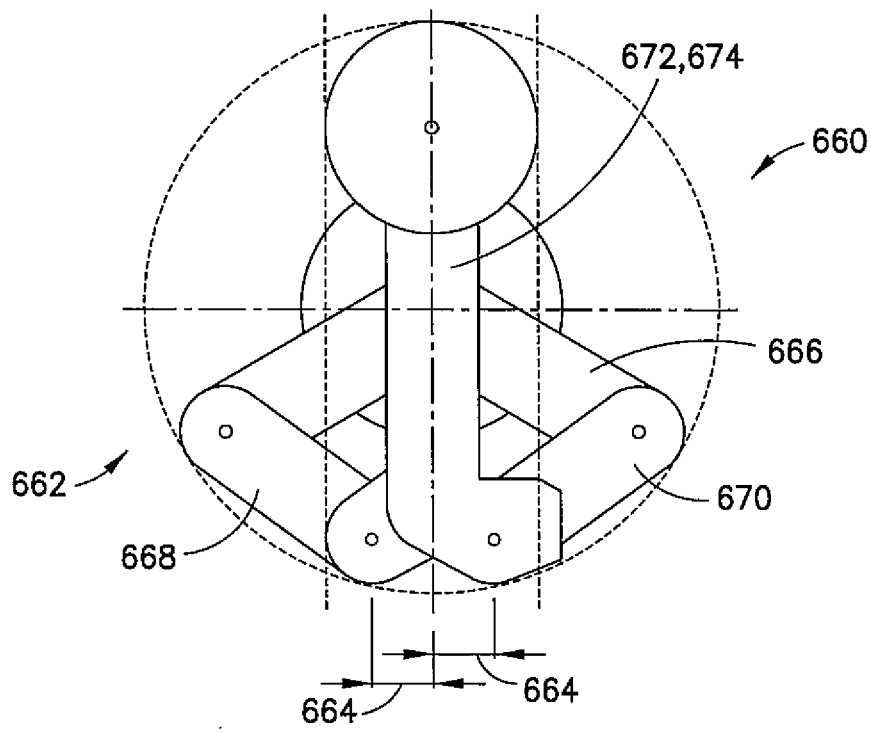
FIG. 30A is a top view of a transport apparatus.
Figure 30B:
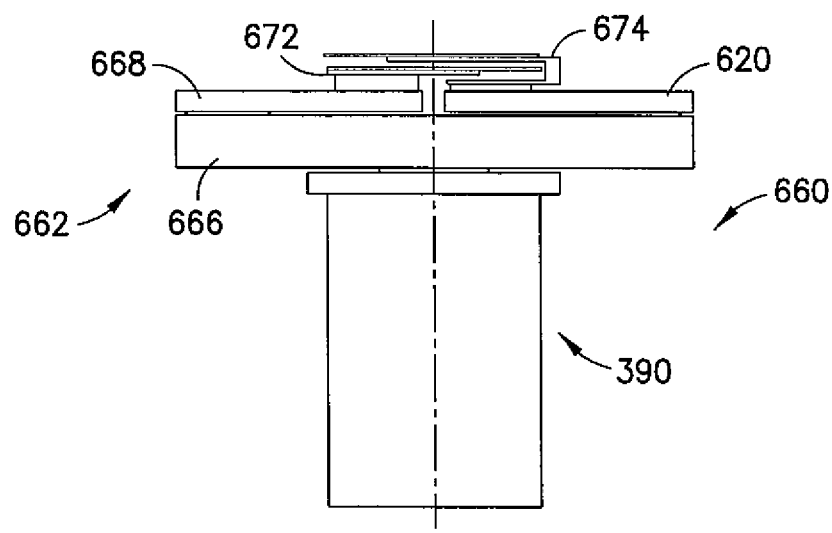
FIG. 30B is a side view of a transport apparatus.
Figure 31A:
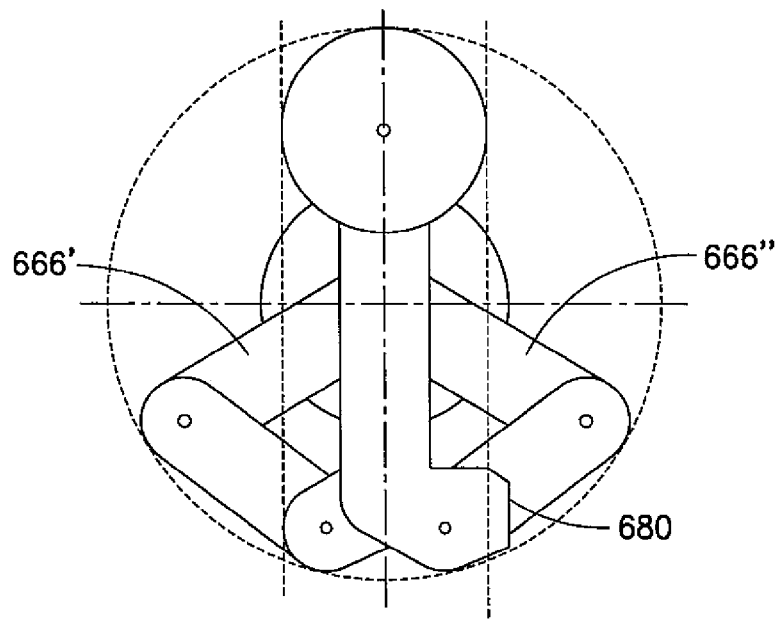
FIG. 31A is a top view of a transport apparatus.
Figure 31B:
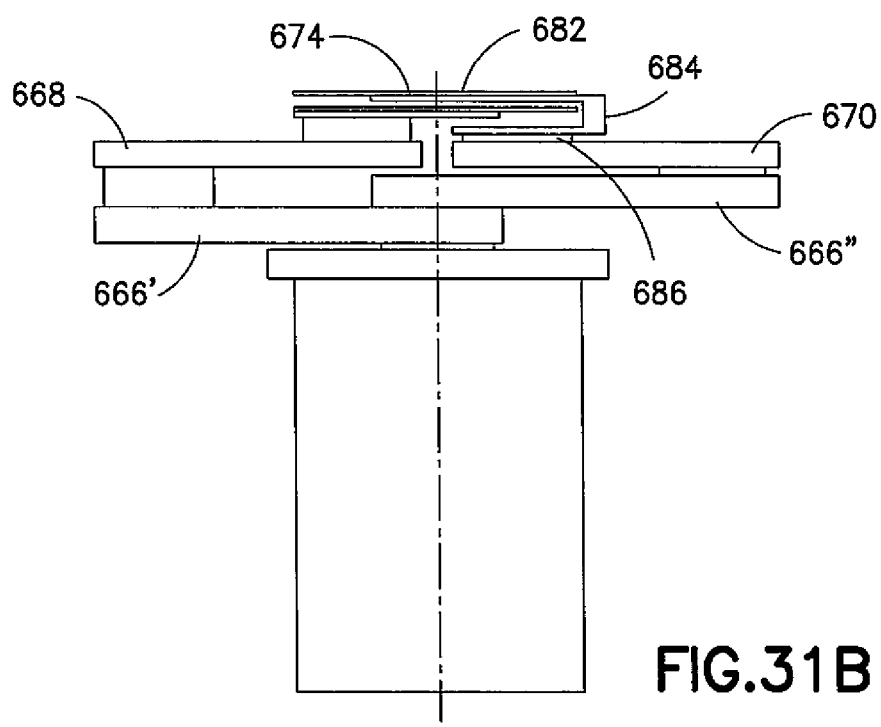
FIG. 31B is a side view of a transport apparatus.
Figures 32A, 32B:
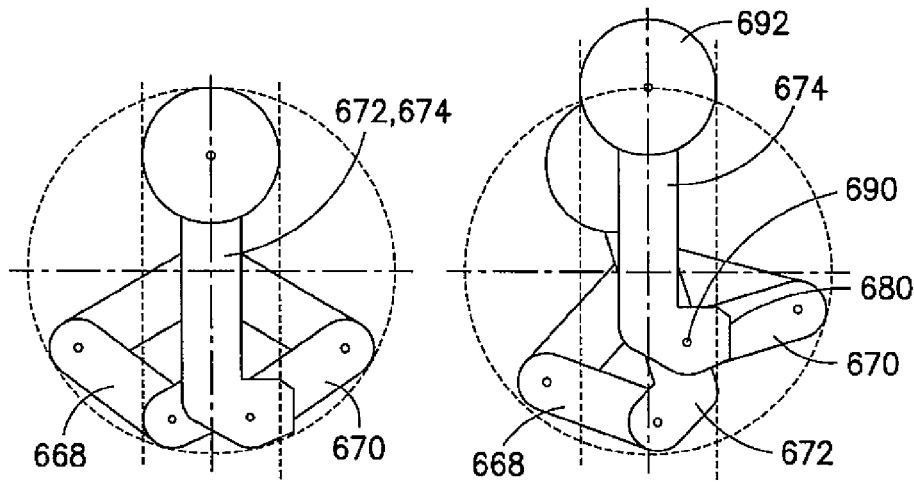
FIG. 32A is a top view of a transport apparatus.
FIG. 32B is a top view of a transport apparatus.
Figures 32C, 32D:
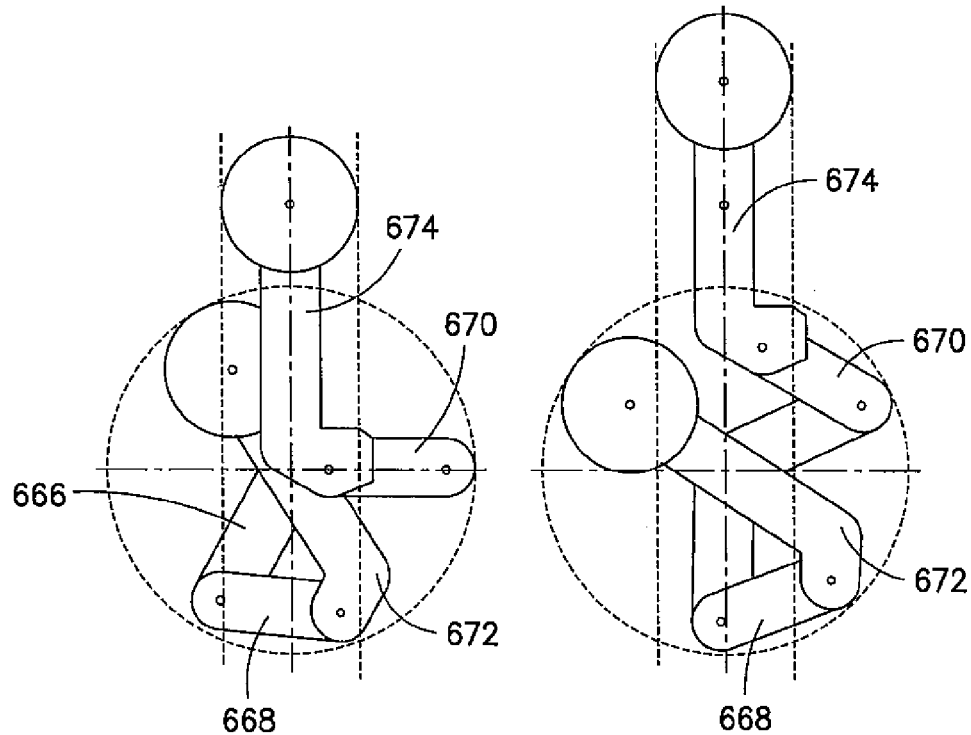
FIG. 32C is a top view of a transport apparatus.
FIG. 32D is a top view of a transport apparatus.

Referring now to FIGS. 30A and 30B, there is shown the top and side views respectively of robot 660 with arm 662. Arm 662 may have features as described with respect to FIGS. 27-29 however employing a bridge and with the two forearms at the same elevation as will be described. Both linkages are shown in their retracted positions. The lateral offset 664 of the end-effectors corresponds to the difference of the joint-to-joint lengths of the upper arm 66 and forearms 668, 670. The combined upper arm link 666 can be a single piece as depicted in FIGS. 30A and 30B or it can be formed by two or more sections 666', 666", as shown in the example of FIGS. 31A and 31B. The internal arrangements used to drive the individual links of the arm may be identical to that shown for FIGS. 15-19 but where the forearms 668, 670 are shorter than the upper arm 666. The common upper arm 666 is driven by one motor. Each of the two forearms 668, 670 is driven independently by one motor through a band drive with conventional pulleys. The third links with the end-effectors 672, 674 are constrained by band drives, each with at least one non-circular pulley, which compensate for the effects of the unequal lengths of the upper arms and forearms. The band drives in each of the linkages may be designed using the methodology described for FIGS. 1 and 2. The kinematic equations presented for FIGS. 1 and 2 can also be used for each of the two linkages of the dual arm. Third link and end effector 674 has a bridge 680 that has an upper end effector portion 682, a side offset support portion 684 offset from the wrist axis between link 670 and link 674 and further has a lower support portion 686 coupling the wrist axis to the offset support portion 684. Bridge 680 allows forearms 668 and 670 to be packaged at the same level while providing clearance for the interleaved portions of third link and end effector 672 (which may include the wafer) and the bridge 680 as can be seen below with respect to FIG. 32. Bridge 680 further provides an arrangement where any moving parts, for example, associated with the two wrist joints, reside below the wafer surface during transport. Referring also to FIGS. 32A, 32B, 32C and 32D, there is shown the top view of the robot arm of FIGS. 30A and 30B as the right linkage 670, 674 extends. The lateral offset 664 of the end-effector corresponds to the difference of the joint-to-joint lengths of the upper arm 666 and forearm 670, and the wrist joint 690 travels along a straight line offset with respect to the trajectory of the center of the wafer 692 by this difference. Note that the inactive linkage 668, 672 rotates while the active linkage 670, 674 extends. For instance, the upper linkage rotates as the lower linkage extends, and the lower linkage rotates as the upper linkage extends. In FIGS. 32A, 32B, 32C and 32D, FIG. 32A depicts the arm with both linkages in the retracted positions. FIG. 32B shows the right linkage 670, 674 partially extended in a position that corresponds to the worst-case clearance (or is close to the worst-case clearance) between the bridge 680 of the right linkage 670, 674 and the end-effector 672 of the left linkage 668, 672. FIG. 32C shows the right linkage 670, 674 partially extended in a position when the forearm 670 is aligned with the upper arm 666. The lateral offset of the end-effector corresponds to the difference of the joint-to-joint lengths of the upper arm and forearm. The wrist joint 690 axis travels along a straight line offset with respect to the trajectory of the center of the wafer 692 by this difference. FIG. 32D depicts farther extension of the right linkage 670, 674. The embodiment shown combines the benefits of the side-by-side dual scara arrangement, for example, slim profile, resulting in a shallow chamber with a small volume, the solid link design and the coaxial drive. The bridge 680 on the right linkage 670, 674 is much lower and its unsupported length between vertical member 684 and wrist 690 is shorter than in a prior art coaxial dual scara arm and all of the joints are below the end-effectors. Here, the inactive arm 668, 672 rotates while the active arm 670, 674 extends. As will be described below, in other aspects of the disclosed embodiment, and arm which does not exhibit this behavior may be provided with a different band drives with non-circular pulleys in place of the conventional ones disclosed here. Alternatively, the bridge that supports the top end-effector may be eliminated by utilizing an arrangement similar to those described for FIGS. 25A and 25B and FIGS. 27 and 28 above.

Figure 33A:
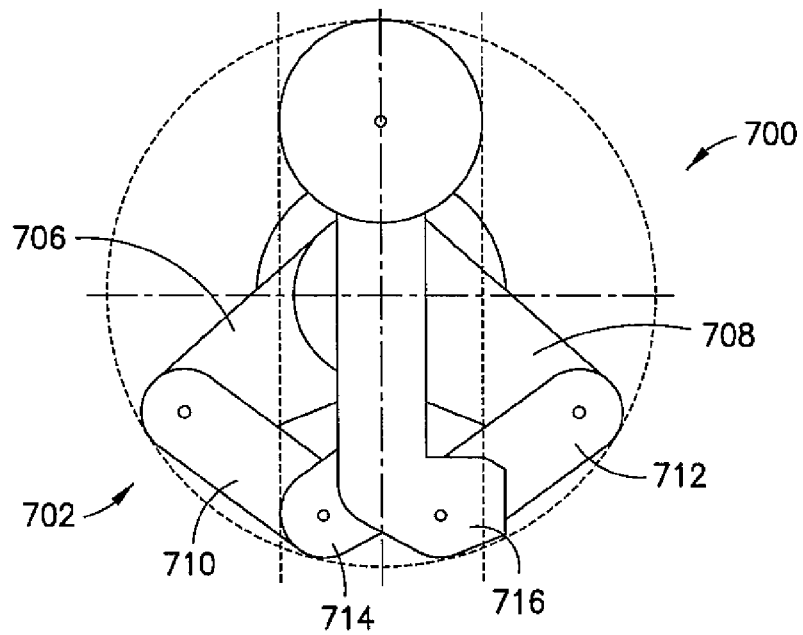
FIG. 33A is a top view of a transport apparatus.
Figure 33B:
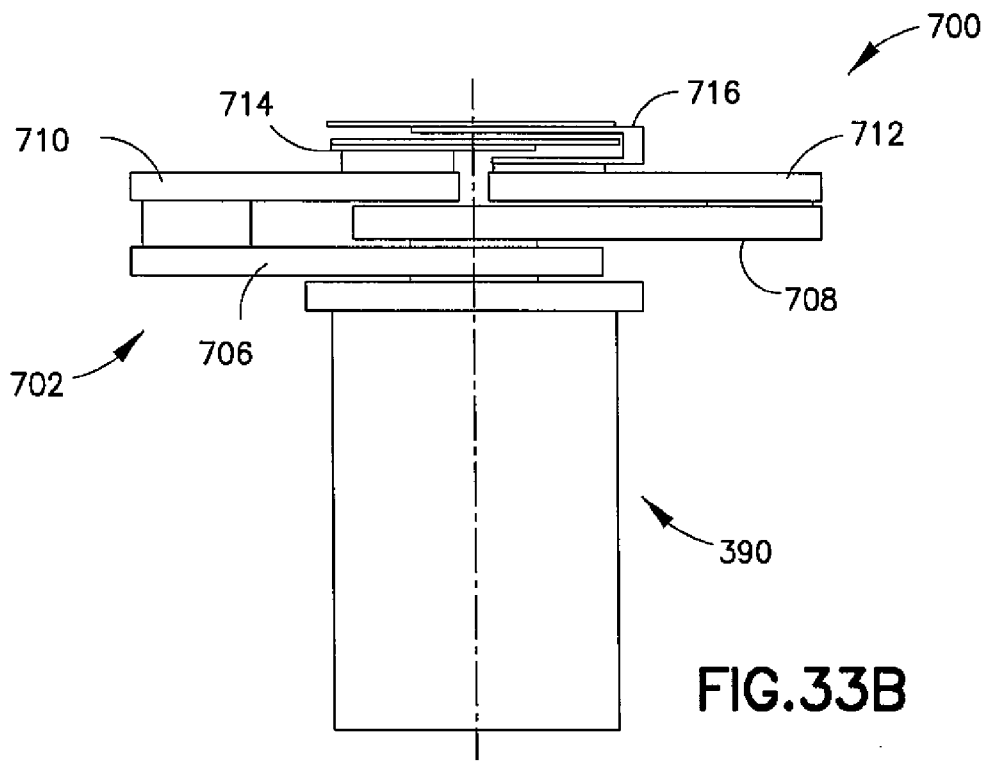
FIG. 33B is a side view of a transport apparatus.

Referring now to FIGS. 33A and 33B, there is shown top and side views respectively of robot 700 with arm 702. Arm 702 may have features similar to that of the arm shown in FIGS. 21-23 but with forearm lengths shorter than the upper arm lengths and employing a bridge as described with respect to bridge 680 by way of example and with the forearms located at the same elevation. Both linkages are shown in their retracted positions. In FIGS. 33A and 33B, the right upper arm 708 is located above the left upper arm 706. Alternatively, the left upper 706 may be located above the right upper arm 708. Similarly, the third link and end-effector 716 of the right linkage 712, 716 feature a bridge that extends over the third link and end-effector 714 of the left linkage 710, 714. Alternatively, the third link and end-effector 714 of the left linkage 710, 714 may feature a bridge that may extend over the third link and end-effector 716 of the right linkage 712, 716. The internal arrangements used to drive the individual links of the arm may be similar to the embodiment shown in FIGS. 21-23. Each of the two upper arms 706, 708 is driven independently by one motor. The forearms 710, 712 are coupled via band arrangements, each with at least one non-circular pulley, to a third motor. The third links 714, 716 with the end-effectors are constrained by band drives, each with at least one non-circular pulley. The band drives are designed so that rotation of one of the upper arms 706, 708 causes the corresponding linkage to extend and retract along a straight line while the other linkage remains stationary. The band drives in each of the linkages are designed using the methodology described for the embodiment shown in FIGS. 5 and 6. The kinematic equations presented for the embodiment shown in FIGS. 5 and 6 can also be used for each of the two linkages of the dual arm. Referring also to FIGS. 34A, 34B and 34C, there is shown the arm of FIGS. 33A and 33B as the right linkage 708, 712, 716 extends. Here, the inactive linkage 706, 710, 714 remains stationary while the active linkage 712, 716 extends. That is, the left linkage does not move while the right linkage extends, and the right linkage does not move when the left linkage extends. The embodiment shown combines the benefits of the side-by-side dual scara arrangement, for example, slim profile, resulting in a shallow chamber with a small volume and the coaxial drive. The bridge on the right linkage is much lower and its unsupported length is shorter than in the existing coaxial dual scara arms and all of the joints are below the end-effectors. The inactive linkage remains stationary while the active one extends potentially leading to higher throughput as active linkage may extend or retract faster with no load. Alternatively, the bridge that supports the top end-effector may be eliminated by utilizing an arrangement similar to those described for FIGS. 25, 27 and 28.

Figure 35A:
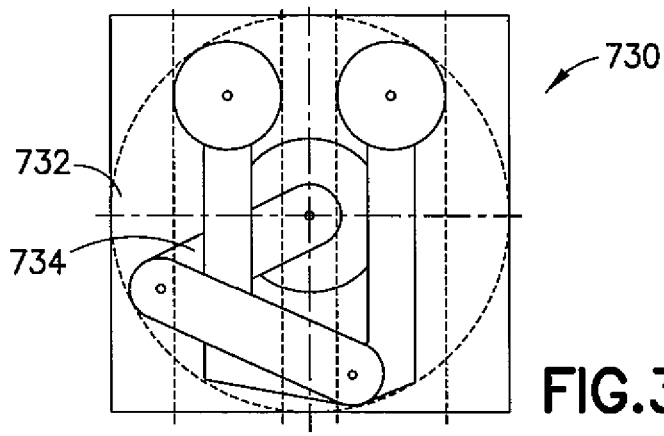
FIG. 35A is a top view of a transport apparatus.
Figure 35B:
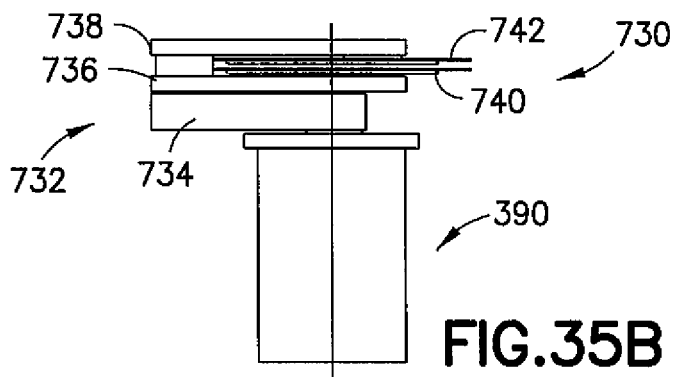
FIG. 35B is a side view of a transport apparatus.
Figure 36:
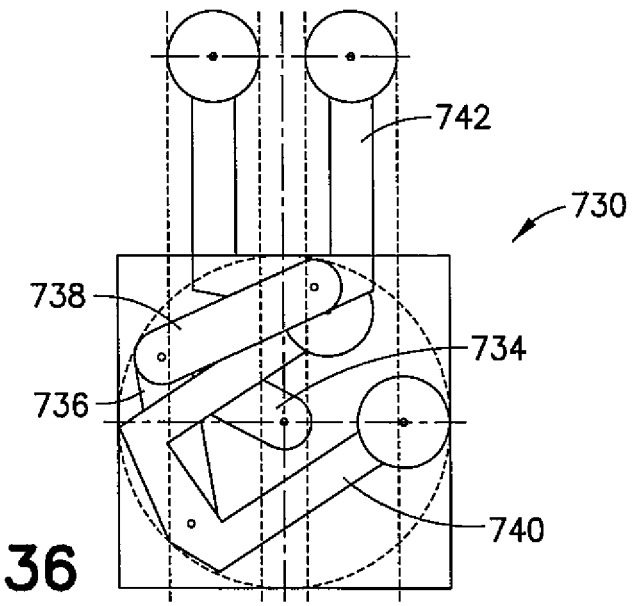
FIG. 36 is a top view of a transport apparatus.

Referring now to FIGS. 35A and 35B, there is shown top and side views of robot 730 with arm 732 with both linkages shown in their retracted positions. Each linkage has a dual-holder end-effector 740, 742, each supporting two substrates offset from each other for a total of 4 substrates supportable. The internal arrangements used to drive the individual links of the arm 732 may be identical to FIGS. 10 and 11, for example, FIG. 13. The common upper arm 734 is driven by one motor. Each of the two forearms 73736, 738 is driven independently by one motor through a band drive with conventional pulleys. The third links with the end-effectors 740, 742 are constrained by band drives, each with at least one non-circular pulley, which compensate for the effects of the unequal lengths of the upper arms and forearms. The embodiment shown has forearms longer than the upper arm. Alternately, they may be shorter. The band drives in each of the linkages are designed using the methodology described for FIGS. 1 and 2. The kinematic equations presented for FIGS. 1 and 2 may also be used for each of the two linkages of the dual arm. Referring also to FIG. 36, there is shown the arm of FIGS. 35A and 35B as one linkage 738, 742 extends. Note that the inactive linkage 736, 740 rotates while the active linkage 738, 742 extends. For instance, the upper linkage rotates as the lower linkage extends, and the lower linkage rotates as the upper linkage extends. Compared to FIGS. 37 and 38, end-effector does not need to be shaped to avoid interference with opposite elbow.

Figure 38A:
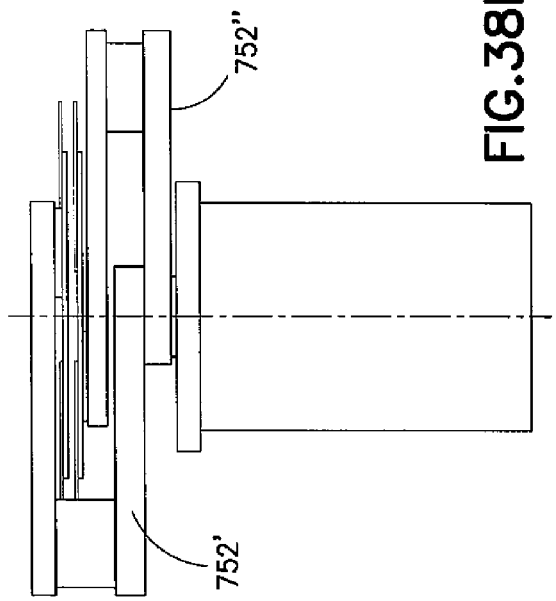
FIG. 38A is a top view of a transport apparatus.
Figure 38B:
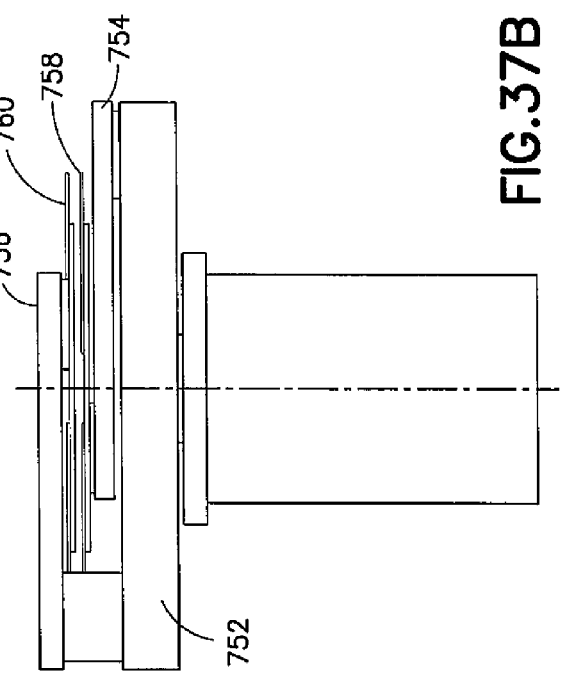
FIG. 38B is a side view of a transport apparatus.
Figure 37A:
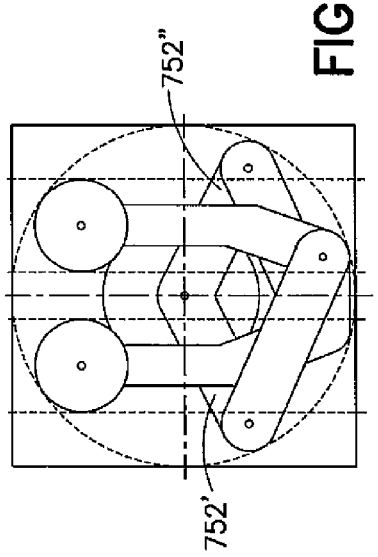
FIG. 37A is a top view of a transport apparatus.
Figure 37B:
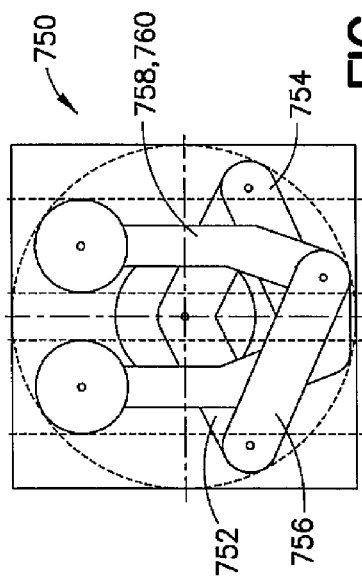
FIG. 37B is a side view of a transport apparatus.

Referring now to FIGS. 37A and 37B, there is shown top and side views respectively of robot with arm 750. Both linkages are shown in their retracted positions with each linkage having a dual-holder end-effector 758, 760. The combined upper arm link 752 can be a single piece as depicted in FIGS. 37A and 37B or it can be formed by two or more sections 752', 752", as shown in the example of FIGS. 38A and 38B. The internal arrangements used to drive the individual links of the arm may be identical to FIGS. 15-19, for example, FIG. 19. The combined upper arms 752 are driven by one motor. Each of the two forearms 754, 756 is driven independently by one motor through a band drive with conventional pulleys. The third links 758, 760 with the end-effectors are constrained by band drives, each with at least one non-circular pulley, which compensate for the effects of the unequal lengths of the upper arms and forearms. The embodiment shown has forearms longer than the upper arm. Alternately, they may be shorter. The band drives in each of the linkages are designed using the methodology described for FIGS. 1 and 2. The kinematic equations presented for FIGS. 1 and 2 may also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the common upper arm and the driveshaft coupled to the forearm associated with the active linkage need to move in a coordinated manner in accordance with the inverse kinematic equations for FIGS. 1 and 2. At the same time, the driveshaft coupled to the other forearm needs to rotate in synch with the drive shaft of the common upper arm in order for the inactive linkage to remain retracted. Referring also to FIG. 39, there is shown the arm of FIGS. 37A and 37B as one linkage 756, 760 extends. Here, the inactive linkage 754, 758 rotates while the active linkage extends. For instance, the right linkage rotates as the left linkage extends, and the left linkage rotates as the right linkage extends. The embodiment shown has no bridge. The upper wrist travels over one of the wafers on the lower end-effector. Here, the arm and end-effectors need to be designed so that the top elbow clears the lower end-effector.

Figure 41:
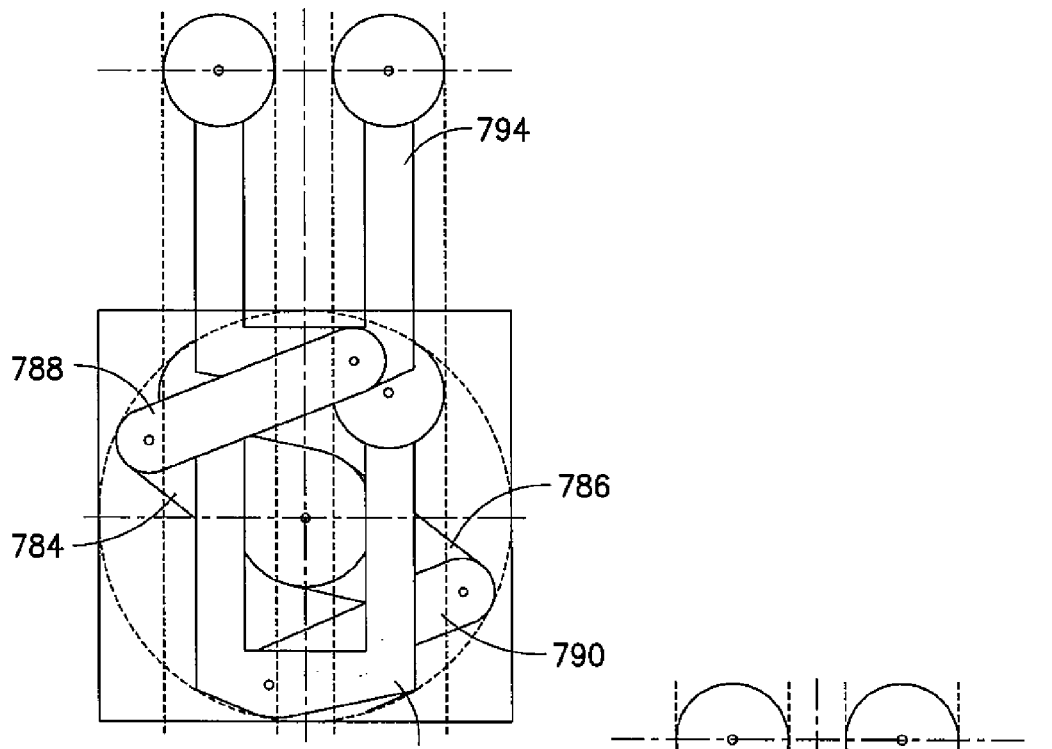
FIG. 41 is a top view of a transport apparatus.
Figure 42:
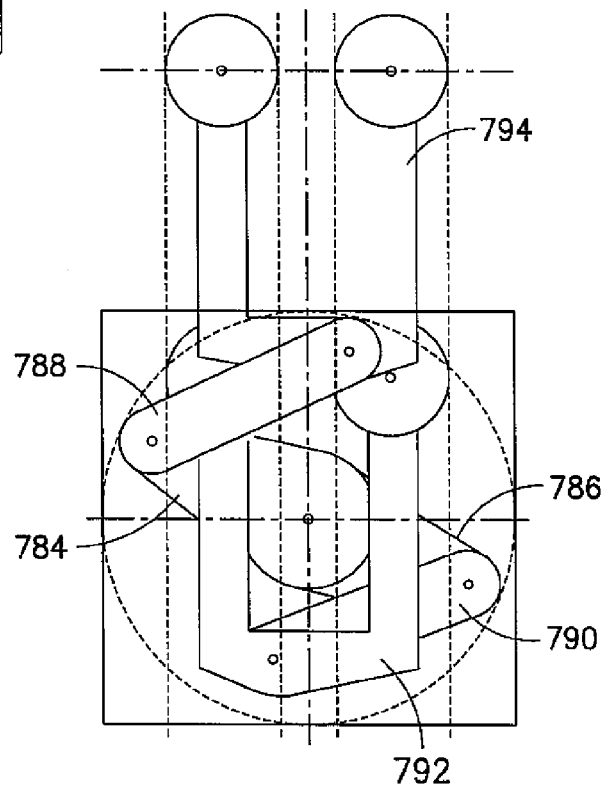
FIG. 42 is a top view of a transport apparatus.

Referring now to FIGS. 40A and 40B, there is shown top and side views respectively of robot 750 with arm 752. Both linkages are shown in their retracted positions where each linkage has a dual-holder end-effector 792, 794. The internal arrangements used to drive the individual links of the arm may be identical to FIGS. 21-23. Each of the two upper arms 784, 786 is driven independently by one motor. The forearms 788, 790 are coupled via band arrangements, each with at least one non-circular pulley, to a third motor. The third links with the end-effectors 792, 794 are constrained by band drives, each with at least one non-circular pulley. The band drives are designed so that rotation of one of the upper arms causes the corresponding linkage to extend and retract along a straight line while the other linkage remains stationary. The embodiment shown has forearms longer than the upper arm. Alternately, they may be shorter. The band drives in each of the linkages are designed using the methodology described for FIGS. 5 and 6. The kinematic equations presented for FIGS. 5 and 6 can also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the upper arm associated with the active linkage needs to be rotated according to the inverse kinematic equations for FIGS. 5 and 6, and the other two drive shafts need to be kept stationary. Referring also to FIG. 41, there is shown the arm of FIGS. 40A and 40B as one linkage 784, 788, 794 extends. Note that the inactive linkage 786, 790, 792 may remain stationary while the active linkage 794, 788, 794 extends. That is, the left linkage does not move while the right linkage extends, and the right linkage does not move when the left linkage extends. Alternately, the left and right linkages may be moved at the same time radially independently, for example as seen in FIG. 42 where the right linkage extends slightly independently as compared to FIG. 41. The motion of the elbow of the upper linkage may be limited due to potential interference with a wafer on the lower end-effector, which may limit the reach of the robot as illustrated in FIG. 41. This limitation may be mitigated by extending the lower linkage slightly to provide additional clearance and achieve full reach as shown in FIG. 42. The embodiment shown has no bridge. The wrist of the upper linkage may travel above a wafer on the lower end-effector.

Referring now to FIGS. 43A and 43B, there is shown top and side views respectively of robot 810 with arm 812. Both linkages are shown in their retracted positions with each linkage having a dual-holder end-effector 820, 822. The internal arrangements used to drive the individual links of the arm may be identical to FIGS. 10-13. The common upper arm 814 is driven by one motor. Each of the two forearms 816, 818 is driven independently by one motor through a band drive with conventional pulleys. The third links with the end-effectors 820, 822 are constrained by band drives, each with at least one non-circular pulley, which compensate for the effects of the unequal lengths of the upper arms and forearms. In the embodiment shown, the forearms are shorter than the upper arm; alternately they may be longer. The band drives in each of the linkages are designed using the methodology described for FIGS. 1 and 2. The kinematic equations presented for FIGS. 1 and 2 may also be used for each of the two linkages of the dual arm. Referring also to FIGS. 44 and 45, there is shown the arm of FIGS. 43A and 43B as the upper linkage 818, 822 extends. Note that the inactive linkage 816, 820 rotates while the active linkage 818, 822 extends. For instance, the upper linkage rotates as the lower linkage extends, and the lower linkage rotates as the upper linkage extends. FIGS. 44 and 45 illustrate that the wrist joint 824 of the upper linkage 818, 822 does not travel over the wafers 826 carried by the lower linkage 816, 820 of the arm. The embodiment shown has no bridge. Compared to FIGS. 46 and 47, the end-effector does not need to be shaped to avoid interference with opposite elbow.

Figure 49:
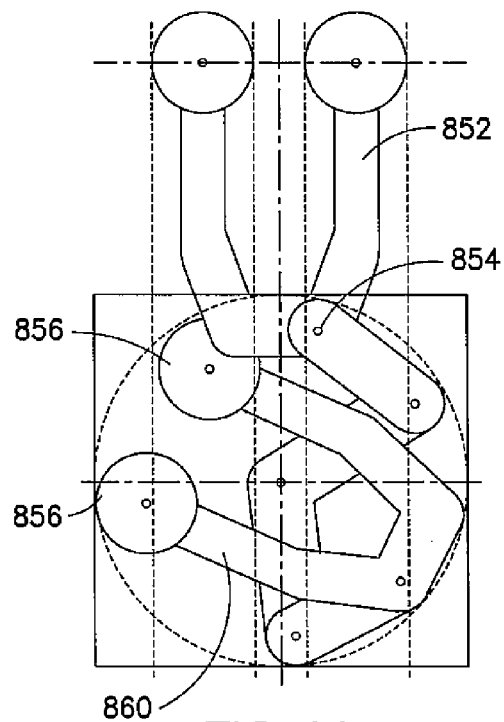
FIG. 49 is a top view of a transport apparatus.

Referring now to FIGS. 46A and 46B, there is shown top and side views respectively of robot 840 with arm 842. Both linkages are shown in their retracted positions where each linkage has a dual-holder end-effector 850, 852. The combined upper arm link 844 can be a single piece as depicted in FIGS. 46A and 46B or it can be formed by two or more sections 844', 844", as shown in the example of FIGS. 47A and 47B. The internal arrangements used to drive the individual links of the arm may be identical to FIGS. 15-19, for example FIG. 19. The combined upper arms 844 are driven by one motor. Each of the two forearms 846, 848 is driven independently by one motor through a band drive with conventional pulleys. The third links with the end-effectors 850, 852 are constrained by band drives, each with at least one non-circular pulley, which compensate for the effects of the unequal lengths of the upper arms and forearms. In the embodiment shown, the forearms are shorter than the upper arm; alternately they may be longer. The band drives in each of the linkages are designed using the methodology described for FIGS. 1 and 2. The kinematic equations presented for FIGS. 1 and 2 may also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the common upper arm 844 and the driveshaft coupled to the forearm associated with the active linkage need to move in a coordinated manner in accordance with the inverse kinematic equations for FIGS. 1 and 2. At the same time, the driveshaft coupled to the other forearm needs to rotate in synch with the drive shaft of the common upper arm in order for the inactive linkage to remain retracted. Referring also to FIGS. 48 and 49, there is shown the arm of FIGS. 46A and 46B as the upper linkage 848, 852 extends. Here, the inactive linkage 846, 850 rotates while the active linkage 848, 852 extends. For instance, the upper linkage rotates as the lower linkage extends, and the lower linkage rotates as the upper linkage extends. FIGS. 48 and 49 illustrate that the wrist joint 854 of the upper linkage does not travel over the wafers 856 carried by the lower linkage of the arm. The embodiment shown has no bridge and the wrist joint of the upper linkage does not travel over a wafer carried by the lower linkage. Here, the inactive arm rotates less, allowing for a higher speed of motion when active arm extends or retracts with no load.

Figure 50A:
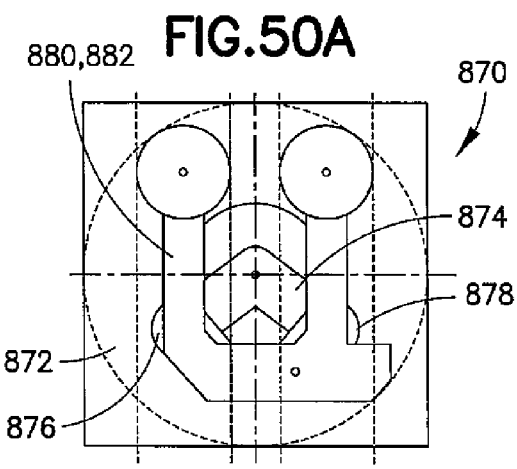
FIG. 50A is a top view of a transport apparatus.
Figure 50B:
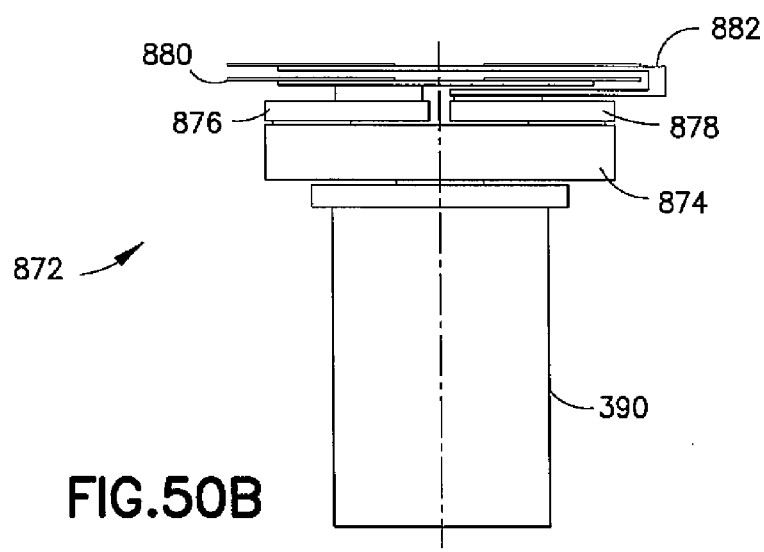
FIG. 50B is a side view of a transport apparatus.

Referring now to FIGS. 50A and 50B, there is shown top and side views of robot 870 with arm 872. Both linkages are shown in their retracted positions where each linkage has a dual-holder end-effector 880, 882. The combined upper arm link 974 can be a single piece as depicted in FIGS. 50A and 50B or it can be formed by two or more sections, as shown in the example of FIGS. 47A and 47B. The internal arrangements used to drive the individual links of the arm may be identical to FIGS. 15-19, for example, FIG. 18. The combined upper arms 874 are driven by one motor. Each of the two forearms 876, 878 is driven independently by one motor through a band drive with conventional pulleys. The third links with the end-effectors are constrained by band drives, each with at least one non-circular pulley, which compensate for the effects of the unequal lengths of the upper arms and forearms. In the embodiment shown, the forearms are shorter than the upper arm; alternately they may be longer. The band drives in each of the linkages may be designed using the methodology described for FIGS. 1 and 2. The kinematic equations presented for FIGS. 1 and 2 may also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the common upper arm 874 and the driveshaft coupled to the forearm associated with the active linkage need to move in a coordinated manner in accordance with the inverse kinematic equations for FIGS. 1 and 2. At the same time, the driveshaft coupled to the other forearm needs to rotate in synch with the drive shaft of the common upper arm 874 in order for the inactive linkage to remain retracted. Referring also to FIG. 51, there is shown the arm of FIGS. 50A and 50B with one linkage 878, 882 extended. Here, the inactive linkage 876, 880 rotates while the active linkage 878, 882 extends. For instance, the upper linkage rotates as the lower linkage extends, and the lower linkage rotates as the upper linkage extends. The embodiment shown has short forearm links that may be stiffer with shorter short bands and where the forearms are located side-by-side facilitating a shallow chamber. Here, the short links may cause more rotation of inactive arm compared to FIGS. 46 and 47 which may be addressed by longer upper arms. Bridge 884 is provided where the arm and end-effectors may be designed so that the bridge 884 clears the inactive end-effector 880 during an extension move. Here, the base of the end-effector features an angled shape 886 as shown.

Figure 53:
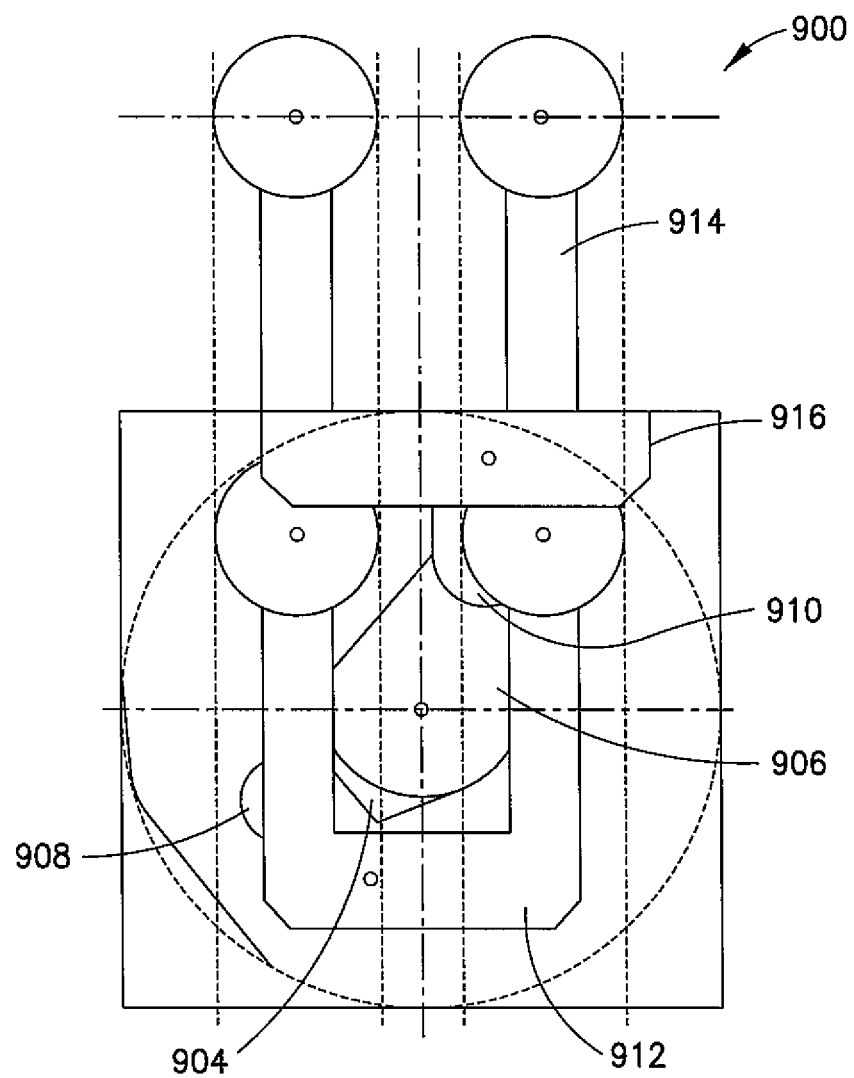
FIG. 53 is a top view of a transport apparatus.

Referring now to FIGS. 52A and 52B, there is shown top and side views respectively of robot 900 with arm 902. Both linkages are shown in their retracted positions with each linkage having a dual-holder end-effector. The internal arrangements used to drive the individual links of the arm may be identical to FIGS. 21-23. Each of the two upper arms 904, 906 is driven independently by one motor. The forearms 908, 910 are coupled via band arrangements, each with at least one non-circular pulley, to a third motor. The third links with the end-effectors 912, 914 are constrained by band drives, each with at least one non-circular pulley. The band drives are designed so that rotation of one of the upper arms 904, 906 causes the corresponding linkage to extend and retract along a straight line while the other linkage remains stationary. In the embodiment shown, the forearms are shorter than the upper arm; alternately they may be longer. The band drives in each of the linkages are designed using the methodology described for FIGS. 5-6. The kinematic equations presented for FIG. 5-6 may also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the upper arm associated with the active linkage needs to be rotated according to the inverse kinematic equations for FIGS. 5-6, and the other two drive shafts need to be kept stationary. Referring also to FIG. 53, there is shown the arm of FIGS. 52A and 52B with one linkage 906, 910, 914 extended. Note that the inactive linkage 904, 908, 912 remains stationary while the active linkage 906, 910, 914 extends with bridge 916. That is, the left linkage need not move while the right linkage extends, and the right linkage need not move when the left linkage extends although they may be moved radially independently. The embodiment shown has shorter links that may be stiffer with short bands and side-by-side forearms facilitating a shallow chamber. Alternately, the forearms may be longer than upper arms in the configuration with a bridge.

Figure 54A:
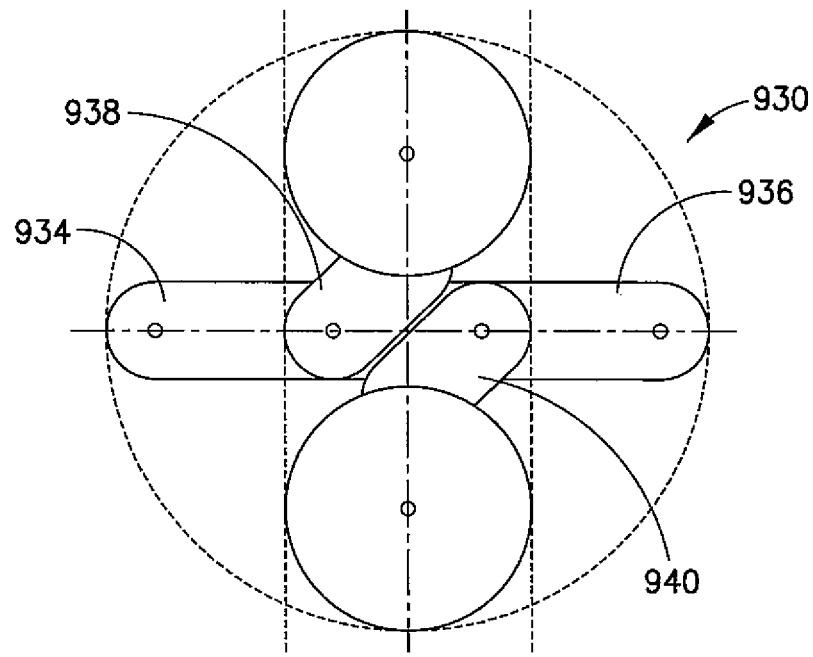
FIG. 54A is a top view of a transport apparatus.
Figure 54B:
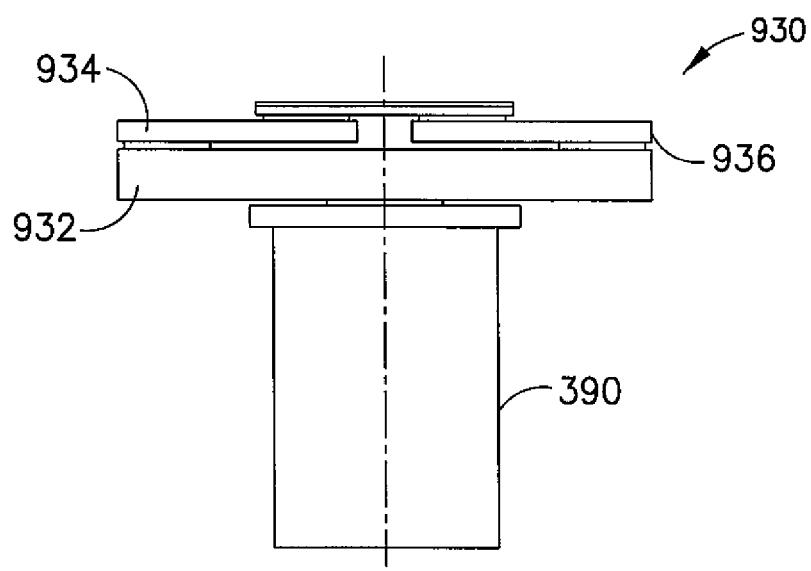
FIG. 54B is a side view of a transport apparatus.

Referring now to FIGS. 54-55 there is shown a coupled dual arm 930 with opposing end effectors 938, 940. FIGS. 54A and 54B show respectively the top and side views of the robot with the arm. Both linkages are shown in their retracted positions where the lateral offset of the end-effectors corresponds to the difference of the joint-to-joint lengths of the upper arm 932 and forearms 934, 936. The combined upper arm link 932 can be a single piece as depicted in FIG. 54 or it can be formed by two or more sections. By way of example, a two-section design may be lighter where less material, and left and right sections may be identical components. The internal arrangements used to drive the individual links of the arm may be based on that shown with respect to FIGS. 18 and 19 or otherwise. The common upper arm 932 is driven by one motor. Each of the two forearms 934, 936 is driven independently by one motor through a band drive with conventional pulleys. The third links with the end-effectors 938, 940 are constrained by band drives, each with at least one non-circular pulley, which compensate for the effects of the unequal lengths of the upper arms 934, 936 and forearm 932. The band drives in each of the linkages are designed using the methodology described with respect to FIG. 1 or otherwise. The kinematic equations presented for FIG. 1 can also be used for each of the two linkages of the dual arm. FIGS. 55A-55C shows the arm of FIG. 54 as the first 934, 938 and second 936, 940 linkages extend from the retracted position. The lateral offset of the end-effector corresponds to the difference of the joint-to-joint lengths of the upper arm 934, 936 and forearm 932, and the wrist joint 942, 944 travels along a straight line offset with respect to the trajectory of the center of the wafer by this difference. Note that the inactive linkage rotates while the active linkage extends. For instance, the second linkage rotates as the first linkage extends, and the first linkage rotates as the second linkage extends. FIG. 55A depicts the arm with both linkages in the retracted positions. FIG. 55B shows the first linkage 934, 938 extended. FIG. 55C depicts the second linkage 936, 940 extended. The arm shown has a low profile as the forearms travel in the same plane and the end-effectors travel in the same plane, allowing for a shallow vacuum chamber with a small volume. Since the retracted position of the wrist of one linkage is constrained by the wrist of the other linkage, the containment radius of the arm may be large, making the arm particularly suitable for applications with a large number of process modules where the diameter of the chamber is dictated by the size of the slot valves. Due to its low profile, the arm may replace a frogleg-type arm with opposing end-effectors. In the embodiment shown, the forearms are shorter than the upper arm; alternately they may be longer, for example, where the forearms are in different elevations and overlapping.

Figure 56A:
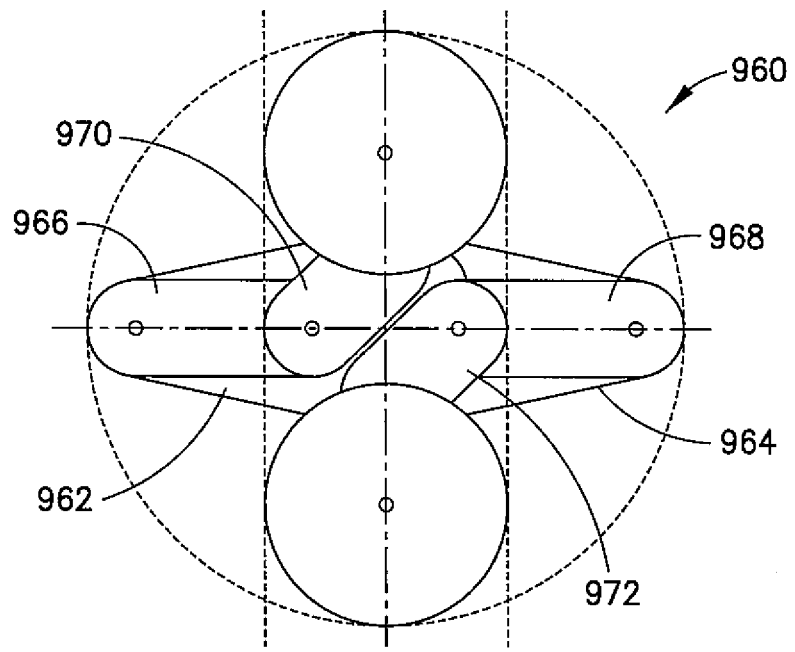
FIG. 56A is a top view of a transport apparatus.
Figure 56B:
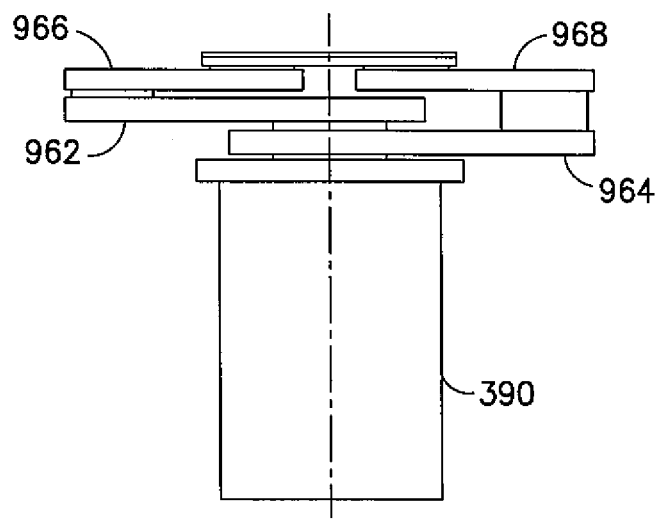
FIG. 56B is a side view of a transport apparatus.

Referring to FIGS. 56-57, there is shown an independent dual arm 960 with opposing end effectors 970, 972. FIGS. 56A and 56B show the top and side views of the robot with the arm. Both linkages are shown in their retracted positions. In FIG. 56, the upper arm 962 of the first linkage is located above the upper arm 964 of the second linkage. Alternatively, the upper arm of the second linkage may be located above the upper arm of the first linkage. The internal arrangements used to drive the individual links of the arm may be based on FIG. 23 or otherwise. Here, each of the two upper arms 962, 964 may be driven independently by one motor. The forearms 966, 968 are coupled via band arrangements, each with at least one non-circular pulley, to a third motor. The third links with the end-effectors 970, 972 are constrained by band drives, each with at least one non-circular pulley. The band drives are designed so that rotation of one of the upper arms causes the corresponding linkage to extend and retract along a straight line while the other linkage remains stationary. The band drives in each of the linkages are designed using the methodology described for FIG. 5. The kinematic equations presented for FIG. 5 can also be used for each of the two linkages of the dual arm. FIGS. 57A-57C show the arm of FIG. 56 as the first 962, 966, 970 and second 964, 968, 972 linkages extend from the retracted position. Here, that the inactive linkage remains (but not need do so) stationary while the active linkage extends. That is, the second linkage does not move while the first linkage extends, and the first linkage does not move when the second linkage extends. The arm has a low profile as the forearms travel in the same plane and the end-effectors travel in the same plane, allowing for a shallow vacuum chamber with a small volume. Since the retracted position of the wrist of one linkage is constrained by the wrist of the other linkage, the containment radius of the arm is large, making the arm particularly suitable for applications with a large number of process modules where the diameter of the chamber is dictated by the size of the slot valves. Due to its low profile, the arm can replace a frogleg-type arm with opposing end-effectors. In the embodiment shown, the forearms are shorter than the upper arm; alternately they may be longer, for example, where the forearms are in different elevations and overlapping.

Figure 58A:
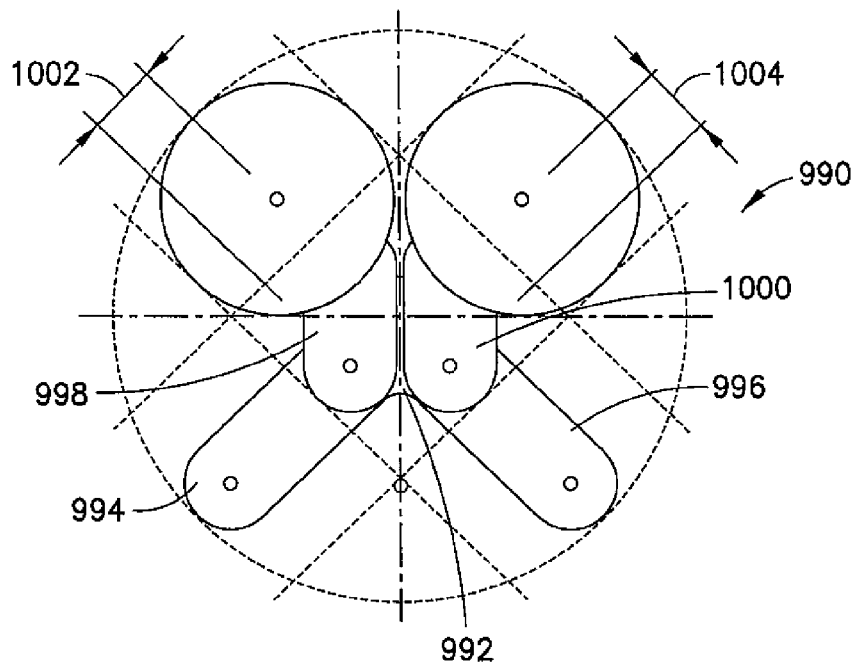
FIG. 58A is a top view of a transport apparatus.
Figure 58B:
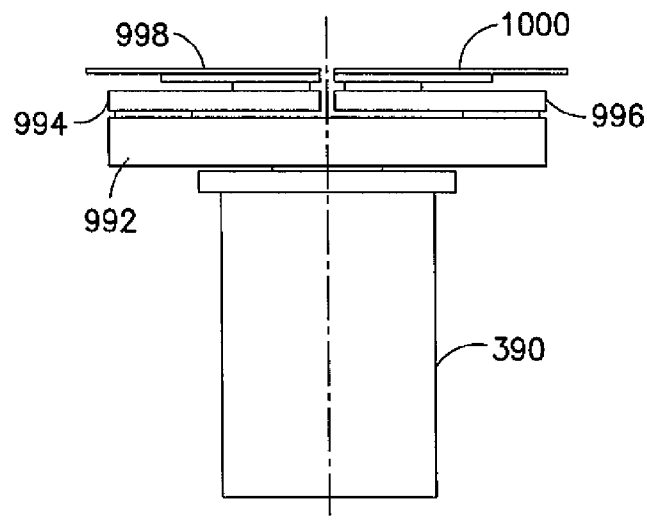
FIG. 58B is a side view of a transport apparatus.

Referring now to FIG. 58, there is shown a coupled dual arm 990 with angularly offset end effectors 998, 1000. FIGS. 58A and 58B show the top and side views of the robot with the arm. Both linkages are shown in their retracted positions. The lateral offset 1002, 1004 of the end-effectors corresponds to the difference of the joint-to-joint lengths of the upper arm 994, 996 and forearm 992. The combined upper arm link 992 can be a single piece as depicted in FIG. 59 or it can be formed by two or more sections. The internal arrangements used to drive the individual links of the arm are based on FIGS. 18 and 19 or otherwise. Here, the common upper arm 992 may be driven by one motor. Each of the two forearms 994, 996 may be driven independently by one motor through a band drive with conventional pulleys. The third links with the end-effectors 998, 1000 are constrained by band drives, each with at least one non-circular pulley, which compensate for the effects of the unequal lengths of the upper arms and forearms. The band drives in each of the linkages are designed using the methodology described for FIG. 1 or otherwise. The kinematic equations presented for FIG. 1 can also be used for each of the two linkages of the dual arm. Referring also to FIGS. 59A-C, there is shown the arm of FIG. 58 as the left 994, 998 and right 996, 1000 linkages extend. The lateral offset 1002, 1004 of the end-effector corresponds to the difference of the joint-to-joint lengths of the upper arm and forearm, and the wrist joint travels along a straight line offset with respect to the trajectory of the center of the wafer by this difference. Here, the inactive linkage rotates while the active linkage extends. For instance, the right linkage rotates as the left linkage extends, and the left linkage rotates as the right linkage extends. FIG. 59A depicts the arm with both linkages in the retracted positions. FIG. 59B shows the left linkage 994, 998 extended. FIG. 59C depicts the right linkage 996, 1000 extended. Here, the inactive arm rotates while the active one extends. In the embodiment shown, the forearms are shorter than the upper arm; alternately they may be longer, for example, where the forearms are in different elevations and overlapping. In the embodiment shown, the end effectors may be 90 degrees apart; alternately any separation angle may be provided.

Figure 60A:
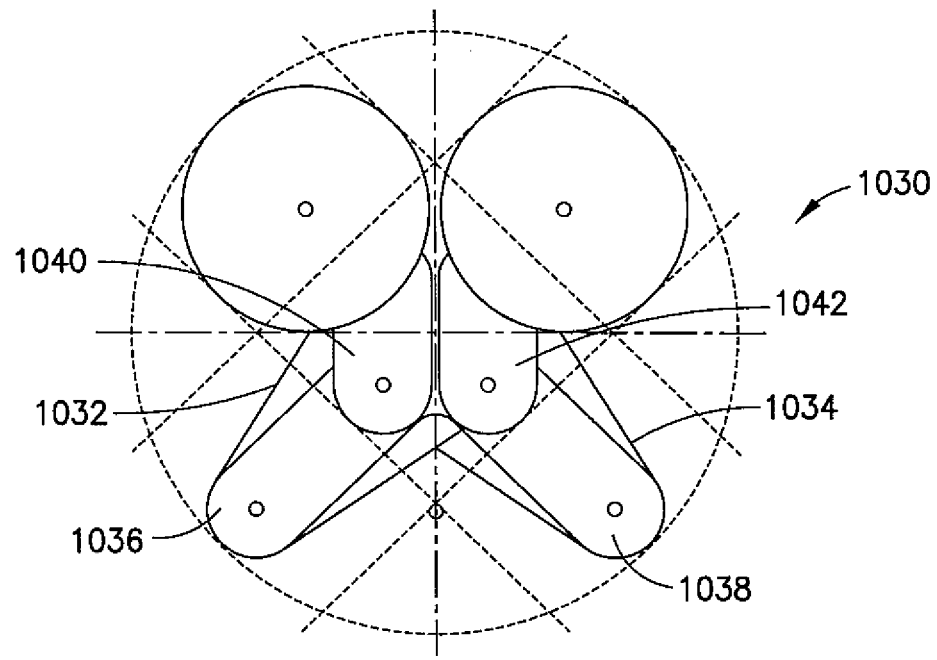
FIG. 60A is a top view of a transport apparatus.
Figure 60B:
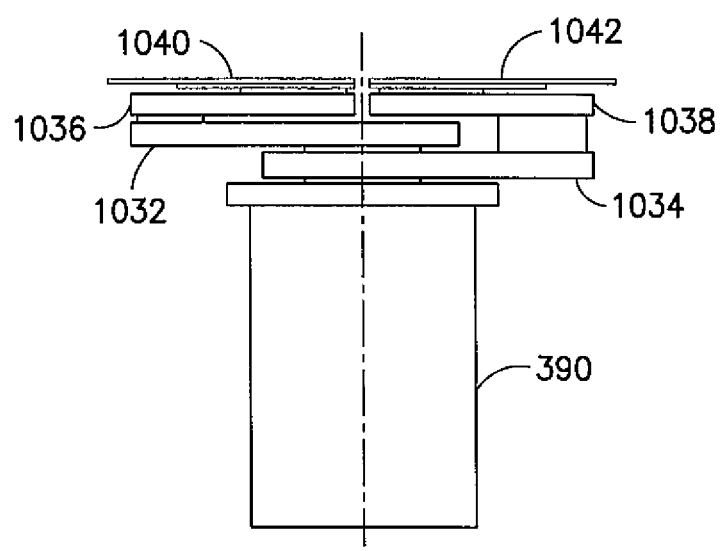
FIG. 60B is a side view of a transport apparatus.

Referring now to FIG. 60, there is shown and independent dual arm 1030 with angularly offset end effectors 1040, 1042. Here, FIGS. 60A and 60B show the top and side views of the robot with the arm. Both linkages are shown in their retracted positions. In FIG. 60, the right upper arm 1034 is located below the left upper arm 1032. Alternatively, the left upper may be located below the right upper arm. The internal arrangements used to drive the individual links of the arm may be based on FIG. 23. Each of the two upper arms 1032, 1034 may be driven independently by one motor each. The forearms are coupled via band arrangements, each with at least one non-circular pulley, to a third motor. The third links with the end-effectors 1040, 1042 are constrained by band drives, each with at least one non-circular pulley. The band drives are designed so that rotation of one of the upper arms 1032, 1034 causes the corresponding linkage to extend and retract along a straight line while the other linkage remains stationary. The band drives in each of the linkages are designed using the methodology described for FIG. 5 or otherwise. The kinematic equations presented for FIG. 5 can also be used for each of the two linkages of the dual arm. FIG. 61A-61C shows the arm of FIG. 60 as the left 1032, 1036, 1040 and then the right 1034, 1038, 1042 linkage extends. Here, the inactive linkage remains (but need not do so) stationary while the active linkage extends. That is, the left linkage does not move while the right linkage extends, and the right linkage does not move when the left linkage extends. Here, the inactive linkage remains stationary while the active one extends. In the embodiment shown, the forearms are shorter than the upper arm; alternately they may be longer, for example, where the forearms are in different elevations and overlapping. In the embodiment shown, the end effectors may be 90 degrees apart; alternately any separation angle may be provided.

Figure 62:
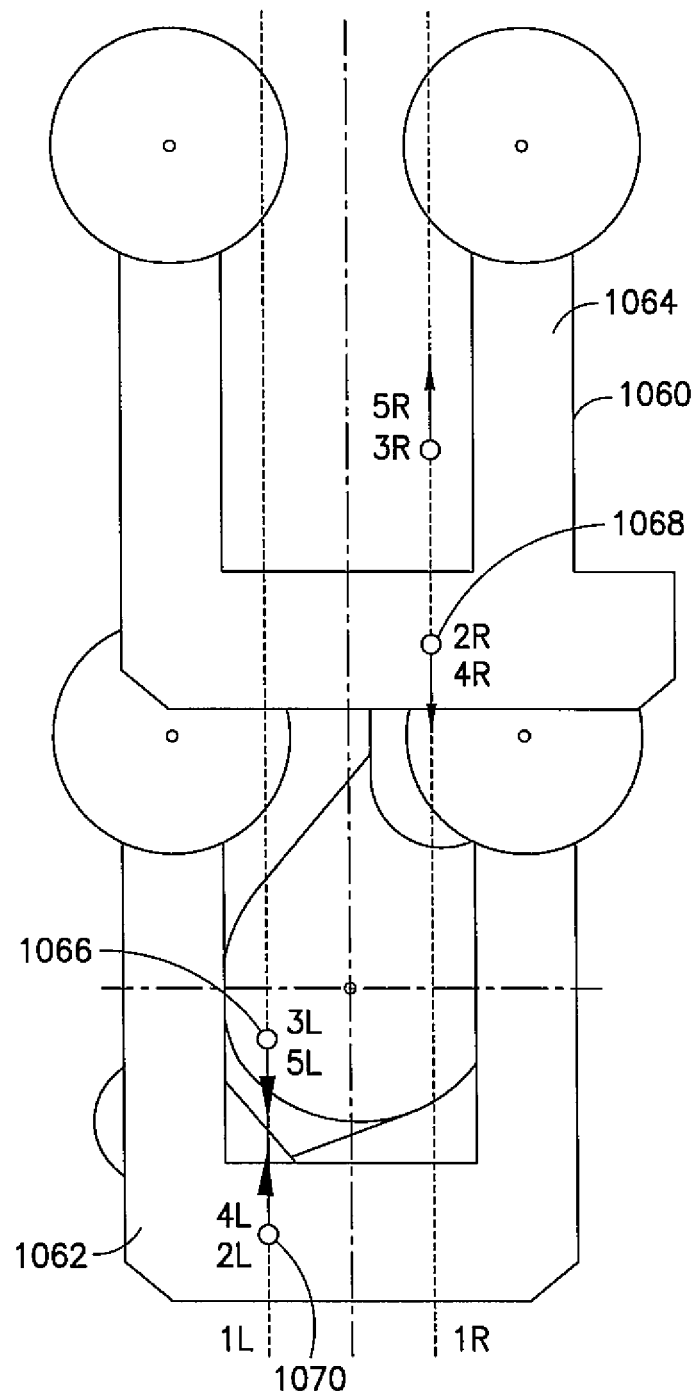
FIG. 62 is a top view of a transport apparatus.

By way of example with respect to FIG. 62 or otherwise, the third link and end-effector 1060, 1062, each of which may be referred to as a third-link assembly, may be designed so that the center of mass 1064, 1066 is on or close to the straight-line trajectory of the wrist joint 1068, 1070 respectively as the corresponding linkage of the arm extends and retracts. This reduces the moment due to the inertial force acting at the center of mass of the third-link assembly and the reaction force at the wrist joint, thus reducing the load on the band arrangement that constraints the third-link assembly. Here, the third-link assembly may further be designed so that its center of mass is on one side of the wrist joint trajectory when payload is present and on the other side of the trajectory when no payload is present. Alternatively, the third-link assembly may be designed so that its center of mass is substantially on the wrist joint trajectory when payload is present as the best straight-line tracking performance is typically required with the payload on, as illustrated in FIG. 62. In FIG. 62, 1L is the straight-line trajectory of the center of the wrist joint of the left linkage, 2L is the center 1070 of the wrist joint of the left linkage, 3L is the center of mass 1066 of the third-link assembly of the left linkage, 4L is the force acting on the third-link assembly of the left linkage as the left linkage accelerates at the beginning of an extend move (or decelerates at the end of a retract move), and 5L is the inertial force acting at the center of mass of the third-link assembly of the left linkage as the left linkage accelerates at the beginning of an extend move (or decelerates at the end of a retract move). Similarly, 1R is the straight-line trajectory of the center of the wrist joint of the right linkage, 2R is the center 1068 of the wrist joint of the right linkage, 3R is the center of mass 1064 of the third-link assembly of the right linkage, 4R is the force acting on the third-link assembly of the right linkage as the right linkage decelerates at the end of an extend move (or accelerates at the beginning of a retract move), and 5R is the inertial force acting at the center of mass of the third-link assembly of the right linkage as the right linkage decelerates at the end of an extend move (or accelerates at the beginning of a retract move). In the embodiment shown, dual wafer end effectors are provided. In alternate aspects, any suitable end effector and arm or link geometry may be provided.

In alternate aspects, the upper arms in any of the aspects of the embodiment can be driven by a motor either directly or via any kind of coupling or transmission arrangement. Any transmission ratio may be used. Alternately, the band drives that actuate the second link and constrain the third link can be substituted by any other arrangement of equivalent functionality, such as a belt drive, cable drive, circular and non-circular gears, linkage-based mechanisms or any combination of the above. Alternately, for example, in the dual and quad arm aspects of the embodiment, the third link of each linkage can be constrained to keep the end-effector radial via a conventional two stage band arrangement that synchronizes the third link to the pulley driven by the second motor, similarly to the single arm concept of FIG. 9. Alternatively, the two stage band arrangement can be substituted by any other suitable arrangement, such as a belt drive, cable drive, gear drive, linkage-based mechanism or any combination of the above. Alternately, the upper arms in the dual and quad arm aspects of the embodiment may not be arranged in a coaxial manner. They can have separate shoulder joints. The two linkages of the dual and quad arms do not need to have the same length of the upper arms and the same length of the forearms. The length of the upper arm of one linkage may be different from the length of the upper arm of the other linkage, and the length of the forearm of one linkage may be different from the length of the forearm of the other linkage. The forearm-to-upper-arm ratios can also be different for the two linkages. In the dual and quad arm aspects of the embodiment that have different elevations of the links of the left and right linkages, the left and right linkages can be interchanged. The two linkages of the dual and quad arms do not need to extend along the same direction. The arms can be configured so that each linkage extends in a different direction. The two linkages in any of the aspects of the embodiment may consist of more or less than three links (first link=upper arm, second link=forearm, third link=link with end-effector). In the dual and quad arm aspects of the embodiment, each linkage may have a different number of links. In the single arm aspects of the embodiment, the third link can carry more than one end-effector. Any suitable number of end-effectors and/or material holders can be carried by the third link. Similarly, in the dual arm aspects of the embodiment, each linkage can carry any suitable number of end-effectors. In either case, the end-effectors can be positioned in the same plane, stacked above each other, arranged in a combination of the two or arranged in any other suitable manner. Further, for dual arm configurations, each arm may be independently operable, for example, independently in rotation, extension and/or z (vertical), for example, as described with respect to pending U.S.

patent application Having Ser. No. 13/670,004 entitled "Robot System with Independent Arms" having filing date Nov. 6, 2012 which is herein incorporated by reference in its entirety. Accordingly all such modifications, combinations and variations are embraced.

In accordance with one aspect of the exemplary embodiment, a substrate transport apparatus is adapted to transport a substrate. The substrate transport apparatus has a moveable arm assembly coupled to the drive section on a central axis of rotation. A substrate support is coupled to the arm assembly on a wrist axis of rotation. The arm assembly rotates about the central axis of rotation during extension and retraction. The wrist axis of rotation moves along a wrist path parallel to and offset from a radial path relative to the central axis of rotation during extension and retraction. The substrate support moves parallel to the radial path during extension and retraction without rotation.

In accordance with another aspect of the exemplary embodiment, a substrate transport apparatus is adapted to transport first and second substrates. The substrate transport apparatus has first and second independently moveable arm assemblies coupled to the drive section on a common axis of rotation. First and second substrate supports are coupled to the first and second arm assemblies respectively on first and second wrist axis of rotation. The first and second arm assemblies rotate about the common axis of rotation during extension and retraction. The first and second wrist axis of rotation move along first and second wrist paths parallel to and offset from a radial path relative to the common axis of rotation during extension and retraction. The first and second substrate supports move parallel to the radial path during extension and retraction without rotation.

In accordance with another aspect of the exemplary embodiment, a substrate transport apparatus is adapted to transport a substrate. The substrate transport apparatus has a drive section and an upper arm rotatably coupled to the drive section, the upper arm rotatable about a central axis. An elbow pulley is fixed to the upper arm. A forearm is rotatably coupled to the upper arm, the forearm rotatable about an elbow axis, the elbow axis offset from the central axis by an upper arm link length. An end effector is rotatably coupled to the forearm, the end effector rotatable about a wrist axis, the wrist axis offset from the elbow axis by a forearm link length, the end effector supporting the substrate. A wrist pulley is fixed to the end effector, the wrist pulley coupled to the elbow pulley with a band. The forearm link length is different than the upper arm link length. The end effector is constrained with respect to the upper arm by the elbow pulley, the wrist pulley and the band such that the substrate moves along a linear radial path with respect to the central axis.

In accordance with another aspect of the exemplary embodiment, a substrate transport apparatus is adapted to transport a substrate. The substrate transport apparatus has a drive section having first and second rotary drives. An upper arm is rotatably coupled to the first rotary drive on a central axis of rotation. A forearm is rotatably coupled to the upper arm, the forearm rotatable about an elbow axis of rotation of the upper arm, the elbow axis of rotation offset from the central axis of rotation by an upper arm link length. The forearm is further coupled to the second rotary drive with a forearm coupling and driven about the elbow axis of rotation by the second rotary drive. A substrate support is supporting the substrate, the substrate support rotatably coupled to the forearm and rotatable about a wrist axis of rotation of the forearm, the wrist axis of rotation offset from the elbow axis of rotation by a forearm link length. The substrate support is further coupled to the upper arm with a substrate support coupling and driven about the wrist axis of rotation by relative movement between the forearm and the upper arm about the elbow axis of rotation. The forearm link length is different than the upper arm link length. The substrate support is constrained by the substrate support coupling such that the substrate moves along a linear path with respect to the central axis of rotation.

In accordance with another aspect of the exemplary embodiment, the linear path is along a direction that intersects the central axis of rotation.

In accordance with another aspect of the exemplary embodiment, the linear path is along a direction that is perpendicular to and offset with respect to the central axis of rotation.

In accordance with another aspect of the exemplary embodiment, the wrist axis of rotation moves along wrist path parallel to the linear path.

In accordance with another aspect of the exemplary embodiment, the substrate support coupling comprises a band drive having one or more non circular pulleys.

In accordance with another aspect of the exemplary embodiment, the forearm coupling comprises a band drive having one or more non circular pulleys.

In accordance with another aspect of the exemplary embodiment, a transport apparatus has a drive; a first arm connected to the drive, where the first arm comprises a first link, a second link and an end effector connected in series with the drive, where the first link and the second link have different effective lengths; and a system for limiting rotation of the end effector relative to the second link to provide substantially only straight movement of the end effector relative to the drive when the first arm is extended or retracted.

In accordance with another aspect of the exemplary embodiment, the effective length of the first link is shorter than the effective length of the second link.

In accordance with another aspect of the exemplary embodiment, the effective length of the first link is longer than the effective length of the second link.

In accordance with another aspect of the exemplary embodiment, the end effector comprises a lateral offset between a wrist joint with the second link and a centerline of a substrate support section which is about equal to a difference in the effective lengths of the first and second links.

In accordance with another aspect of the exemplary embodiment, the system for limiting rotation is configured to translate the end effector when the first arm is extended or retracted with the wrist joint being maintained at the lateral offset relative to a center axis of rotation of the drive.

In accordance with another aspect of the exemplary embodiment, the system for limiting rotation of the end effector provides substantially only radial movement of the end effector relative to the drive when the first arm is extended or retracted.

In accordance with another aspect of the exemplary embodiment, the system for limiting rotation of the end effector is configured to constrain orientation of the end effector such that the end effector points radially relative to the drive regardless of positions of the first and second links.

In accordance with another aspect of the exemplary embodiment, the end effector is configured to support at least two spaced substrates thereon, and where a lateral offset is provided between a wrist joint of the end effector with the second link and a center of a path of straight linear movement of the end effector, when the first arm is extended or retracted, for substantially translation only movement of the end effector when the first arm is extended or retracted with the wrist joint being maintained at the lateral offset relative to a center axis of rotation of the drive.

In accordance with another aspect of the exemplary embodiment, the system for limiting rotation comprises a band drive comprising pulleys and a band.

In accordance with another aspect of the exemplary embodiment, the pulleys comprise at least one non-circular pulley.

In accordance with another aspect of the exemplary embodiment, the pulleys comprise at least one pulley stationarily connected to the second link or the end effector.

In accordance with another aspect of the exemplary embodiment, the end effector comprises a substrate support section and a leg connecting the substrate support section to a wrist joint of the end effector with the second link, where the leg has a first section connected to the wrist joint, a second section connected to the substrate support section, and where the first and second sections are connected to each other at an angle of between about 90 degrees and about 120 degrees.

In accordance with another aspect of the exemplary embodiment, the end effector comprises two substrate support sections and a leg frame connecting the substrate support section to a wrist joint of the end effector with the second link, where the leg frame is substantially U-shaped with a base and two legs, where each leg is connected to a separate one of the substrate support sections, and where the wrist joint connects the end effector to the second link at a location offset from a center of the base.

In accordance with another aspect of the exemplary embodiment, a method is provided comprising: rotating a first link of an arm by a drive; rotating a second link of the arm when the first link is rotated, where the second link is rotated on the first link; and rotating an end effector on the second link, where the first and second links have different effective lengths, and where rotation of the end effector on the second link is constrained such that, when the arm is extended or retracted, the end effector is limited to substantially only straight movement relative to the drive.

In accordance with another aspect of the exemplary embodiment, the movement is radial movement relative to a center axis of the drive.

In accordance with another aspect of the exemplary embodiment, the end effector comprises a lateral offset between a wrist joint with the second link and a centerline of a substrate support section which is about equal to a difference in the effective lengths of the first and second links.

In accordance with another aspect of the exemplary embodiment, rotating the end effector on the second link results in translation motion only of the end effector when the first arm is extended or retracted with a wrist joint with the second link being maintained at a lateral offset relative to a center axis of rotation of the drive.

In accordance with another aspect of the exemplary embodiment, rotating the end effector provides substantially only radial movement of the end effector relative to the drive when the first arm is extended or retracted.

In accordance with another aspect of the exemplary embodiment, rotating the end effector constrains orientation of the end effector such that the end effector points radially relative to the drive regardless of positions of the first and second links.

In accordance with another aspect of the exemplary embodiment, a transport apparatus is provided having a drive; and an arm connected to the drive, where the arm comprises a first link connected to the drive at a first joint, a second link connected to the first link at a second joint, and an end effector connected to the second link at a third joint, where the first link comprises a first length between the first and second joints which is different from a second length of the second link between the second and third joints, where movement of the end effector at the third joint is constrained to track in a substantially straight radial line relative to the center of rotation of the drive during extending and retracting of the arm.

In accordance with one example embodiment, a transport apparatus comprises a drive; a first arm connected to the drive, where the first arm comprises a first link, a second link and an end effector connected in series with the drive, where the first link and the second link have different effective lengths; and a system for limiting rotation of the end effector relative to the second link to provide substantially only straight movement of the end effector relative to the drive when the first arm is extended or retracted.

The effective length of the first link may be shorter than the effective length of the second link. The effective length of the first link may be longer than the effective length of the second link. The end effector may comprise a lateral offset between a wrist joint with the second link and a centerline of a substrate support section which is about equal to a difference in the effective lengths of the first and second links. The system for limiting rotation may be configured to translate the end effector when the first arm is extended or retracted with the wrist joint being maintained at the lateral offset relative to a center axis of rotation of the drive. The system for limiting rotation of the end effector may provide substantially only radial movement of the end effector relative to the drive when the first arm is extended or retracted. The system for limiting rotation of the end effector may be configured to constrain orientation of the end effector such that the end effector points radially relative to the drive regardless of positions of the first and second links. The end effector may be configured to support at least two spaced substrates thereon, and where a lateral offset is provided between a wrist joint of the end effector with the second link and a center of a path of straight linear movement of the end effector, when the first arm is extended or retracted, for substantially translation only movement of the end effector when the first arm is extended or retracted with the wrist joint being maintained at the lateral offset relative to a center axis of rotation of the drive. The system for limiting rotation may comprise a band drive comprising pulleys and a band. The pulleys may comprise at least one non-circular pulley. The pulleys may comprise at least one pulley stationarily connected to the second link or the end effector. The end effector may comprise a substrate support section and a leg connecting the substrate support section to a wrist joint of the end effector with the second link, where the leg has a first section connected to the wrist joint, a second section connected to the substrate support section, and where the first and second sections are connected to each other at an angle of between about 90 degrees and about 120 degrees. The end effector may comprise two substrate support sections and a leg frame connecting the substrate support section to a wrist joint of the end effector with the second link, where the leg frame is substantially U-shaped with a base and two legs, where each leg is connected to a separate one of the substrate support sections, and where the wrist joint connects the end effector to the second link at a location offset from a center of the base.

One type of example method may comprise rotating a first link of an arm by a drive; rotating a second link of the arm when the first link is rotated, where the second link is rotated on the first link; and rotating an end effector on the second link, where the first and second links have different effective lengths, and where rotation of the end effector on the second link is constrained such that, when the arm is extended or retracted, the end effector is limited to substantially only straight movement relative to the drive.

The movement may be radial movement relative to a center axis of the drive. The end effector may comprise a lateral offset between a wrist joint with the second link and a centerline of a substrate support section which is about equal to a difference in the effective lengths of the first and second links. Rotating the end effector on the second link may result in translation motion only of the end effector when the first arm is extended or retracted with a wrist joint with the second link being maintained at a lateral offset relative to a center axis of rotation of the drive. The end effector may provide substantially only radial movement of the end effector relative to the drive when the first arm is extended or retracted. Rotating the end effector may constrain orientation of the end effector such that the end effector points radially relative to the drive regardless of positions of the first and second links.

One type of example embodiment may be provided in a transport apparatus comprising a drive; and an arm connected to the drive, where the arm comprises a first link connected to the drive at a first joint, a second link connected to the first link at a second joint, and an end effector connected to the second link at a third joint, where the first link comprises a first length between the first and second joints which is different from a second length of the second link between the second and third joints, where movement of the end effector at the third joint is constrained to track in a substantially straight radial line relative to the center of rotation of the drive during extending and retracting of the arm.

Figure 63:
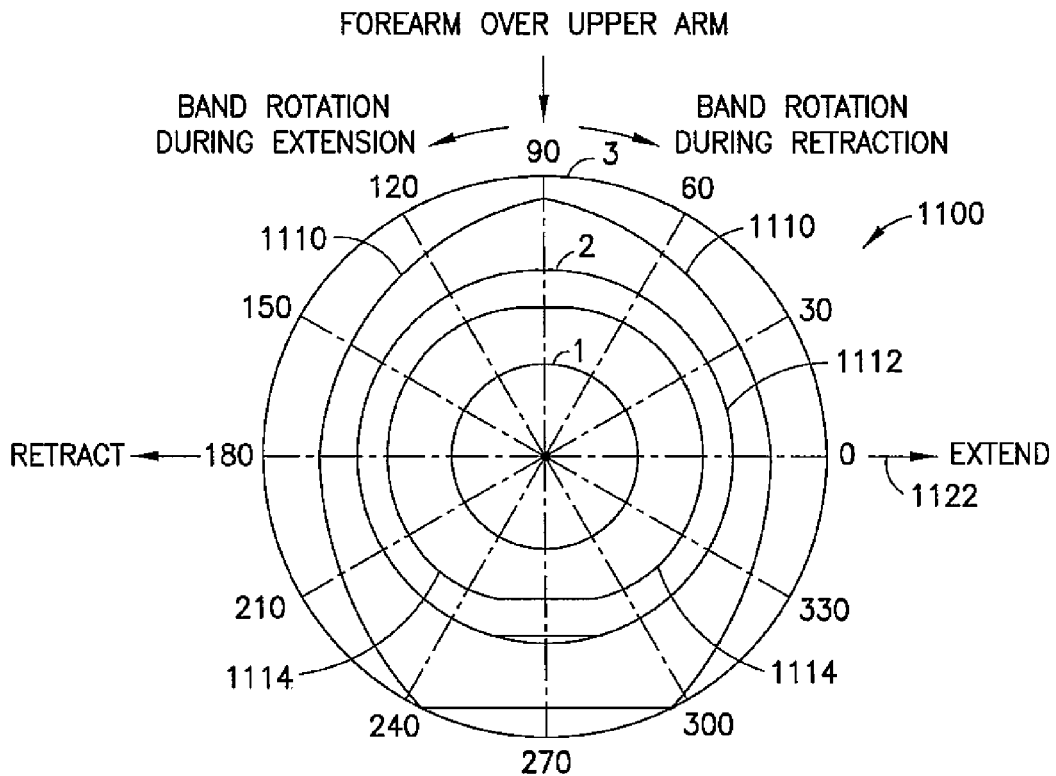
FIG. 63 is a diagram illustrating exemplary pulleys.

Referring now to FIG. 63, there is shown a graphical representation 1100 of exemplary pulleys. The exemplary pulley profiles may be for an arm with unequal link lengths as will be described. By way of example, the graph 1100 may show profiles for a wrist pulley where the elbow pulley is circular. Here, the following example design was used for the figure: Re/l2=0.2 where Re is the radius of the elbow pulley and l2 is the joint-to-joint length of the forearm. Alternately, any suitable ratio may be provided. For the purpose of clarity, the graph shows extreme design cases in comparison with a pulley for an equal-link arm. The most outer profile 1110 is for l2/l1=2, where l2 is the joint-to-joint length of the forearm and l1 is the joint-to-joint length of the upper arm, for example, this case represents a longer forearm. The middle profile 1112 is for l2/l1=1, for example, a case with equal link lengths. The most inner profile 1114 is for l2/l1=0.5, for example, this case represents a shorter forearm. In the embodiment shown, a polar coordinate system 1120 is used. Here, the radial distance is normalized with respect to the radius of the elbow pulley, for example, expressed as a multiple of the radius of the elbow pulley. In other words, Rw/Re is shown, where Rw represents polar coordinates of the wrist pulley with Re representing the elbow pulley. The angular coordinates are in deg, and the zero points along the direction 1122 of the end-effector, for example, the end-effector points to the right with respect to the figure.

Figures 64, 65:
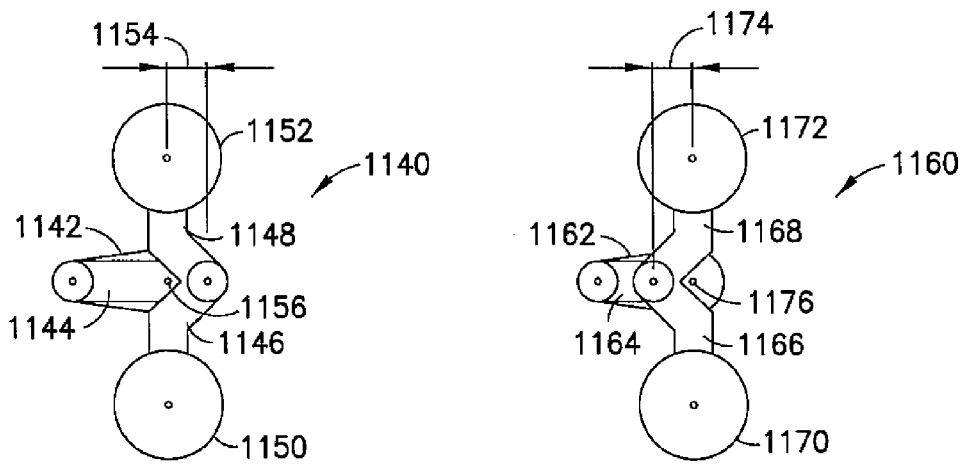
FIG. 64 is a top view of a transport apparatus.
FIG. 65 is a copy view of a transport apparatus.

Referring now to FIGS. 64 and 65, there is shown two additional configurations of the arm with unequal link lengths 1140 and 1150. Arm 1140 is shown with a forearm 1144 longer than upper arm 1142 where the single arm configuration may utilize the features as disclosed with respect to FIGS. 1-4 and 5-8 or otherwise. In the embodiment shown, two end-effectors 1146, 1148 supporting respective substrates 1150, 1152 are connected rigidly to each other and pointing in opposing directions. The substrates travel in a radial path that coincides with the center 1156 of robot 1140 and offset 1154 from the wrist as shown. Similarly, arm 1160 is shown with a forearm 1164 shorter than upper arm 1162 where the single arm configuration may utilize the features as disclosed with respect to FIGS. 1-4 and 5-8 or otherwise. In the embodiment shown, two end-effectors 1166, 1168 supporting respective substrates 1170, 1172 are connected rigidly to each other and pointing in opposing directions. The substrates travel in a radial path that coincides with the center 1176 of robot 1160 and offset 1174 from the wrist as shown. Here, the features of the disclosed embodiments may be similarly shared with any of the other disclosed embodiments.

Figure 66A:
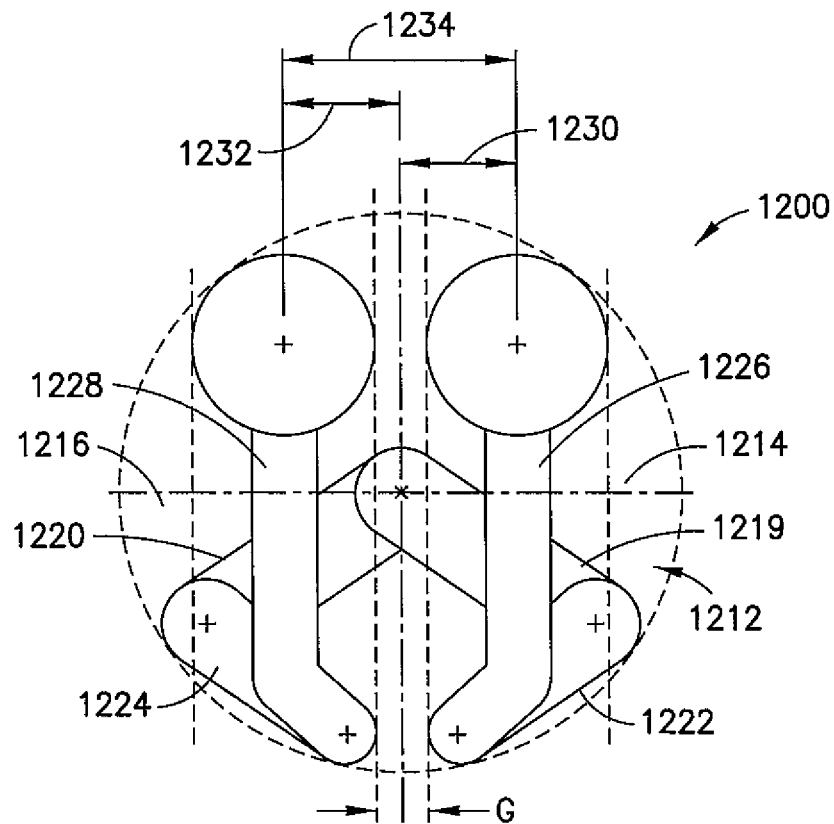
FIG. 66A is a top view of an example substrate transport robot.
Figure 66B:
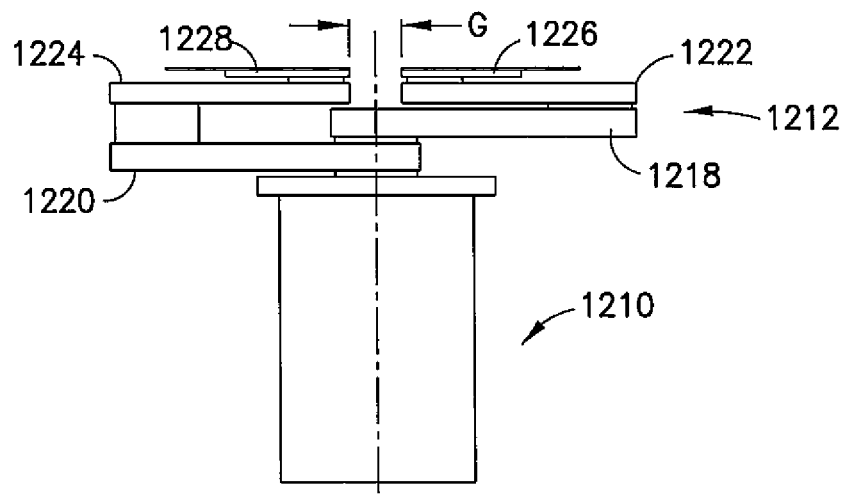
FIG. 66B is a side view of an example substrate transport robot.
Figure 68A:
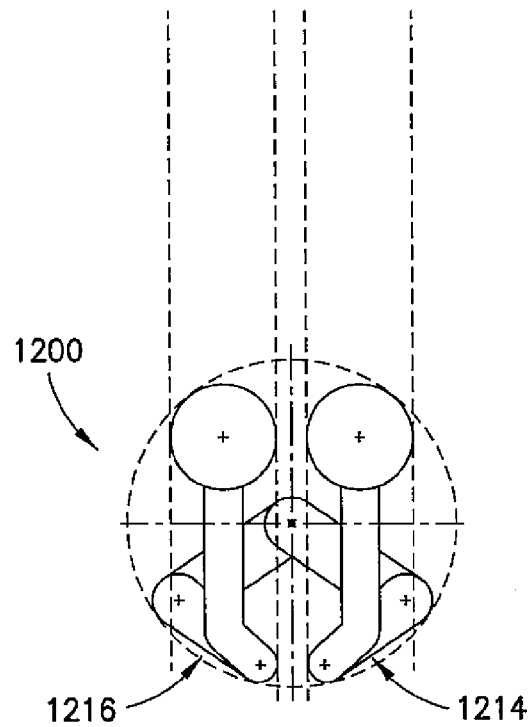
FIGS. 68A-68B are top views of an example substrate transport robot.
Figure 68B:
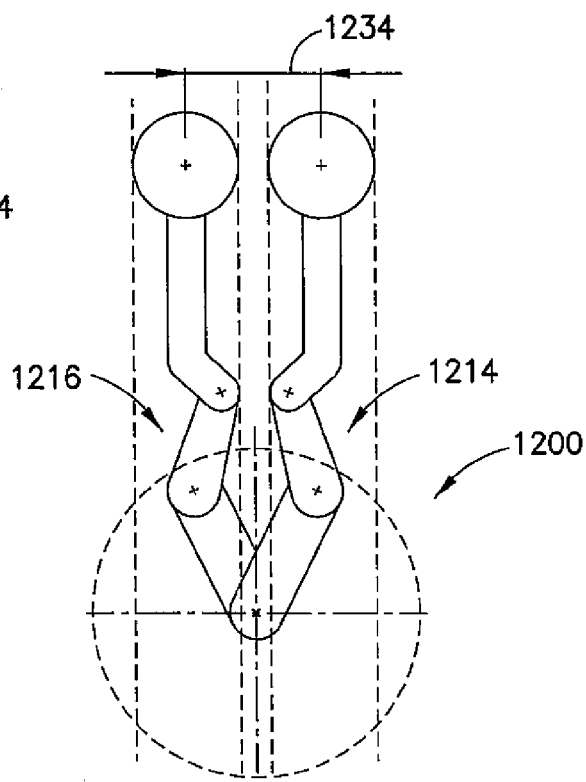

Referring to FIG. 66A, there is shown a schematic top plan view of an example substrate transport robot 1200. Robot 1200 may be a vacuum compatible or any suitable robot having drive portion 1210 and arm portion 1212 coupled to drive portion 1210 as will be described in greater detail below. In the embodiments shown throughout, the upper arm link lengths and forearm link lengths may be different and driven by circular or non circular pulleys, for example, as previously described. In alternate aspects, arms with the same link lengths or arms with unequal link lengths and having circular pulleys or other suitable driving arrangements may be provided, for example, with any suitable configuration disclosed. FIGS. 66A and 66B show top and side views respectively of robot 1200 with arm 1212. The drive unit 1200 may provide four coaxial drive shafts such that first and second 1214, 1216 portions of arm 1212 may be driven independently. A suitable drive with four coaxial axis is shown by way of example in FIG. 70B. Here, arm 1212 features two independent linkages, upper 1214 and lower 1216. The upper linkage 1214 may be driven by the two inner-most drive shafts of drive 1210, the lower linkage 1216 may be driven by the two outer-most drive shafts of drive 1210. The linkages are shown in their retracted positions in FIGS. 67A and 68A. Each of the two linkages 1214, 1216 consists of a first link (upper arm 1218, 1220) a second link (forearm 1222, 1224) and a third link (end-effector 1226, 1228). The joint-to-joint length of the second link is shown smaller than the joint-to-joint length of the first link. The lateral offset of the third link 1230, 1232 corresponds to the difference of the joint-to-joint lengths of the forearm and upper arm and an additional offset totaling an offset between the two arms 1234. The offset 1234 may correspond to the nominal center distance between substrates in a two station process module where the lateral offsets 1230, 1232 may be half the total center distance 1234. The offsets 1230, 1232 combined with the shorter forearms form a gap G such that arms 1214, 1216 may extend or retract without interfering with anything physically in the gap G, for example, the chamber material between slit valves in a quad application. Alternately, any suitable offset(s) may be provided. Here, end effectors 1228, 1226 may nominally extend and retract nominally parallel to each other without rotation. Because the end effectors 1228, 1226 are also independently positionable, the substrates thereon may be independently placed or picked. Referring also to FIGS. 68A-68B there are shown top views of the example substrate transport robot 1200. FIG. 68A shows robot 1200 retracted whereas FIG. 68B shows robot 1200 extended. Robot 1200 described has arms 1214, 1216 that are independently positionable. In an alternate embodiment, arms 1214, 1216 may be driven by 2 coaxial shafts and be dependent on each other. An example drive configuration is described with respect to FIG. 80B where two coaxial set of drive shafts drives two sets of arms. Here, one of the coaxial drive shafts may be provided to drive arms 1214, 1216 by way of example. Referring also to FIGS. 67A-67C there is shown an alternate robot configuration 1200'. Robot 1200' has arms 1214' and 1216' and may have features similar to that of robot 1200. Here, the arms of robot 1200' may be independently extended and retracted however they rotate together. Instead of a four coaxial axis drive, robot 1200' utilizes a drive with three coaxial axis. A suitable drive and pulley arrangement is shown with respect to FIGS. 23 and 24 or 33 and 34. In alternate aspects any suitable drive and pulley arrangement may be provided, for example, where the upper arms are constrained to each other as disclosed.

Figure 69A:
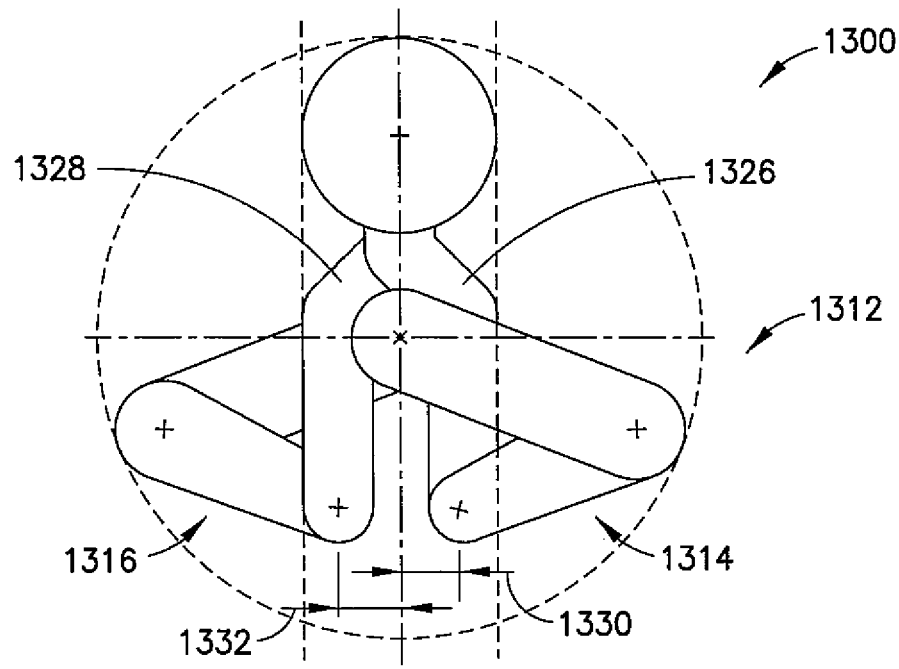
FIG. 69A is a top view of an example substrate transport robot.
Figure 69B:
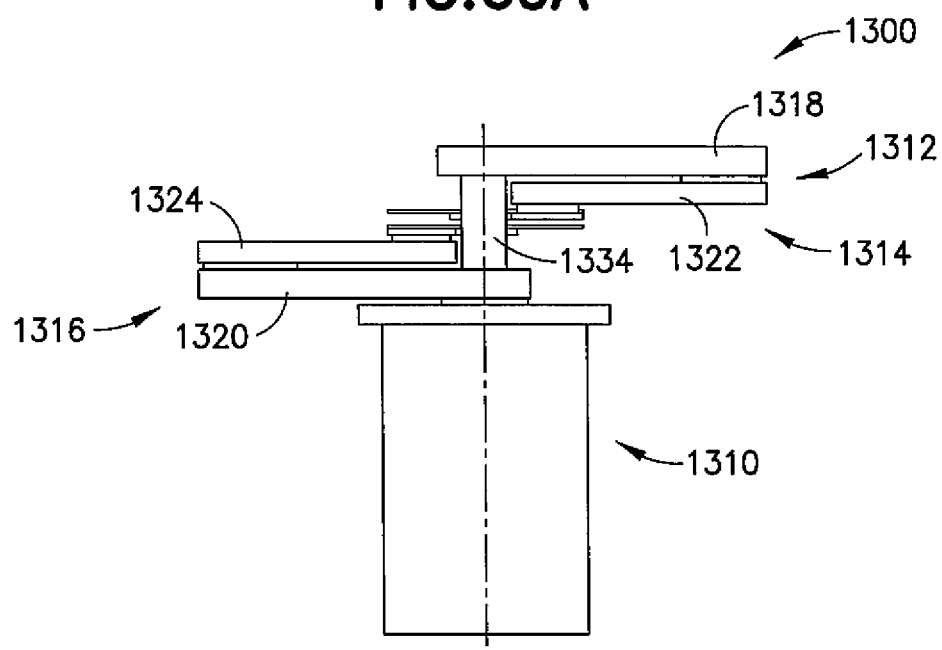
FIG. 69B is a side view of an example substrate transport robot.

Referring to FIG. 69A, there is shown a schematic top plan view of an example substrate transport robot 1300. Robot 1300 may be a vacuum compatible or any suitable robot having drive portion 1310 and arm portion 1312 coupled to drive portion 1310 as will be described in greater detail below. In the embodiments shown throughout, the upper arm link lengths and forearm link lengths may be different and driven by circular or non circular pulleys. In alternate aspects, arms with the same link lengths or arms with unequal link lengths and having circular pulleys or other suitable driving arrangements may be provided. FIGS. 69A and 69B show top and side views respectively of robot 1300 with arm 1312. The drive unit 1310 may provide four coaxial drive shafts such that first and second 1314, 1316 portions of arm 1312 may be driven independently. Here, arm 1312 features two independent linkages, upper 1314 and lower 1316. The upper linkage 1314 may be driven by the two inner-most drive shafts of drive 1310, the lower linkage 1316 may be driven by the two outer-most drive shafts of drive 1310. The linkages are shown in their retracted positions in FIG. 69A. Each of the two linkages 1314, 1316 consists of a first link (upper arm 1318, 1320) a second link (forearm 1322, 1324) and a third link (end-effector 1326, 1328). The joint-to-joint length of the second link is smaller than the joint-to-joint length of the first link. The lateral offset of the third link 1330, 1332 corresponds to the difference of the joint-to-joint lengths of the forearm and upper arm. The third link is shaped to provide space for the two inner-most drive shafts 1334.

Referring also to FIGS. 70A and 70B, there is shown an example internal arrangement used to drive the individual links of each linkage. The arrangement will be described for the upper linkage. An equivalent arrangement may be used in the lower linkage. The upper arm 1318 of the upper linkage 1314 may be driven by one motor 1350. The forearm 1322 of the upper linkage 1314 may be driven by another motor 1352 through a band drive 1354 with conventional pulleys. The third link with the end-effector 1326 may be constrained by a band drive 1356 with at least one non-circular pulley, which compensates for the effects of the unequal lengths of the upper arm and forearm so that the end-effector points radially regardless of the position of the first two links. The design of the band drive may be according to that shown in FIGS. 1-4. In order for the upper linkage to rotate, both drive shafts associated with the linkage need to move in the direction of rotation of the linkage by the same amount. In order for the end-effector to extend and retract radially along a straight-line path, the two drive shafts need to move in a coordinated manner in accordance with inverse kinematic equations, for example, as presented in Equations (1.8) to (1.16). In alternate aspects, any suitable arm arrangement may be used, for example, as disclosed with respect to FIGS. 66-68 with offset end effectors or otherwise.

Figure 71A:
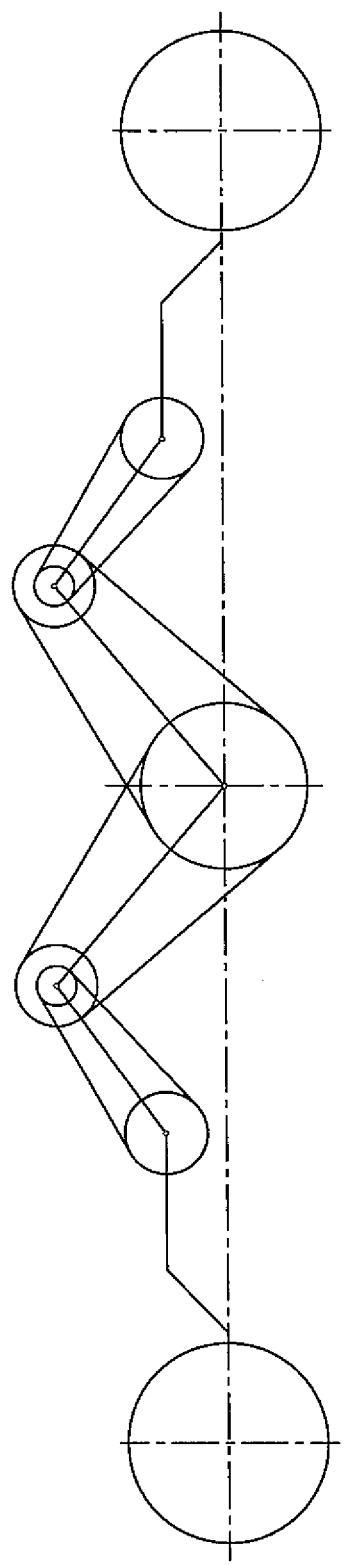
FIG. 71A is a top schematic view of an example substrate transport robot.
Figure 71B:
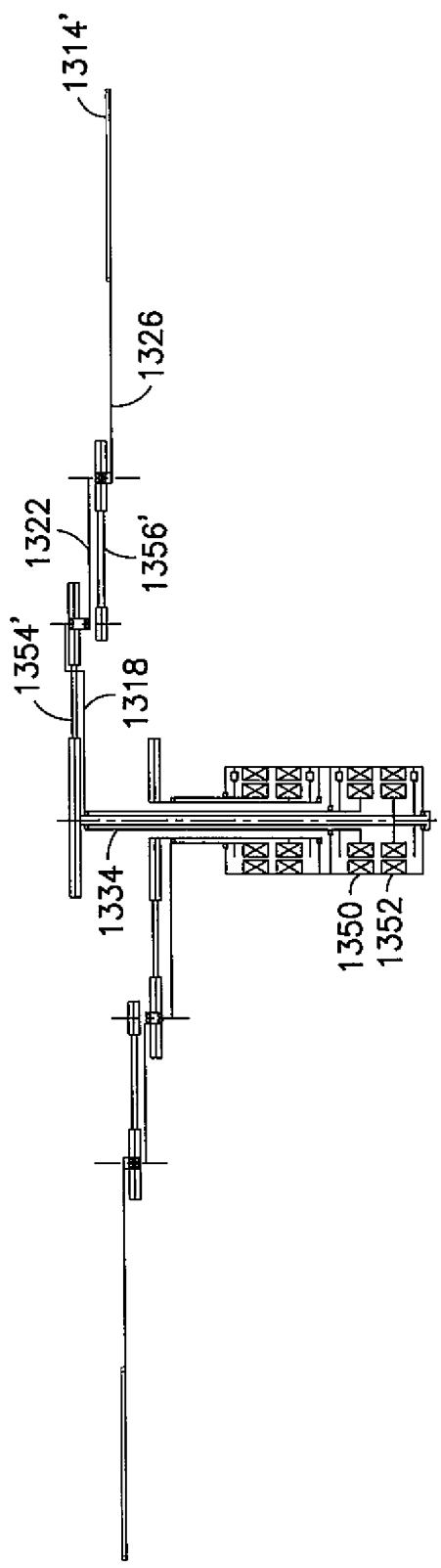
FIG. 71B is a section schematic view of an example substrate transport robot.

Referring also to FIGS. 71A and 71B, there is shown another example internal arrangement used to drive the individual links of each linkage. Again, the arrangement will be described for the upper linkage 1314'. An equivalent arrangement may used in the lower linkage. Here, the upper arm 1318 of the upper linkage 1314' is driven by one motor 1350. The forearm 1322 of the upper linkage 1314' is coupled via a band arrangement 1354' with at least one non-circular pulley to another motor 1352. The band drive 1354' is designed so that rotation of the upper arm causes the wrist joint to extend and retract along a straight line parallel to the desired radial path of the end-effector. The third link with the end-effector 1326 is constrained by a band drive 1356' with at least one non-circular pulley so that the end-effector points radially regardless of the position of the first two links. The band drives may be designed according to FIGS. 5-8. In order for the upper linkage 1314' to rotate, both drive shafts associated with the linkage may move in the direction of rotation of the linkage by the same amount. In order for the end-effector 1326 to extend and retract radially along a straight-line path, the drive shaft coupled to the upper arm of the upper linkage needs to move according to the inverse kinematic equations presented in Equations (2.8) to (2.15) while the other motor associated with the upper linkage is kept stationary. In alternate aspects, any suitable driving arrangement may be provided.

Figures 72A, 72B, 72C:
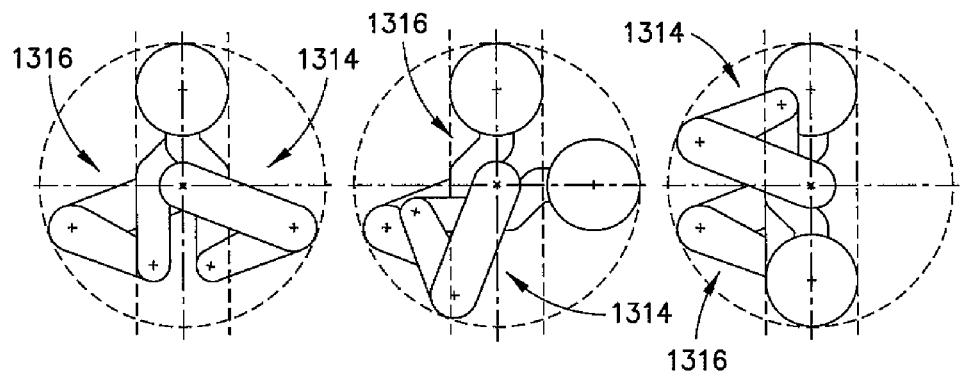
FIGS. 72A-72C are top views of an example substrate transport robot.
Figures 73A, 73B, 73C:
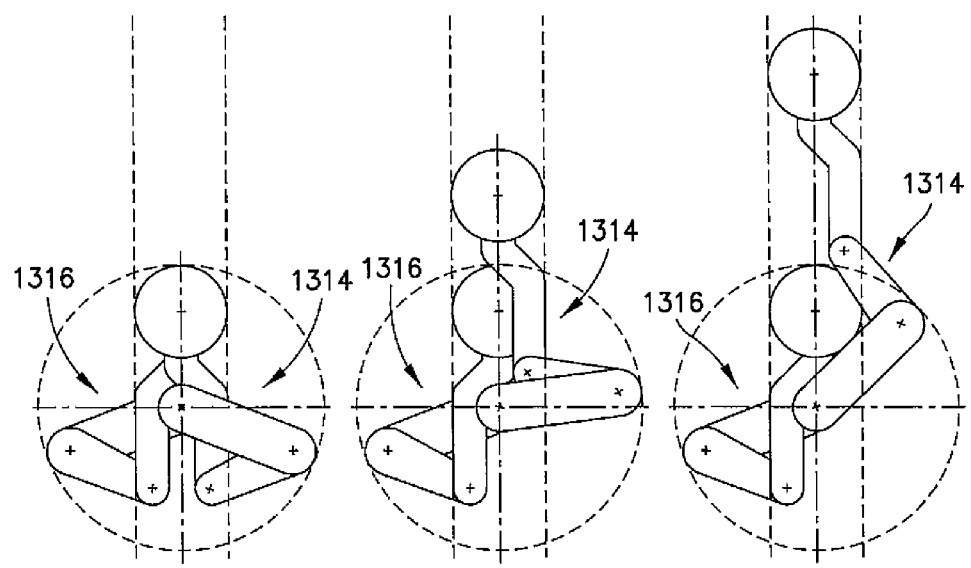
FIGS. 73A-73C are top views of an example substrate transport robot.

FIGS. 72A-72C and 73A-73C illustrate independent operation of the two linkages of the robot of FIG. 69. In particular, FIGS. 72A-72C and FIGS. 73A-73C show independent rotary and extension motions respectively of the two linkages 1314, 1316. FIGS. 72A-72C illustrate rotary motion of the upper linkage 1314 of the robot 1300 of FIG. 69. FIG. 72A shows a top view of the robot with both linkages in their retracted position. FIG. 72B depicts a top view of the robot with the upper linkage 1314 rotated by 90 deg in the clockwise direction. FIG. 72C shows top view of the robot with the upper linkage 1314 rotated by 180 deg. FIGS. 73A-73C depict extension motion of the robot 1300 of FIG. 69. FIG. 73A shows a top view of the robot with both linkages in their retracted position. FIG. 73B shows a top view of the robot with the upper linkage 1314 partially extended. FIG. 73C shows a top view of the robot with the upper linkage 1314 in an extended position.

Figure 74A:
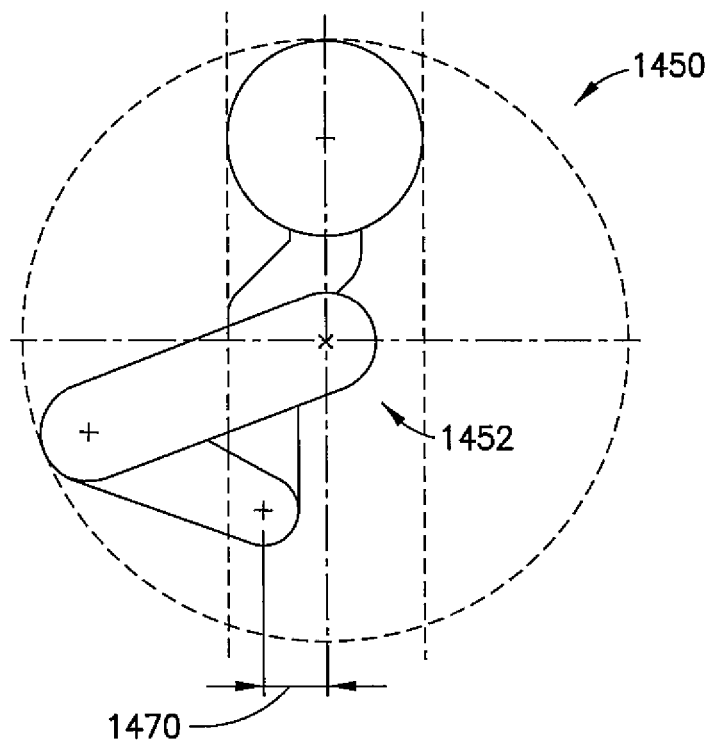
FIG. 74A is a top view of an example substrate transport robot.
Figure 74B:
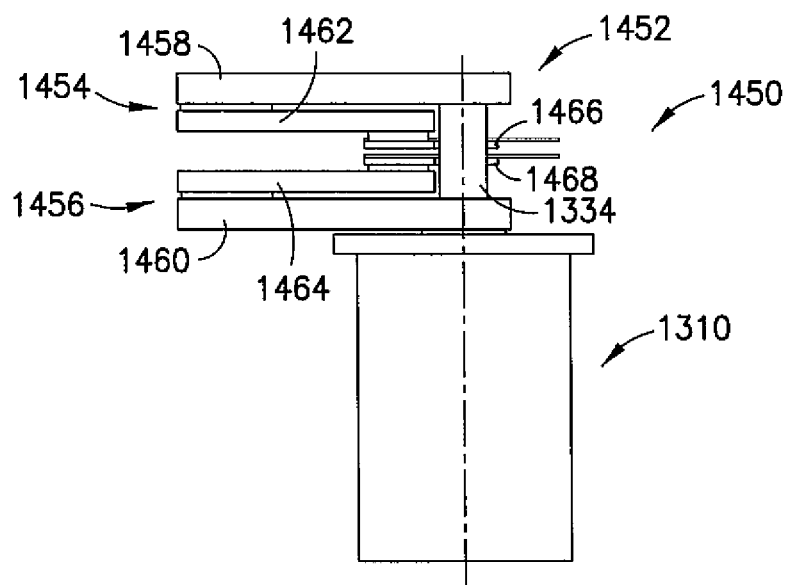
FIG. 74B is a side view of an example substrate transport robot.

An alternate example aspect of the disclosed embodiment is shown in FIGS. 74A and 74B where robot 1450 is shown having drive 1310 and arm 1452. Here, two linkages 1454, 1456 of arm 1452 may be arranged according to FIGS. 74A and 74B, which shows top and side views of robot 1450. Here, drive unit 1310 of the robot provides four coaxial drive shafts. The arm 1452 features two independent linkages, upper 1454 and lower 1456. The upper linkage 1454 may be driven by the two inner-most drive shafts 1334, the lower linkage may be driven by the two outer-most drive shafts of drive 1310. The linkages are shown in their retracted positions in FIG. 74A. Each of the two linkages 1454, 1456 may consist of a first link (upper arm) 1458, 1460 a second link (forearm) 1462, 1464 and a third link (end-effector) 1466, 1468. The joint-to-joint length of the second link may be smaller than the joint-to-joint length of the first link. The lateral offset 1470 of the third link corresponds to the difference of the joint-to-joint lengths of the forearm and upper arm. The third link is shaped to provide space for the two inner-most drive shafts 1334.

FIGS. 75A and 75B show an example internal arrangement used to drive the individual links of each linkage. The arrangement will be described for the upper linkage 1454. An equivalent arrangement may be used in the lower linkage 1456. The upper arm 1458 of the upper linkage 1454 may be driven by one motor 1350. The forearm 1362 of the upper linkage 1454 may be driven by another motor 1352 through a band drive 1472 with conventional pulleys. The third link with the end-effector 1466 may be constrained by a band drive 1474 with at least one non-circular pulley, which compensates for the effects of the unequal lengths of the upper arm and forearm so that the end-effector points radially regardless of the position of the first two links. The design of the band drive may be according to FIGS. 1-4. In order for the upper linkage 1454 to rotate, both drive shafts associated with the linkage need to move in the direction of rotation of the linkage by the same amount. In order for the end-effector to extend and retract radially along a straight-line path, the two drive shafts need to move in a coordinated manner in accordance with the inverse kinematic equations presented in Equations (1.8) to (1.16).

Figure 76A:
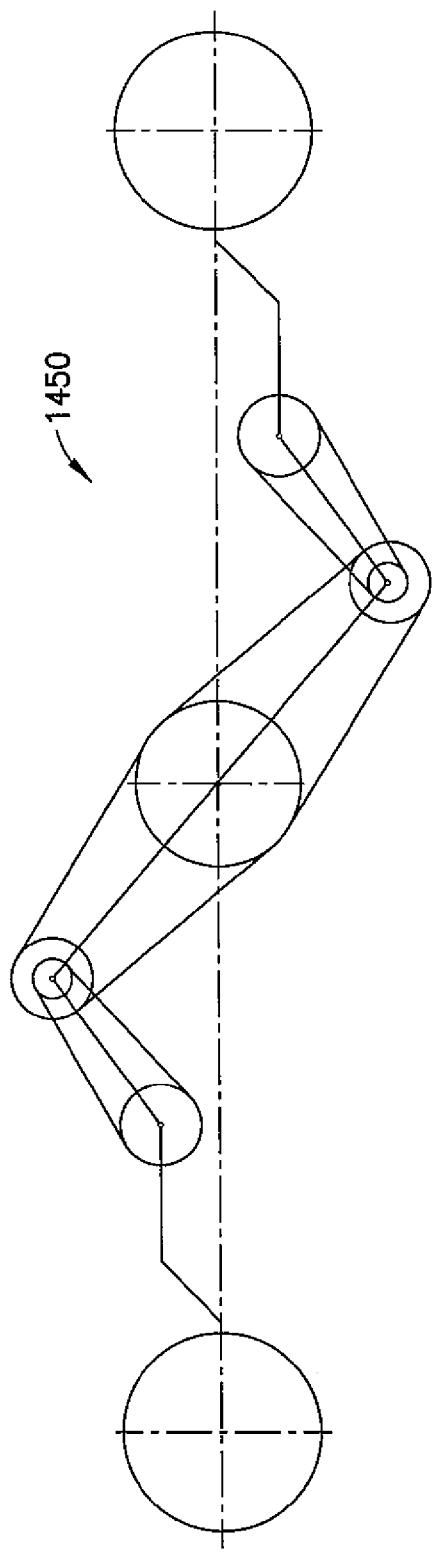
FIG. 76A is a top schematic view of an example substrate transport robot.
Figure 76B:
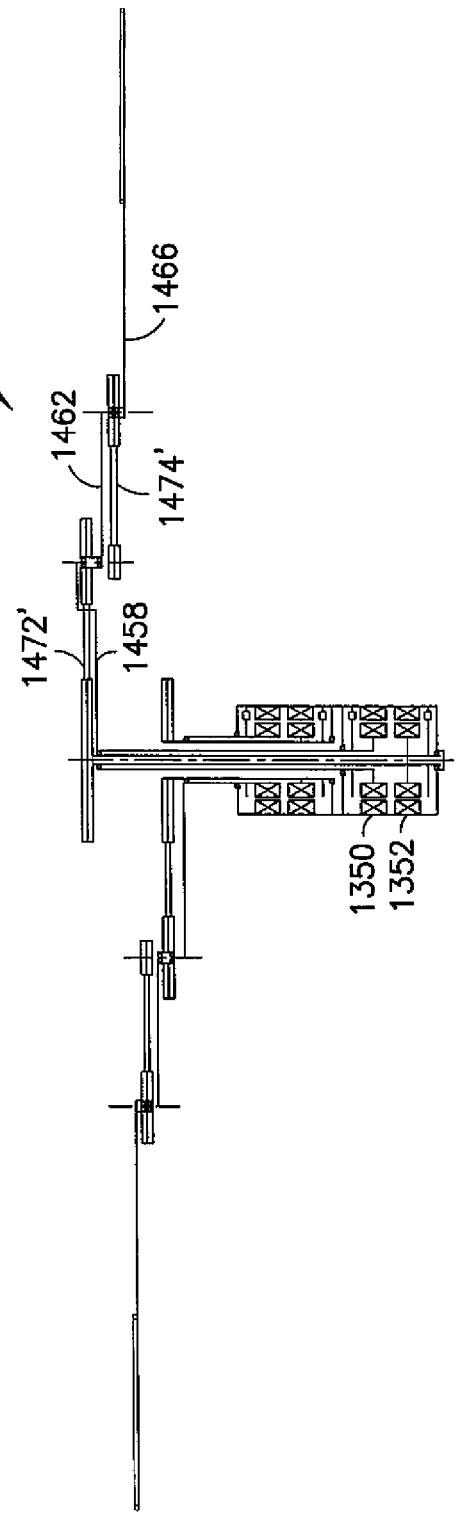
FIG. 76B is a section schematic view of an example substrate transport robot.

FIGS. 76A and 76B show another example internal arrangement used to drive the individual links of each linkage. Here, the arrangement will be described for the upper linkage 1454. An equivalent arrangement may be used in the lower linkage 1456. The upper arm 1458 of the upper linkage may be driven by one motor 1350. The forearm 1462 of the upper linkage 1454 may be coupled via a band arrangement 1472' with at least one non-circular pulley to another motor 1352. The band drive is designed so that rotation of the upper arm 1458 causes the wrist joint to extend and retract along a straight line parallel to the desired radial path of the end-effector 1466. The third link with the end-effector 1466 is constrained by a band drive with at least one non-circular pulley so that the end-effector points radially regardless of the position of the first two links. The band drives may be designed according to FIGS. 5-8. In order for the upper linkage 1454 to rotate, both drive shafts associated with the linkage may move in the direction of rotation of the linkage by the same amount. In order for the end-effector 1466 to extend and retract radially along a straight-line path, the drive shaft coupled to the upper arm of the upper linkage needs to move according to the inverse kinematic equations presented in Equations (2.8) to (2.15) while the other motor associated with the upper linkage is kept stationary.

Figures 77A, 77B, 77C:
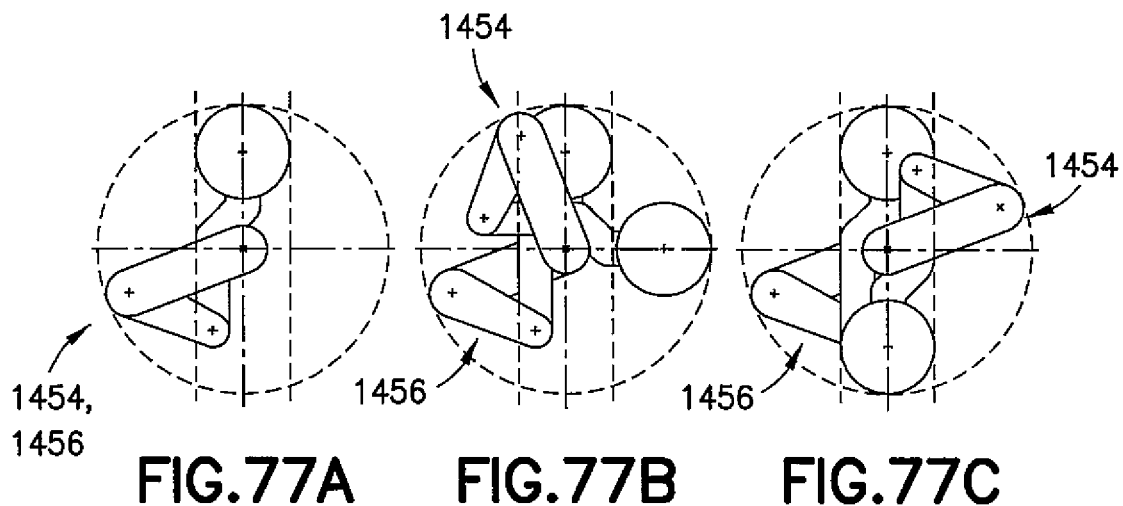
FIGS. 77A-77C are top views of an example substrate transport robot.
Figures 78A, 78B, 78C:
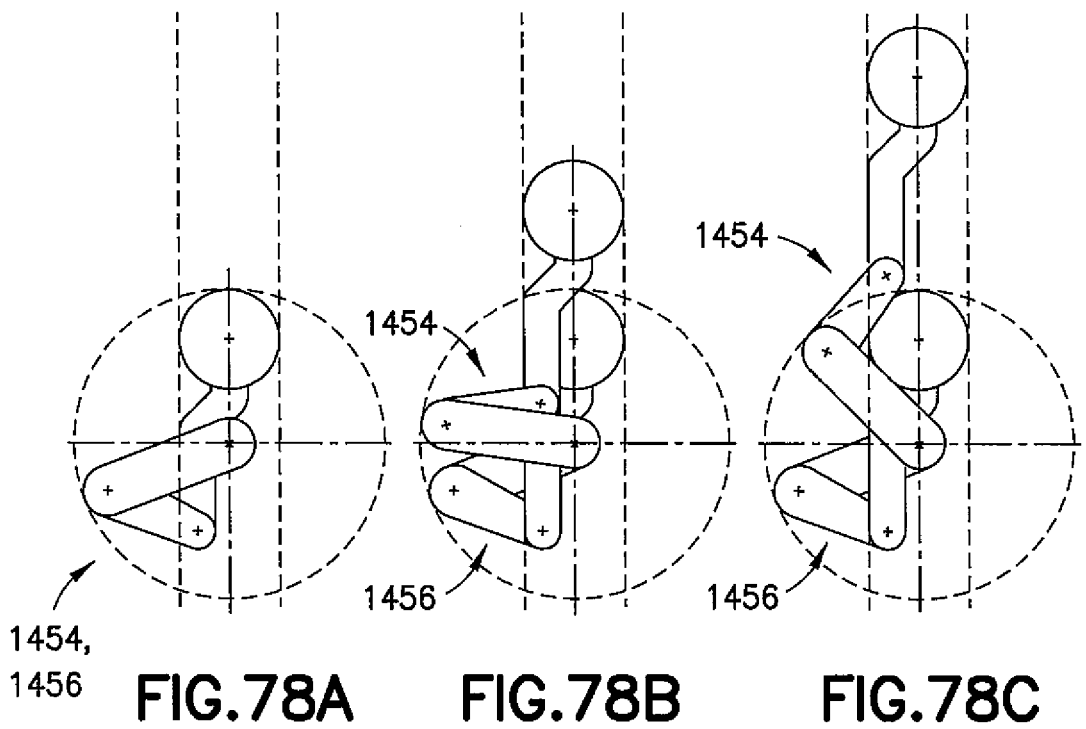
FIGS. 78A-78C are top views of an example substrate transport robot.

FIGS. 77A-C and 78A-C illustrate independent operation of the two linkages 1454, 1456 of the robot of FIGS. 74A and 74B. In particular, FIGS. 77A-C and FIGS. 78A-C show independent rotary and extension motions of the two linkages 1454, 1456. FIGS. 77A-C illustrate rotary motion of the upper linkage of the robot. FIG. 77A shows a top view of the robot with both linkages in their retracted position. FIG. 77B shows a top view of the robot with the upper linkage 1454 rotated by 90 deg in the clockwise direction. FIG. 77C shows a top view of the robot with the upper linkage 1454 rotated by 180 deg. FIGS. 78A-C shows extension motion of the robot of FIGS. 74A and 74B. FIG. 78A shows a top view of the robot with both linkages in their retracted position. FIG. 78B shows a top view of the robot with the upper linkage partially extended. FIG. 78C shows a top view of the robot with the upper linkage 1454 in an extended position (not full extension).

Alternative embodiments of the above dual linkage arrangements may also be provided. For example, the first link may be driven by a motor either directly or via any kind of coupling or transmission arrangement. Any transmission ratio can be used. As a further example, the band drive that actuates the second link may be substituted by any other arrangement with an equivalent functionality, such as a belt drive, cable drive, gear drive, linkage-based mechanism or any combination of the above. Similarly, the band drive that constrains the third link may be substituted by any other suitable arrangement, such as a belt drive, cable drive, non-circular gears, linkage-based mechanism or any combination of the above. Here, the end-effector does not need to point radially. It can be positioned with respect to the third link with any suitable offset and point in any suitable direction. Also, the third link may carry more than one end-effector. Any suitable number of end-effectors and/or material holders can be carried by the third link. As a further example, any order of the vertical arrangement of the individual links and end-effectors may be used. For example, the end-effector of the upper linkage may be located above the upper linkage as opposed to being sandwiched between the two linkages.

Figure 79A:
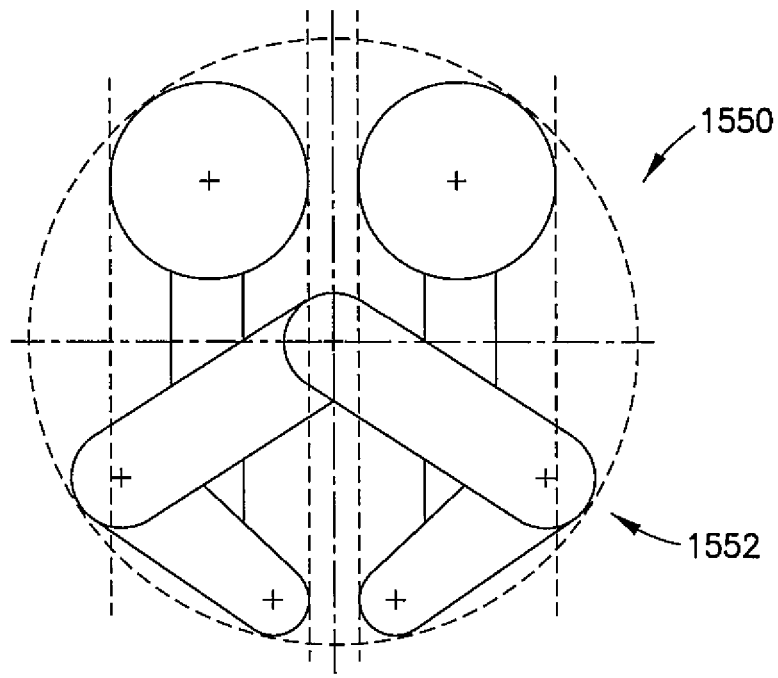
FIG. 79A is a top view of an example substrate transport robot.
Figure 79B:
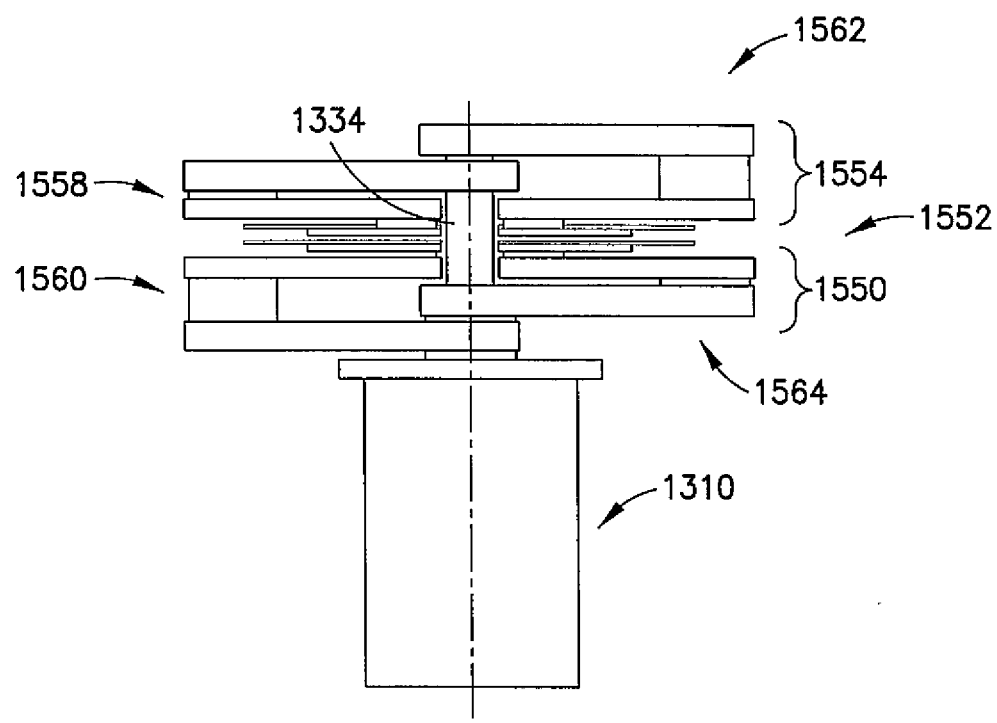
FIG. 79B is a side view of an example substrate transport robot.

Referring now to FIGS. 79A and 79B, there is shown top and side views of robot 1550 with arm 1552 and drive 1310. The drive unit 1310 provides four coaxial drive shafts. The arm features two independent pairs of linkages, an upper linkage pair 1554 and a lower linkage pair 1556. The upper linkage pair 1554 is driven by the two inner-most drive shafts 1334, the lower linkage pair is driven by the two outer-most drive shafts. The linkages are shown in their retracted positions in FIG. 79A. Each of the two linkage pairs 1554, 1556 consists of two linkages, a left linkage 1558, 1560 and a right linkage 1562, 1564. Each of the linkages includes a first link (upper arm) a second link (forearm) and a third link (end-effector). The joint-to-joint length of the second link is smaller than the joint-to-joint length of the first link. The difference of the joint-to-joint lengths of the second link and first link is selected so that the second link clears the drive shafts of the drive unit.

FIGS. 80A and 80B shows an example internal arrangement used to drive the individual links of each linkage. The arrangement will be described for the upper linkage pair 1554. An equivalent arrangement may be used in the lower linkage pair 1556. For the sake of clarity of the side view, the forearms (and end-effectors) of the upper linkage pair are depicted at different elevations (although they may be located in the same horizontal plane). Similarly, the forearms of the lower linkage pair are depicted at different elevations in the side view. The upper arm 1570 of the left upper linkage 1558 is driven by a first drive shaft 1572, and the upper arm 1574 of the right upper linkage 1562 is driven by a second drive shaft 1576. The forearm 1578 of the left upper linkage 1558 is driven by the second drive shaft 1576 through a band drive 1580 with at least one non-circular pulley. Similarly, the forearm 1582 of the right upper linkage 1562 is driven by the first drive shaft 1572 through a band drive 1584 with at least one non-circular pulley. In alternate aspects, for example where equal link lengths are provided, circular pulleys may be used. The band drives of the two forearms are designed so that the wrist joints of the left and right linkages move along straight line paths parallel to each other when the first and second drive shafts 1572, 1576 rotate equally in opposite directions. The third link/end-effector 1586 of the left upper linkage 1558 is constrained by a band drive 1558 with at least one non-circular pulley, which compensates for the effects of the unequal lengths of the upper arm 1570 and forearm 1578 of the left upper linkage 1558 so that the end-effector 1586 points radially regardless of the position of the first two links 1570, 1578 of the left upper linkage 358. The design of the band drive may be according to FIGS. 1-4. Similarly, the third link/end-effector 1590 of the right upper linkage 1562 may be constrained by a band drive 1592 with at least one non-circular pulley, which compensates for the effects of the unequal lengths of the upper arm and forearm of the right upper linkage so that the end-effector points radially regardless of the position of the first two links of the right upper linkage. In alternate aspects, for example where equal link lengths are provided, circular pulleys may be used. Again, this band drive may be designed according to FIGS. 1-4. In order for the upper linkage pair to rotate, the first and second drive shafts may rotate in sync in the desired direction of rotation of the upper linkage pair. In order for the end-effectors of the upper linkage pair to extend and retract along straight-line paths, the two drive shafts may rotate in sync in opposite directions.

Figure 81A:
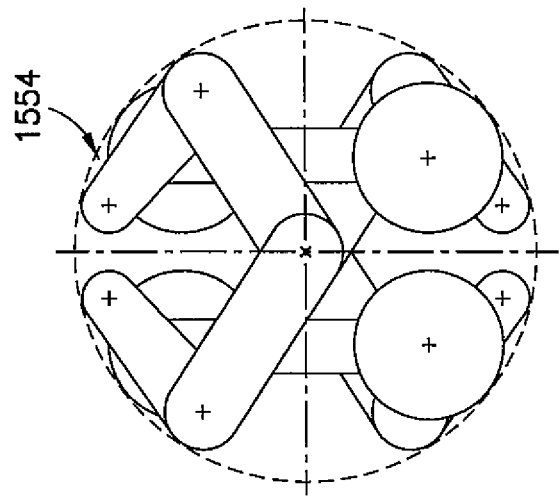
FIGS. 81A-81C are top views of an example substrate transport robot.
Figure 81B:
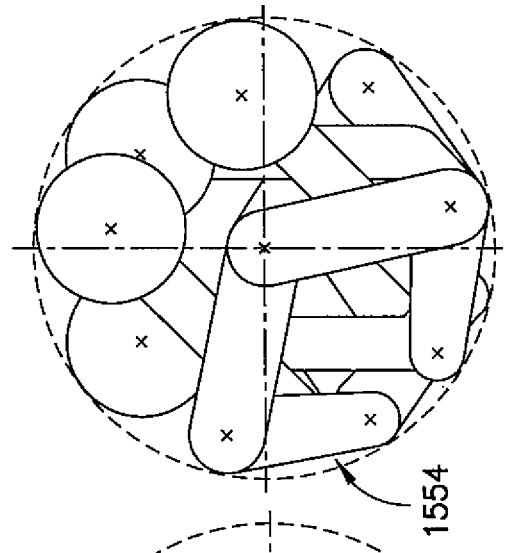
Figure 81C:
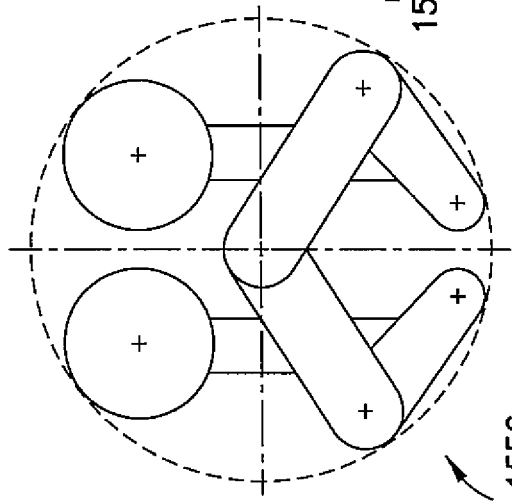
Figures 85A, 85B, 85C:
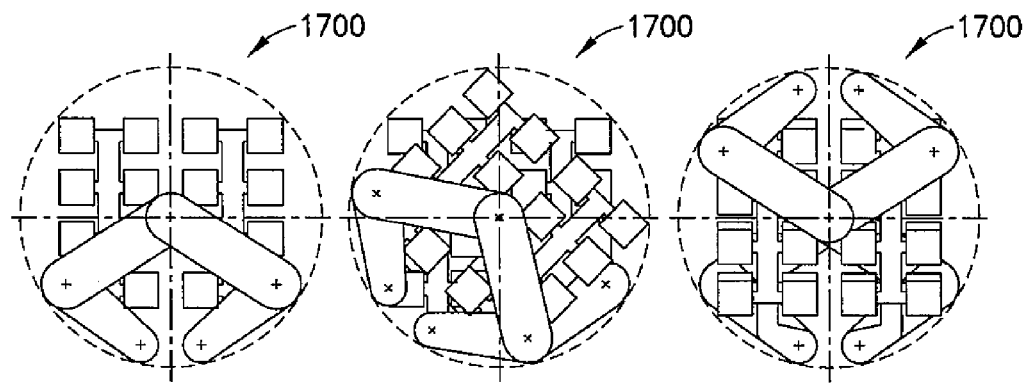
FIGS. 85A-85C are top views of an example substrate transport robot.
Figures 86A, 86B, 86C:
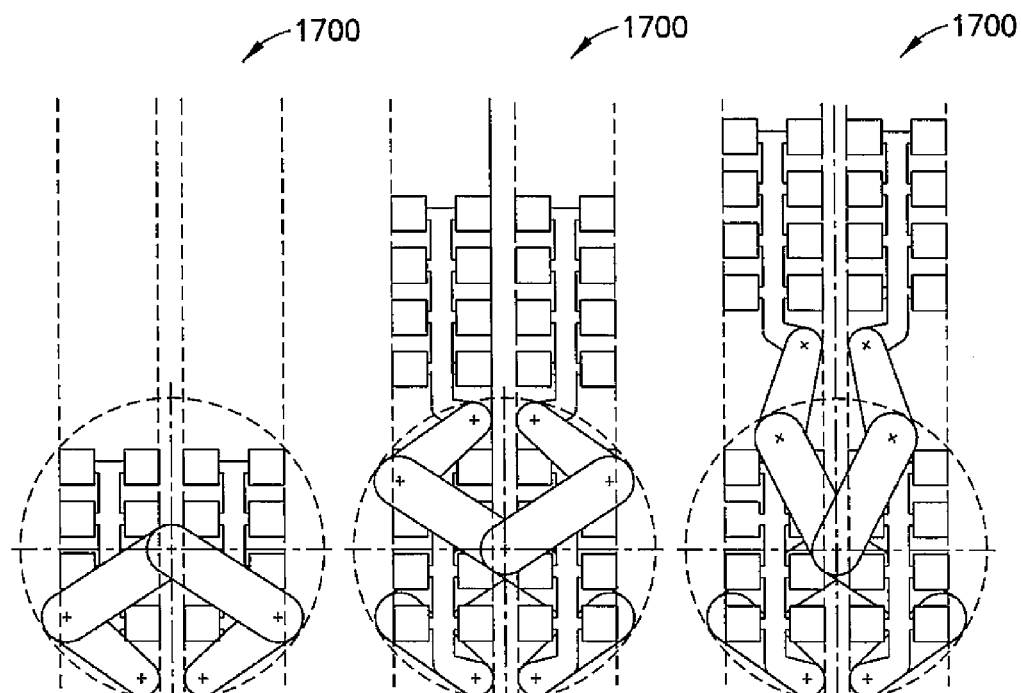
FIGS. 86A-86C are top views of an example substrate transport robot.

FIGS. 81A-C and 82A-C illustrate independent operation of the two linkage pairs of the robot of FIGS. 79A and 79B. In particular, FIGS. 81A-C and FIGS. 82A-C show independent rotary and extension motions of the two linkage pairs. FIGS. 81A-C illustrate rotary motion of the upper linkage pair 1554 of the robot. FIG. 81A shows a top view of the robot with both linkage pairs in their retracted position. FIG. 81B shows a top view of the robot with the upper linkage pair 1554 rotated by 45 deg in the clockwise direction. FIG. 81C shows a top view of the robot with the upper linkage pair rotated by 180 deg. FIGS. 82A-C shows extension motion of the robot. FIG. 82A shows a top view of the robot with both linkage pairs in their retracted position. FIG. 82B shows a top view of the robot with the upper linkage pair partially extended. The extension shown in FIG. 82A corresponds approximately to the maximum extension of a conventional solution with rigidly coupled side-by-side end-effectors. As shown in FIG. 82C, the present embodiment allows the linkages, in this particular example the upper linkage pair, to extend well beyond this point, thus providing a longer reach from the same containment volume.

Alternatively, the linkages can be arranged according to FIGS. 83A and 83B, which shows the top and side views of robot 1650. Here, robot 1650 may have features as described with respect to FIGS. 79A and 79B having an upper arm pair 1554 and a lower arm pair 1556'. However in this embodiment the right upper arm of the lower arm pair 1556' is placed below the left upper arm of the lower arm pair.

In alternate embodiments, any suitable quad linkage arrangement may be provided. By way of example, the first link can be driven by a motor either directly or via any kind of coupling or transmission arrangement. Here, any transmission ratio can be used. Alternately, the band drive that actuates the second link may be substituted by any other arrangement with an equivalent functionality, such as a belt drive, cable drive, gear drive, linkage-based mechanism or any combination of the above. Similarly, the band drive that constrains the third link may be substituted by any other suitable arrangement, such as a belt drive, cable drive, non-circular gears, linkage-based mechanism or any combination of the above. Further, the end-effectors may be positioned with any suitable offset and point in any suitable direction. Alternately, the third link can carry more than one end-effector. Any suitable number of end-effectors and/or material holders can be carried by the third link of any of the linkages. By way of example, an arrangement 1700 suitable for manufacturing of solar cells is depicted in FIGS. 83 through 86 where multiple substrates are supported by each end effector. Here, any order of the vertical arrangement of the individual links and end-effectors may be used. For example, the end-effectors carried by the upper linkage pair may be located above the upper linkage pair as opposed to being sandwiched between the lower and upper linkage pairs.

Figure 89A:
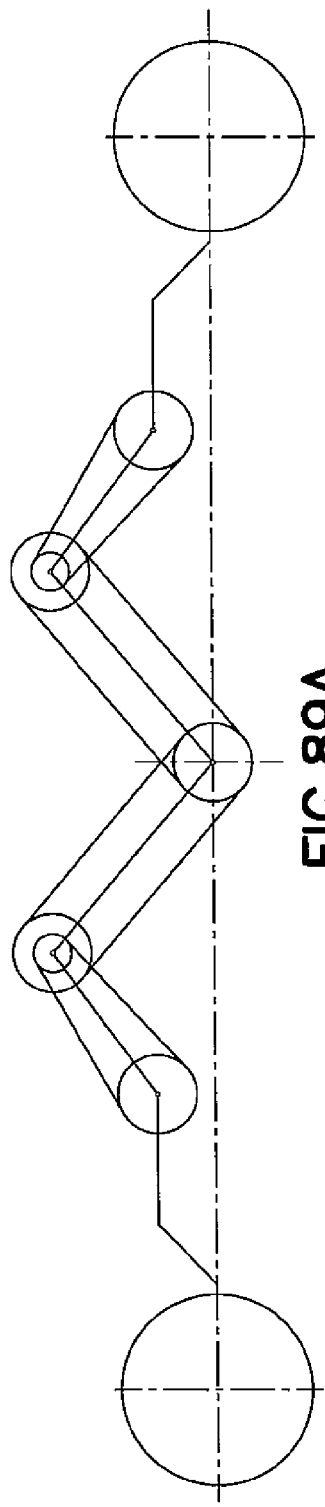
FIG. 89A is a top schematic view of an example substrate transport robot.
Figure 89B:
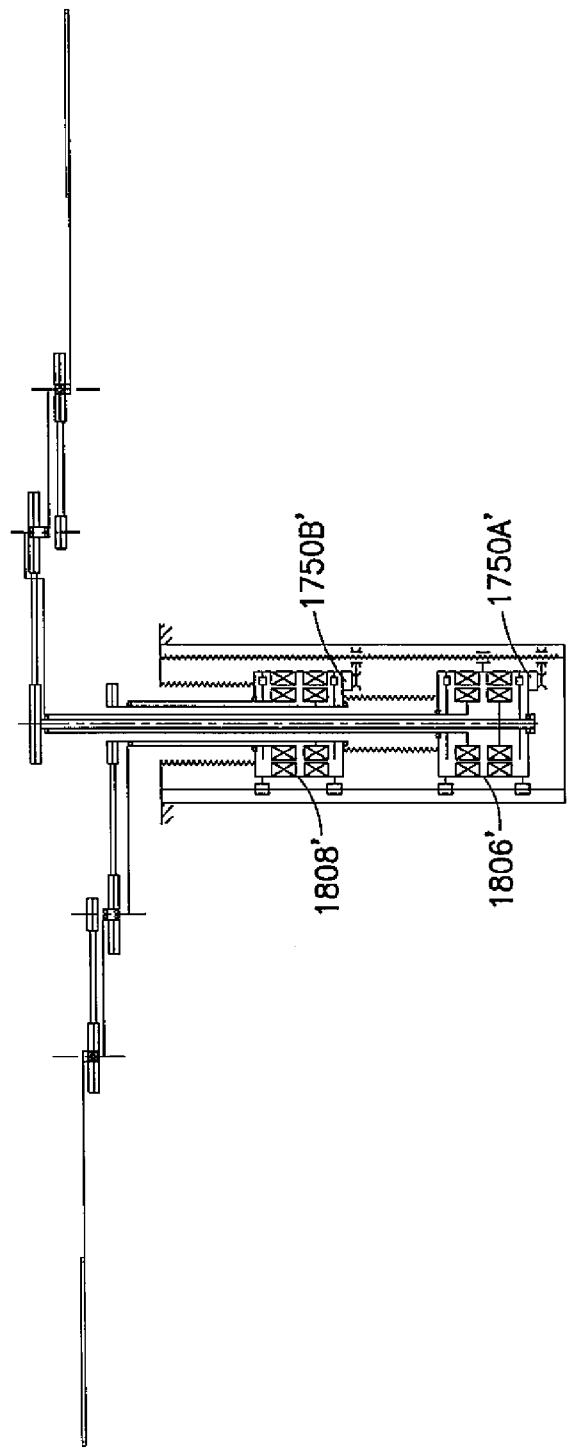
FIG. 89B is a section schematic view of an example substrate transport robot.

The dual and quad arm configurations described above may be driven by a robot drive unit with four coaxial rotary axes, for example, as illustrated above and in the figures. The robot drive unit may further include a common vertical lift axis 1750, as depicted diagrammatically in FIGS. 87A and 87B. Alternatively, the robot drive unit may include two independent vertical lift axes 1750A and 1750B, as shown schematically in FIGS. 88A-B and 89A-B. In this case, each vertical axis is coupled to one of the two linkages of the dual linkage arrangements or on of the two linkage pairs of the quad linkage arrangement. In FIGS. 88A-B, lift axis 1750A, 1750B are independently coupled to rotary drive units 1806, 1808 where lift axis 1750A, 1750B have independently rotatable lead screws. Similarly, in FIGS. 89A-B, lift axis 1750A', 1750B' are independently coupled to rotary drive units 1806', 1808' where lift axis 1750A', 1750B' share a common fixed lead screw.

FIGS. 90A and 90B show an example diagrammatic depiction of a top view and a side view of a vacuum chamber 1900 with independent robot arms 1802, 1904 driven by non-collocated drive units. In the example of FIGS. 90A and 90B, each drive unit may provide three rotary axes and an optional vertical lift axis. Each robot arm may consist of a first link (upper arm), a second link (forearm) and a third link with an end-effector. As depicted in the figure, the joint-to-joint length of the second link may be smaller than the join-to-joint link of the first link. Each of the three links may be driven by one of the rotary axes of the corresponding robot drive unit. Generally, any number of rotary axes and links may be employed. The two robot arms and drive units of FIGS. 90A and 90B may be configured so that the two arms can reach over and/or under each other, and access any station attached to the vacuum chamber to deliver/remove material to/from the station. Alternatively, as shown diagrammatically in FIGS. 91A and 91B, each of the two drive units 1902', 1904' may feature an extension member, which may transmit rotary motion from the rotary axes of the drive unit to a given point in the vacuum chamber. While the extension member may be stationary in the horizontal plane, it may move vertically if the corresponding drive unit is equipped by a vertical lift axis. As illustrated in the example of FIGS. 91A and 91B, a standard robot arm may be driven by each of the extension members. For instance, each drive unit with an extension member may provide two rotary axes and an optional vertical lift axis. Each of the robot arms may then consist of a first link (upper arm), a second link (forearm) and a third link with an end-effector. In the example of FIGS. 91A and 91B, the first two links are driven by the two rotary axes of the corresponding drive unit, and the third link is mechanically constrained so that the end-effector maintains radially orientation. Although three-link arms are shown in FIGS. 91A and 91B, the arms may consist of any suitable number of links. In an alternative embodiment, any suitable combination of the arm arrangements and drive units of FIGS. 90A and 90B and FIGS. 91A and 91B or otherwise may be used. In accordance with one further example, a non-transitory program storage device readable by a machine, tangibly embodying a program of instructions executable by the machine for performing operations may be provided, such as the memory 1951' for example, where the operations comprise any of the operations performed by the controller as described herein. The methods described above may be at least partially performed or controlled with the processor 1951, memory 1951' and software 1951".

It should be seen that the foregoing description is only illustrative. Various alternatives and modifications can be devised by those skilled in the art. Accordingly, the present embodiment is intended to embrace all such alternatives, modifications, and variances. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

The invention claimed is:

1. A transport apparatus comprising:
a drive comprising coaxial drive shafts, where the coaxial drive shafts comprise only three coaxial drive shafts;
a first arm connected to the drive, where the first arm comprises a first link, a second link and a first end effector connected in series with the drive, where the first and second links have different effective lengths; and
a second arm connected to the drive, where the second arm comprises a third link, a fourth link and a second end effector connected in series with the drive,
where a first mechanical connection of the first arm with the drive and a second mechanical connection of the second arm with the drive each comprise a band drive having at least one non-circular pulley, and each of the first and second mechanical connections including their at least one non-circular pulley are configured to limit movement of the links of each respective arms relative to each other such that the mechanical connections allow only straight movement of the end effectors relative to the drive when the first and second arms are extended or retracted.

2. A transport apparatus as in claim 1 where the effective length of the first link is longer than the effective length of the second link.

3. A transport apparatus as in claim 1 where the first end effector comprises a lateral offset between a wrist joint with the second link and a centerline of a substrate support section which is about equal to a difference in the effective lengths of the first and second links.

4. A transport apparatus as in claim 3 where the first mechanical connection is configured to translate the first end effector when the first arm is extended or retracted with the wrist joint being maintained at the lateral offset relative to a center axis of rotation of the drive.

5. A transport apparatus as in claim 1 where the first mechanical connection comprises a first band on a first one of the non-circular pulleys, where the first non-circular pulley is located at a joint of the first and second links.

6. A transport apparatus as in claim 5 where the first mechanical connection comprises a second one of the non-circular pulleys located at a joint of the second link with the first end effector, where a second band extends between the first and second non-circular pulleys.

7. A transport apparatus as in claim 5 where the first mechanical connection comprises a circular pulley located at a joint of the second link with the first end effector, where a second band extends between the first non-circular pulley and the circular pulley.

8. A transport apparatus as in claim 1 where the first mechanical connection comprises a first band on a first one of the non-circular pulleys, where the first non-circular pulley is located at a joint of the second link with the first end effector.

9. A transport apparatus as in claim 1 where the first mechanical connection is configured to provide substantially only non-radial movement of the first end effector relative to the drive when the first arm is extended or retracted.

10. A method comprising:
moving a first arm by a drive, where the drive comprises coaxial drive shafts, and where the coaxial drive shafts comprise only three coaxial drive shafts, where:
a first link of the first arm is rotated by rotating a first one of the coaxial drive shafts;
a second link of the first arm is rotated on the first link when the first link is rotated by the first coaxial drive shaft, where the first and second links have different effective lengths; and
a first end effector on the second link is rotated on the second link when the first link is rotated by the first coaxial drive shaft, and where a first mechanical connection of the first arm with the drive comprises a belt drive including a first non-circular pulley, and the first mechanical connection including the first non-circular pulley limits movement of the first and second links relative to each other such that the first mechanical connection allows only straight movement of the first end effector relative to the drive when the first arm is extended or retracted; and
moving a second arm by the drive, where:
a third link of the second arm is rotated by rotating a second one of the coaxial drive shafts;
a fourth link of the second arm is rotated on the third link when the third link is rotated by the second coaxial drive shaft; and
a second end effector on the fourth link is rotated on the third link when the third link is rotated by the second coaxial drive shaft, where the third and fourth links have different effective lengths, and where a second mechanical connection of the second arm with the drive comprises a second non-circular pulley, and the second mechanical connection limits movement of the third and fourth links relative to each other such that the second mechanical connection allows only straight movement of the second end effector relative to the drive when the second arm is extended or retracted.

11. A method as in claim 10 where the first arm is extended and retracted by rotating the first coaxial drive shaft and keeping the other coaxial drive shafts stationary.

12. A method as in claim 10 where the first non-circular pulley is connected to a joint of the first and second links, and at least one band connects the first non-circular pulley to at least one other pulley at a center axis of the drive and/or at a joint of the second link to the first end effector.

13. A method as in claim 12 where the at least one other pulley comprises at least one other non-circular pulley.

14. A method as in claim 12 where the at least one other pulley comprises at least one circular pulley.

15. A method as in claim 10 where the first end effector comprises a lateral offset between a wrist joint with the second link and a centerline of a substrate support section which is about equal to a difference in the effective lengths of the first and second links.

16. A method as in claim 10 where rotating the first end effector on the second link results in translation motion only of the first end effector when the first arm is extended or retracted, where a wrist joint at the second link being maintained at a lateral offset relative to a center axis of rotation of the drive.

17. A method as in claim 10 where rotating the first end effector provides substantially only non-radial movement of the first end effector relative to the drive when the first arm is extended or retracted.

18. A transport apparatus comprising:
a drive comprising coaxial drive shafts, where the coaxial drive shafts comprise only three coaxial drive shafts;
a first arm connected to the drive, where the first arm comprises a first link, a second link and a first end effector connected in series with the drive, where the first and second links have different effective lengths relative to each other; and
a second arm connected to the drive, where the second arm comprises a third link, a fourth link and a second end effector connected in series with the drive, where the third and fourth links have different effective lengths relative to each other, where a first mechanical connection of the first arm with the drive comprises a band drive including a first non-circular pulley and a first band, and where a second mechanical connection of the second arm with the drive comprises a second non-circular pulley and a second band, where the first mechanical connection including the first non-circular pulley limits movement of the first end effector to only straight extension or retraction relative to the drive.

19. A transport apparatus as in claim 18 where the effective length of the first link is longer than the effective length of the second link, where the first end effector comprises a lateral offset between a wrist joint with the second link and a centerline of a substrate support section which is about equal to a difference in the effective lengths of the first and second links, where the first mechanical connection is configured to translate the first end effector when the first arm is extended or retracted with the wrist joint being maintained at the lateral offset relative to a center axis of rotation of the drive, where the first mechanical connection is configured to provide substantially only non-radial movement of the first end effector relative to the drive when the first arm is extended or retracted.

* * * * *